United States Patent
Kouma et al.

(10) Patent No.: US 7,033,515 B2
(45) Date of Patent: Apr. 25, 2006

(54) METHOD FOR MANUFACTURING MICROSTRUCTURE

(75) Inventors: Norinao Kouma, Kawasaki (JP); Yoshihiro Mizuno, Kawasaki (JP); Osamu Tsuboi, Kawasaki (JP); Hisao Okuda, Kawasaki (JP); Hiromitsu Soneda, Kawasaki (JP); Satoshi Ueda, Kawasaki (JP); Ippei Sawaki, Kawasaki (JP); Yoshitaka Nakamura, Suzaka (JP)

(73) Assignees: Fujitsu Limited, Kawasaki (JP); Fujitsu Media Devices Limited, Nagano (JP)

( * ) Notice: Subject to any disclaimer, the term of this patent is extended or adjusted under 35 U.S.C. 154(b) by 350 days.

(21) Appl. No.: 10/686,764

(22) Filed: Oct. 17, 2003

(65) Prior Publication Data

US 2004/0232107 A1 Nov. 25, 2004

(30) Foreign Application Priority Data

Oct. 24, 2002 (JP) ............................. 2002-310314

(51) Int. Cl.
*H01L 21/00* (2006.01)
(52) U.S. Cl. ............................. 216/2; 216/41; 216/67; 216/74; 216/79; 438/706; 438/712; 438/717; 438/719
(58) Field of Classification Search ................ 216/2, 216/41, 67; 438/706, 712, 717, 719
See application file for complete search history.

(56) References Cited

U.S. PATENT DOCUMENTS

| 6,533,951 | B1 * | 3/2003 | Debar et al. .................. 216/27 |
| 2002/0037601 | A1 * | 3/2002 | Nomoto ........................ 438/48 |
| 2002/0158040 | A1 * | 10/2002 | Lucak et al. .................... 216/2 |
| 2004/0245588 | A1 * | 12/2004 | Nikkel et al. ................ 257/415 |

FOREIGN PATENT DOCUMENTS

| JP | 5-302182 | 11/1993 |
| JP | 10-214978 | 8/1998 |
| JP | 10-256569 | 9/1998 |

* cited by examiner

*Primary Examiner*—Shamim Ahmed
(74) *Attorney, Agent, or Firm*—Armstrong, Kratz, Quintos, Hanson & Brooks, LLP

(57) ABSTRACT

A method is for manufacturing a microstructure having a thin-walled portion with use of a material substrate. The material substrate has a laminated structure which includes a first conductor layer 101, a second conductor layer 102, a third conductor layer 103, a first insulating layer 104 interposed between the first conductor layer and the second conductor layer, and a second insulating layer 105 interposed between the second conductor layer and the third conductor layer. The first insulating layer is patterned to have a first masking part for covering a thin-wall forming region of the second conductor layer. The second insulating layer is patterned to have a second masking part for covering the thin-wall forming region of the second conductor layer. The method includes forming the thin-walled portion in the second conductor portion by etching the material substrate from the first conductor layer down to the second insulating layer via a mask pattern 58 including a non-masking region corresponding to the thin-wall forming region of the second conductor layer.

16 Claims, 32 Drawing Sheets

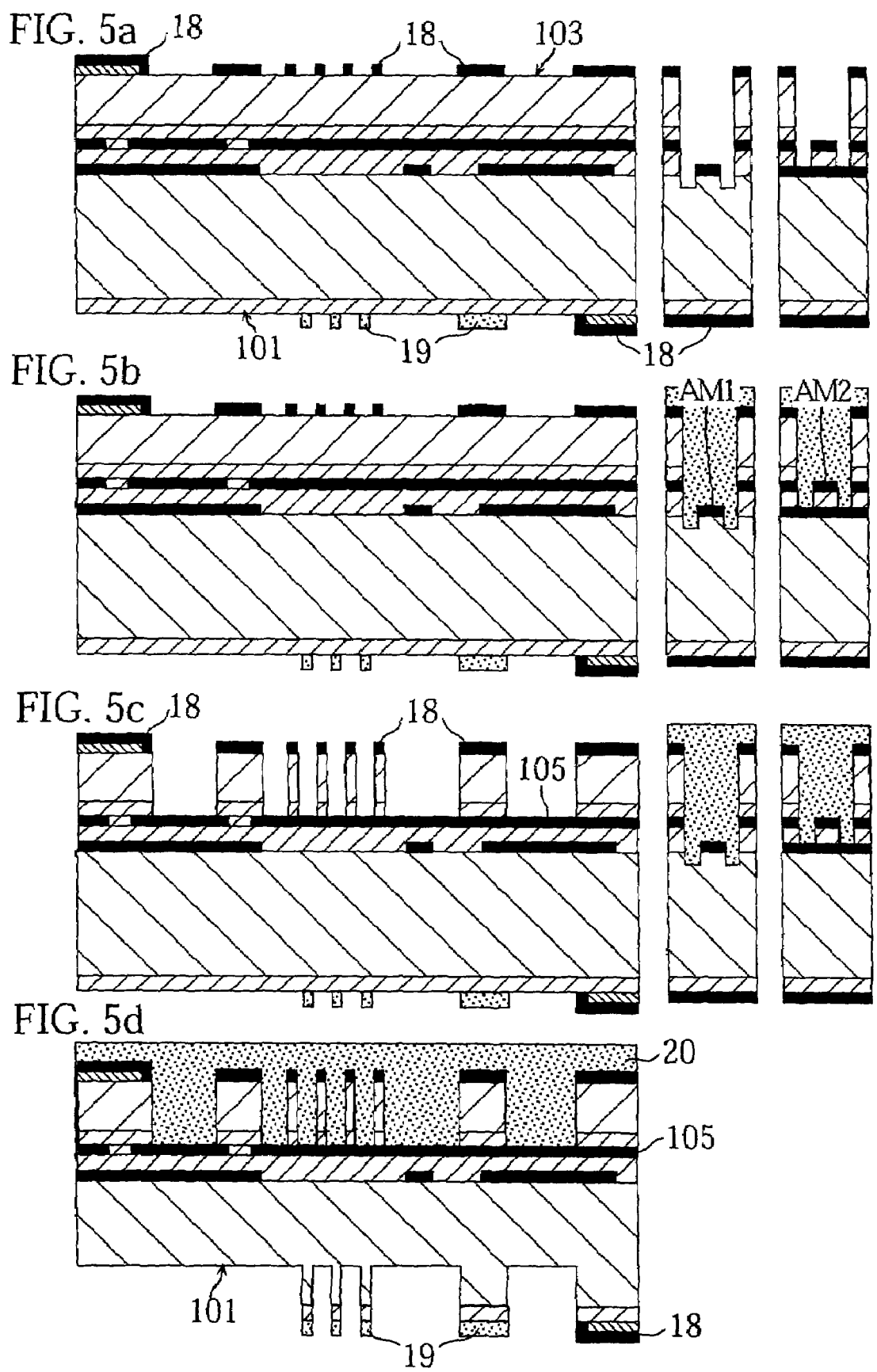

METHOD FOR MANUFACTURING MICROSTRUCTURE

BACKGROUND OF THE INVENTION

1. Field of the Invention

The present invention relates to a method for manufacturing a microstructure, such as a micromirror element, an acceleration sensor element, an angular velocity sensor element, or a vibration element, produced by micromachining technology.

2. Description of the Related Art

Elements having a microscopic structure formed by micromachining technology have been finding application in an increasing number of fields in recent years. For example, there has been interest in microscopic micromirrors having a light reflecting function in the field of optical communications technology.

In optical communications, optical fibers are used as the medium for transmitting optical signals, and what is known as an optical switching device is generally used to switch the transmission path of the optical signals from one fiber to another. Characteristics that are required of optical switching device in order to achieve good optical communications include a large capacity, high speed, and high reliability in the switching operation. Optical switching devices that incorporate micromirror elements produced by micromachining technology are increasingly promising from these standpoints. A micromirror element allows switching between the optical transmission paths on the input and output sides of an optical switching device to be performed completely with optical signals, without first converting an optical signal into an electrical signal, which is preferable in terms of obtaining the above-mentioned characteristics.

A micromirror element is equipped with a mirror surface for reflecting light, and the direction in which the light is reflected can be changed by pivoting this mirror surface. An electrostatic drive type of micromirror element that utilizes static electricity to pivot the mirror surface is employed in many optical devices. These electrostatic micromirror elements can be broadly classified into two types: micromirror elements manufactured by what is known as surface micromachining technology, and micromirror elements manufactured by what is known as bulk micromachining technology.

With surface micromachining, a thin film of material is worked into the desired pattern corresponding to the various structural areas on the substrate, and these patterns are successively laminated to form a support, mirror surface, electrodes, and other such members constituting the element, or sacrificial layers to be removed subsequently. Meanwhile, with bulk micromachining, the material substrate itself is formed into the desired shape for a support, mirror, and so forth, and the mirror surface and electrodes are formed from thin films as necessary. Bulk micromachining is disclosed in JP-A 5-302182, JP-A 10-214978 and JP-A 10-256569, for example.

One of the technological requirements of a micromirror element is that the mirror surface used for light reflection have a high degree of flatness. With surface micromachining, though, because the mirror surface ultimately formed is so thin, the mirror surface is prone to curving, and high flatness cannot be ensured unless the length of the mirror surface on one side is no more than a few dozen microns.

In contrast, with bulk micromachining, a mirror component is produced by etching away the material substrate itself, which is relatively thick, and the mirror surface is provided over this mirror component, so good rigidity can be ensured even with a mirror surface of broader surface area. As a result, it is possible to form a mirror surface having sufficiently high optical flatness. Therefore, bulk micromachining is widely employed in the manufacture of micromirror elements, particularly when the mirror surface needs to be 100 μm or longer on one side.

FIG. 29 is a simplified exploded perspective view of a micromirror element 400, which is an example of a conventional electrostatic drive type of micromirror element produced by bulk micromachining. This micromirror element 400 comprises a mirror substrate 410 and a base substrate 420, which are laminated via a spacer (not shown). The mirror substrate 410 has a mirror component 411, an inner frame 412, and an outer frame 413. The mirror component 411 and the inner frame 412 are linked by a pair of torsion bars 414. The inner frame 412 and the outer frame 413 are linked by a pair of torsion bars 415. The torsion bars 414 define the axis of rotation of the mirror component 411 with respect to the inner frame 412. The torsion bars 415 define the axis of rotation of the inner frame 412, and its attendant mirror component 411, with respect to the outer frame 413.

A pair of plate electrodes 411a and 411b are provided on the back side of the mirror component 411, and a mirror surface (not shown) for reflecting light is provided on the front side. A pair of plate electrodes 412a and 412b are provided on the back side of the inner frame 412.

Plate electrodes 420a and 420b are provided to the base substrate 420 so as to be opposite the plate electrodes 411a and 411b of the mirror component 411, and plate electrodes 420c and 420d are provided so as to be opposite the plate electrodes 412a and 412b of the inner frame 412. With a conventional micromirror element, the drive means most often employed is to generate electrostatic force with plate electrodes such as these.

With a structure such as this, if the plate electrode 420a of the base substrate 420 is negatively charged in a state in which the plate electrode 411a of the mirror component 411 is positively charged, for example, electrostatic force is generated between the plate electrode 411a and the plate electrode 420a, and the mirror component 411 pivots in the direction of arrow M1 while twisting the pair of torsion bars 414.

Meanwhile, if the plate electrode 420c of the base substrate 420 is negatively charged in a state in which the plate electrode 412a of the inner frame 412 is positively charged, for example, electrostatic force is generated between the plate electrode 412a and the plate electrode 420c, and the inner frame 412 pivots along with the mirror component 411 in the direction of mirror M2 while twisting the pair of torsion bars 415. FIG. 30 shows what happens when this rotational drive causes the inner frame 412 and its attendant mirror component 411 to be displaced by an inclination angle θ with respect to the outer frame 413.

The orientation of the plate electrodes 411a and 411b with respect to the plate electrodes 420a and 420b is different in the state shown in FIG. 29 from that in FIG. 30. Accordingly, in the various states shown in FIGS. 29 and 30, even though the same voltage is applied between the plate electrode 411a and the plate electrode 420a, the size of the generated electrostatic force will be different, and as a result the inclination angle of the mirror component 411 with respect to the inner frame 412 will also be different. Therefore, for the inclination angle of the mirror component 411 with respect to the inner frame 412 to be the same in the various states shown in FIGS. 29 and 30, an electrostatic force of suitable size and varying according to the state must be generated between the plate electrode 411a and the plate electrode 420a, for example. To accomplish this, the voltage applied to the plate electrode 411a and the plate electrode 420a must be controlled as dictated by the inclination angle of the inner frame 412 with respect to the outer frame 413.

To control the applied voltage in this way, it is necessary to employ some means such as storing data about the inclination angle corresponding to the voltage applied to the inner frame 412 of the mirror component 411, and data about the inclination angle corresponding to the voltage applied to the outer frame 413, and selecting the applied voltage through reference to these data. This results in a tremendous amount of data. Accordingly, with a micromirror element 400 that employs a drive system that involves applied voltage control such as this, it is difficult to increase the switching speed, and too much burden is imposed on the drive circuit.

With the plate electrode structure employed in the micromirror element 400, the plate electrodes 420a, 420b, 420c, and 420d provided to the base substrate 420 provide drive so that the mirror component 411 equipped with the plate electrodes 411a and 411b and the inner frame 412 equipped with the plate electrodes 412a and 412b are pulled in, so there is a pull-in voltage in this drive. Specifically, this is a phenomenon whereby the mirror component 411 or the inner frame 412 is suddenly pulled in at a certain voltage, which can result in a problem in that the inclination angle of the mirror component 411 cannot be properly controlled. This problem is particularly pronounced when a large inclination angle (about 5° or more) is attempted, that is, when the extent of twisting of the torsion bars is great.

One way that has been proposed for solving this problem is to drive the micromirror element with a comb electrode structure rather than a plate electrode structure. FIG. 31 is simplified exploded perspective view of a conventional micromirror element 500 that makes use of a comb electrode structure.

The micromirror element 500 has a mirror component 510 with a mirror surface (not shown) provided on its upper or lower surface, an inner frame 520, and an outer frame (only partially shown), and comb electrodes are integrally formed are each of these. More specifically, a pair of comb electrodes 510a and 510b are formed on the mirror component 510, extending outward from the pair of parallel sides thereof. A pair of comb electrodes 520a and 520b are formed on the inner frame 520, extending inward and corresponding to the comb electrodes 510a and 510b, and a pair of comb electrodes 520c and 520d are formed extending outward. A pair of comb electrodes 530a and 530b are formed on the outer frame 530, extending inward and corresponding to the comb electrodes 520c and 520d. The mirror component 510 and the inner frame 520 are linked by a pair of torsion bars 540, and the inner frame 520 and the outer frame 530 are linked by a pair of torsion bars 550. The pair of torsion bars 540 define the axis of rotation of the mirror component 510 with respect to the inner frame 520, while the torsion bars 550 define the axis of rotation of the inner frame 520, and its attendant mirror component 510, with respect to the outer frame 530.

With a micromirror element 500 structured in this way, a set of comb electrodes provided close together in order to generate electrostatic force, such as the comb electrode 510a and the comb electrode 520a, are divided into upper and lower levels, as shown in FIG. 32a, when no voltage is being applied. When voltage is applied, as shown in FIG. 32b, the comb electrode 510a is pulled into the comb electrode 520a, which drives the mirror component 510. More specifically, in FIG. 30, if the comb electrode 510a is positively charged and the comb electrode 520a is negatively charged, for example, the mirror component 510 pivots in the direction of M3 while twisting the pair of torsion bars 540. Meanwhile, if the comb electrode 520c is positively charged and the comb electrode 530a is negatively charged, the inner frame 520 pivots in the direction of M4 while twisting the pair of torsion bars 550.

These two rotary operations are independent of one another. Specifically, prior to the application of potential to the comb electrodes 510a and 510b and the comb electrodes 520a and 520b, the comb electrodes 510a and 510b are always in the same state of orientation with respect to the comb electrodes 520a and 520b, regardless of the inclination angle of the inner frame 520 with respect to the outer frame 530. Thus, the inclination angle of the inner frame 520 and its attendant mirror component 510 with respect to the outer frame 530 has no effect in the micromirror element 500, which simplifies control of the inclination angle of the mirror component 510.

Also, when a comb electrode structure is employed, the direction in which the electrostatic force acts is set to be substantially perpendicular to the direction in which the mirror component 510 pivots. Therefore, in the drive of the mirror component 510, contact with the comb electrodes due to pull-in is less apt to occur, and as a result it is possible for the mirror component 510 to have a suitably large inclination angle.

With the micromirror element 500, the combs (electrodes) are displaced as the mirror component 510 and the inner frame 520 rotate, so the comb electrodes must be formed in a suitable thickness appropriate for this inclination angle of the mirror component 510 and the inner frame 520. For instance, if the length D of the body portion 511 of the mirror component 510 is 1 mm, and if the mirror component 510 is inclined by 5° around the axis defined by the pair of torsion bars 540 with respect to the inner frame 520, then one body end 511' will sink 44 μm. Accordingly, the thickness T of the comb electrodes 510a and 510b formed on the mirror component 510 must be at least 44 μm.

On the other hand, from the standpoint of obtaining a larger inclination angle at a lower applied voltage, it is preferable for the torsion bars 540 and 550 that afford twisting resistance to be formed thinner. With the conventional micromirror element 500, however, the torsion bars 540 and 550 are formed in the same thickness as the material substrate constituting the mirror component 510, the inner frame 520, and the outer frame 530, and as such these torsion bars are quite thick. For example, if the thickness T of the comb electrodes 510a and 510b is designed to be at least 44 μm as mentioned above, the thickness of the torsion bars 540 and 550 ends up being at least 44 μm along with the mirror component 510. When such thick torsion bars 540 and 550 are used, a larger electrostatic force has to be generated between the comb electrodes in order to twist these bars, which means that the drive voltage also has to be higher. Also, in prior art the twisting resistance of the torsion bars 540 and 550 is adjusted by varying the width of the torsion bars 540 and 550, but merely changing the design in the width direction is often inadequate for setting the proper twisting resistance.

Thus, with a microstructure produced by bulk machining technology, there are cases when different thicknesses or heights are required in various structures formed by etching a material substrate. However, forming a thin structure integrally connected to a thick structure with high precision in the thickness was difficult in conventional bulk machining technology.

SUMMARY OF THE INVENTION

It is therefore an object thereof to provide a method for manufacturing a microstructure having a thin-walled portion, with high precision with respect to its thickness.

The first aspect of the present invention provides a method for manufacturing a microstructure having a thin-walled portion with use of a material substrate. The material substrate has a laminated structure which comprises: a first conductor layer; a second conductor layer; a third conductor layer; a first insulating layer which is patterned to have a first masking part for covering a thin-wall forming region of the second conductor layer, the first insulating layer being interposed between the first conductor layer and the second conductor layer; and a second insulating layer which is patterned to have a second masking part for covering the thin-wall forming region of the second conductor layer, the second insulating layer being interposed between the second conductor layer and the third conductor layer. The method comprises forming the thin-walled portion in the second conductor portion by etching the material substrate from the first conductor layer down to the second insulating layer via a mask pattern including a non-masking region corresponding to the thin-wall forming region of the second conductor layer.

Preferably, the material substrate further has a first communicating conductor that passes through the first insulating layer and electrically connects the first conductor layer and the thin-walled portion, and/or a second communicating conductor that passes through the second insulating layer and electrically connects the third conductor layer and the thin-walled portion.

The second aspect of the present invention provides another method for manufacturing a microstructure having a thin-walled portion. The method comprises: a material substrate lamination step for preparing a material substrate having a laminated structure which comprises: a first conductor layer; a second conductor layer; a third conductor layer; a first insulating layer which is patterned to have a first masking part for covering a thin-wall forming region of the second conductor layer, the first insulating layer being interposed between the first conductor layer and the second conductor layer; and a second insulating layer which is patterned to have a second masking part for covering the thin-wall forming region of the second conductor layer, the second insulating layer being interposed between the second conductor layer and the third conductor layer. The method also comprises a wall-thinning step for forming the thin-walled portion in the second conductor portion by etching the material substrate from the first conductor layer down to the second insulating layer via a mask pattern including a non-masking region corresponding to the thin-wall forming region of the second conductor layer.

In a first preferred embodiment of the second aspect, the material substrate lamination step comprises: a first insulating layer formation sub-step for forming, on the first conductor layer, the first insulating layer which is patterned to have the first masking part; a first lamination sub-step for laminating the second conductor layer by depositing a conductor material onto the first conductor layer from the side of the first insulating layer; a second insulating layer formation sub-step for forming, on the second conductor layer, the second insulating layer which is patterned to have the second masking part; and a second lamination sub-step for laminating the third conductor layer by depositing a conductor material onto the second conductor layer from the side of the second insulating layer.

In a second preferred embodiment of the second aspect, the material substrate lamination step comprises: a first insulating layer formation sub-step for forming, on the first conductor layer, the first insulating layer which is patterned to have the first masking part; a first lamination sub-step for laminating the second conductor layer by depositing a conductor material onto the first conductor layer from the side of the first insulating layer; a sub-step for forming a first pre-insulating layer on the second conductor layer; and a second lamination sub-step for joining the first pre-insulating layer on the second conductor layer to a second pre-insulating layer formed on a third conductor layer, the pre-insulating layer and the second pre-insulating layer together providing the second insulating layer which bonds the third conductor layer to the second conductor layer.

In a third preferred embodiment of the second aspect, the material substrate lamination step comprises: a first insulating layer formation sub-step for forming, on the first conductor layer, the first insulating layer which is patterned to have a non-masking part corresponding to a comb forming region of the first conductor layer while also having the first masking part; a first lamination sub-step for laminating the second conductor layer by depositing a conductor material onto the first conductor layer from the side of the first insulating layer; a sub-step of etching the material substrate from the side of the second conductor layer, via a mask pattern for masking the comb forming region of the first conductor layer, to a halfway depth of the first conductor layer; a sub-step of forming a first pre-insulating layer on the second conductor layer; and a second lamination sub-step for joining the first pre-insulating layer on the second conductor layer to a second pre-insulating layer formed on the third conductor layer, the pre-insulating layer and the second pre-insulating layer together providing the second insulating layer which bonds the third conductor layer to the second conductor layer.

In a fourth preferred embodiment of the second aspect, the material substrate lamination step comprises: an intermediate material forming sub-step for preparing a material substrate intermediate comprising the second conductor layer, the third conductor layer, and the second insulating layer in between the second conductor layer and the third conductor layer; a first insulating layer formation sub-step for forming, on the second conductor layer of the material substrate intermediate, the first insulating layer which is patterned to have the first masking part; and a first lamination sub-step for forming the first conductor layer by depositing a conductor material on the second conductor layer from the side of the first insulating layer.

In a fifth preferred embodiment of the second aspect, the material substrate lamination step comprises: an intermediate material forming sub-step for preparing a material substrate intermediate comprising the second conductor layer, a base layer, and the second insulating layer patterned to have the second masking part and arranged between the second conductor layer and the base layer; a first insulating layer formation sub-step for forming, on the second conductor layer of the material substrate intermediate, the first insulating layer which is patterned to have the first masking part; a first lamination sub-step for laminating the first conductor layer by depositing a conductor material onto the second conductor layer from the side of the first insulating layer; an insulating layer exposure sub-step for exposing the second insulating layer by removing the base layer; and a second lamination sub-step for laminating the third conductor layer by depositing a conductor material on the second conductor layer from the side of the second insulating layer.

In a sixth preferred embodiment of the second aspect, the material substrate lamination step comprises: a first insulating layer formation sub-step for forming, on a base conductor layer, the first insulating layer which is patterned to have the first masking part; a sub-step of etching the base conductor layer to a depth corresponding to a thickness of the thin-walled portion, using the first conductor layer as a mask; a first lamination sub-step for forming the first conductor layer by depositing a conductor material on the base conductor layer from the side of the first insulating layer; a sub-step for forming the second conductor layer by removing part of the base conductor layer, from the side opposite the first conductor layer, to such a depth that a remaining thickness of the base conductor layer corresponds to the thickness of the thin-walled portion; a second insulating layer formation sub-step for forming the second insulating layer on the second conductor layer; and a second lamination sub-step for laminating the third conductor layer by depositing a conductor material on the second conductor layer from the side of the second insulating layer.

In the first to sixth preferred embodiments of the second aspect, it is preferable if the first insulating layer formed in the first insulating layer formation sub-step is patterned to further include a non-masking part for providing a communicating conductor, the communicating conductor being formed in the first lamination step by deposition of the conductor material in the non-masking part of the first insulating layer for electrically connecting the first conductor layer and the thin-walled portion.

In the first or sixth preferred embodiment, it is preferable if the second insulating layer formed in the second insulating layer formation sub-step is patterned to further include a non-masking part for providing a communicating conductor, the communicating conductor being formed in the second lamination step by deposition of the conductor material in the non-masking part for electrically connecting the third conductor layer and the thin-walled portion.

In the first preferred embodiment, it is preferable if the second lamination sub-step comprises forming a film of the conductor material on the second conductor layer from the side of the second insulating layer, and then subjecting the conductor material to epitaxial growth.

In the second or third preferred embodiment, it is preferable if the method further comprises the steps of forming a through-hole that passes through the third conductor layer and the second insulating layer to reach the second conductor layer, and forming a communicating conductor for electrically connecting the third conductor layer and the thin-walled portion by supplying a conductor material into the through-hole.

In the fourth preferred embodiment, it is preferable if the first insulating layer formed in the first insulating layer formation step is patterned to further include a first non-masking part for providing a first communicating conductor, the method further comprising, as steps performed after the first insulating layer formation sub-step but prior to the first lamination sub-step, etching the second conductor layer down to the second insulating layer with use of the first insulating layer as a mask, and forming a second non-masking part for a second communicating conductor in the second insulating layer, and wherein the second communicating conductor is formed by deposition of the conductor material in the second non-masking part in the first lamination step for electrically connecting the third conductor layer and the thin-walled portion.

In the fifth preferred embodiment, it is preferable if the method further comprises forming a non-masking part in the second insulating layer after the insulating layer exposure step for providing a communicating conductor, where in the communicating conductor is formed by deposition of the conductor material in the non-masking part in the second lamination step for electrically connecting the third conductor layer and the thin-walled portion.

The third aspect of the present invention provides a further method for manufacturing a microstructure having a thin-walled portion with use of a material substrate. The material substrate has a laminated structure which comprises a first conductor layer, a second conductor layer, and a first insulating layer interposed between the first conductor layer and the second conductor layer. The method comprises the steps of forming the thin-walled portion touching the first insulating layer by performing a first etching treatment with respect to the second conductor layer of the material substrate with use of a first mask pattern having a masking part covering a thin-wall forming region of the second conductor layer, coating the thin-walled portion with an etching stop film, laminating a third conductor layer on the second conductor layer to bury the thin-walled portion, and performing a second etching treatment from the side of the third conductor layer down to the first insulating layer with use of a second mask pattern having a non-masking region corresponding to the thin-wall forming region.

Other features and advantages of the present invention will become apparent from the following detailed description of the preferred embodiments given with reference to the accompanying drawings.

BRIEF DESCRIPTION OF THE DRAWINGS

FIGS. 5a–5d show the steps following the steps shown in FIGS. 4a–4d;

DETAILED DESCRIPTION OF THE PREFERRED EMBODIMENTS

Figure 1:
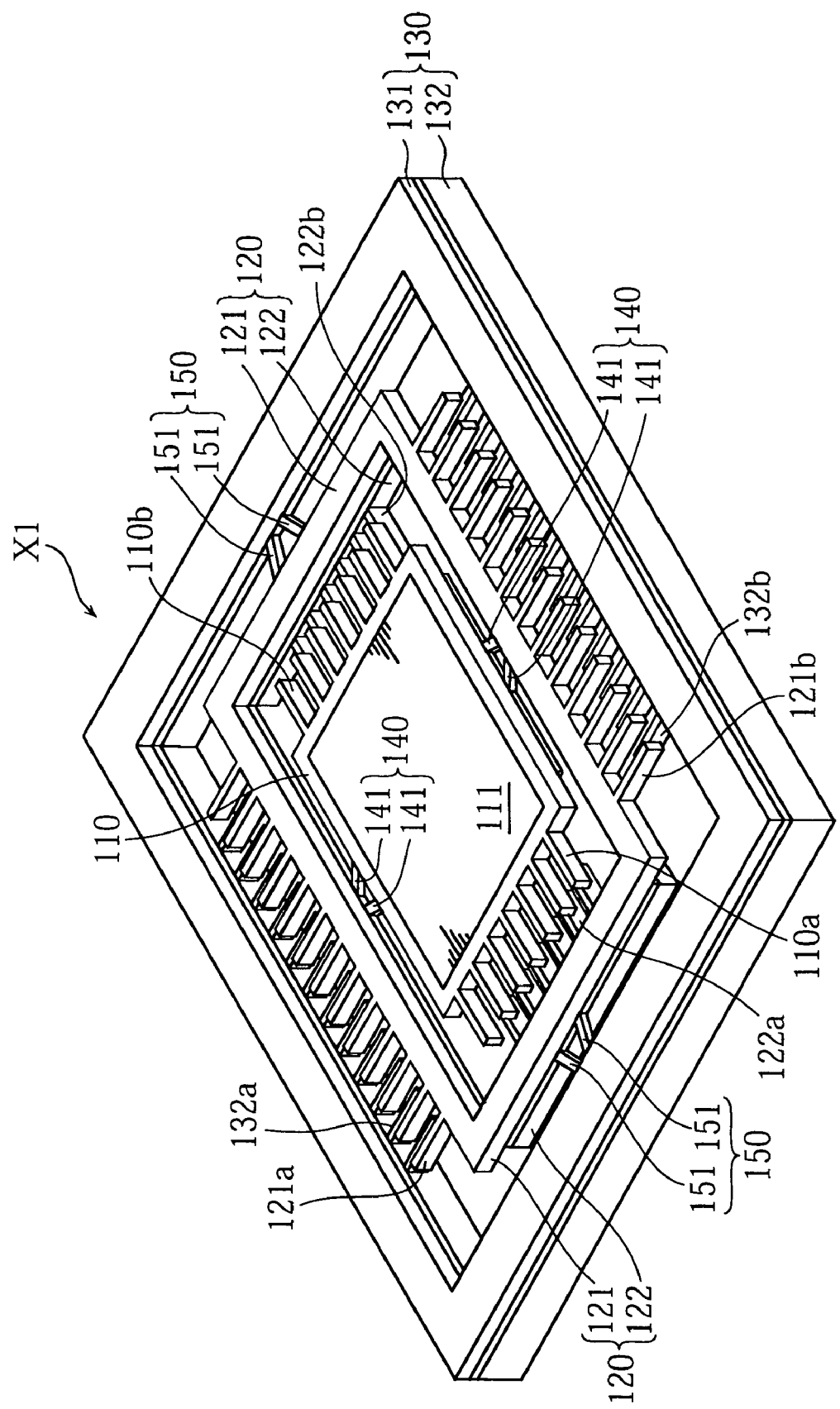
FIG. 1 is a perspective view of a micromirror element serving as an example of a microstructure that can be manufactured with the present invention.
Figure 2:
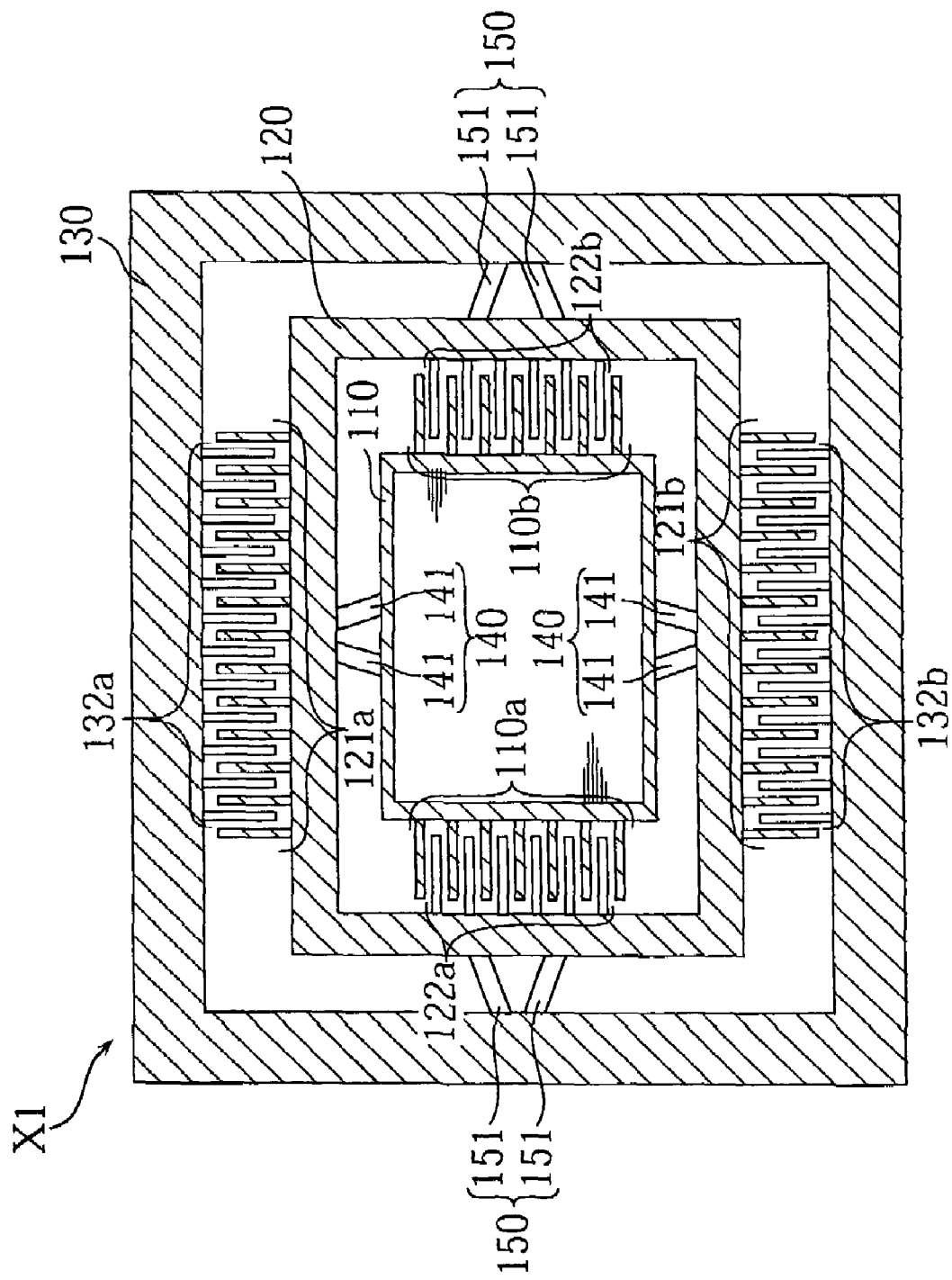
FIG. 2 is a plan view of the micromirror element shown in FIG. 1.

FIGS. 1 and 2 show a micromirror element X1, which is an example of a microstructure that can be manufactured with the present invention.

The micromirror element X1 is formed in a material substrate having a multilayer structure composed of silicon or polysilicon rendered conductive by doping with an impurity, and an insulating layer, and comprises a mirror component 110, an inner frame 120 surrounding this mirror component 110, an outer frame 130 surrounding this inner frame 120, a pair of linking components 140 that link the mirror component 110 and the inner frame 120, and a pair of linking components 150 that link the inner frame 120 and the outer frame 130. The distance between the mirror component 110 and the inner frame 120, and the distance between the mirror component 110 and the outer frame 130 is 10 to 200 μm, for example. The pair of linking components 140 defines the axis of rotation of the mirror component 110 with respect to the inner frame 120. The pair of linking components 150 defines the axis of rotation of the inner frame 120 and its attendant mirror component 110 with respect to the outer frame 130. The linking components 140 and 150 are provided so as to be perpendicular to these two axes. In FIG. 2, the hatching indicates components protruding beyond the linking components 140 and 150 toward the viewer.

A pair of comb electrodes 110a and 11b are integrally formed on the mirror component 110, extending outward from the pair of parallel sides thereof. A mirror surface 111 is provided on the upper surface of the mirror component 110.

The inner frame 120 has an upper layer component 121 and a pair of lower layer components 122. The upper layer component 121 and the lower layer components 122 are electrically separated. Comb electrodes 121a and 121b extending outward are integrally formed on the upper layer component 121. Comb electrodes 122a and 122b extending inward are integrally formed on the pair of lower layer components 122. The comb electrode 122a is located under the comb electrode 110a extending from the mirror component 110, but the arrangement is such that the teeth of the comb electrode 110a and the teeth of the comb electrode 122a do not hit each other during the rotation of the mirror component 110 with respect to the inner frame 120. Similarly, the comb electrode 122b is located under the comb electrode 110b extending from the mirror component 110, but the arrangement is such that the teeth of the comb electrode 110b and the teeth of the comb electrode 122b do not hit each other during the rotation of the mirror component 110.

The outer frame 130 has an upper layer component 131 and a lower layer component 132. The upper layer component 131 and the lower layer component 132 are electrically separated. Comb electrodes 132a and 132b extending inward are integrally formed on the lower layer component 132. The comb electrode 132a is located under the comb electrode 121a extending from the upper layer component 121 of the inner frame 120, but the arrangement is such that the teeth of the comb electrode 121a and the teeth of the comb electrode 132a do not hit each other during the rotation of the inner frame 120 with respect to the outer frame 130. Similarly, the comb electrode 132b is located under the comb electrode 121b extending from the upper layer component 121 of the inner frame 120, but the arrangement is such that the teeth of the comb electrode 121b and the teeth of the comb electrode 132b do not hit each other during the rotation of the inner frame 120.

The linking components 140 are each composed of two mutually isolated torsion bars 141. Each torsion bar 141 connects the mirror component 110 and the inner frame 120, and is thinner than these components. The spacing between the two torsion bars 141 steadily widens from the inner frame 120 side toward the mirror component 110 side.

The linking components 150 are each composed of two mutually isolated torsion bars 151. Each torsion bar 151 connects the inner frame 120 and the outer frame 130, and is thinner than these components. The spacing between the two torsion bars 151 steadily widens from the outer frame 130 side toward the 120 side.

Thus, the micromirror element X1 has linking components 140 or torsion bars 141 that are thinner than the mirror component 110 and the inner frame 120 and can serve as a conduction path between the mirror component 110 and the inner frame 120, and also has linking components 150 or torsion bars 151 that are thinner than the inner frame 120 and the outer frame 130 and can serve as a conduction path between the inner frame 120 and the outer frame 130. The number of torsion bars included in each of the linking components 140 and 150 may be varied as necessary.

FIGS. 3a to 6c show the series of steps involved in the method for manufacturing a microstructure according to the first embodiment of the present invention. This method is one way to manufacture the above-mentioned micromirror element X1 by micromachining.

Figure 6A:
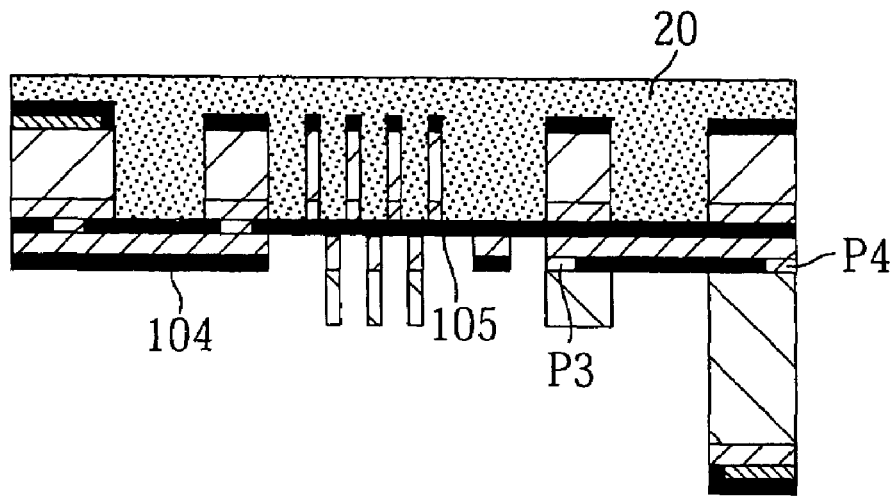
FIGS. 6a–6c show the steps following the steps shown in FIGS. 5a–5d.
Figure 6B:
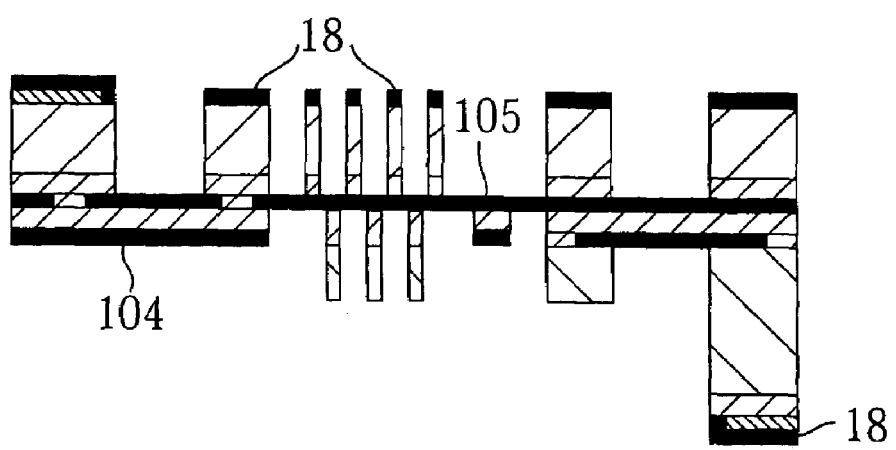
Figure 6C:
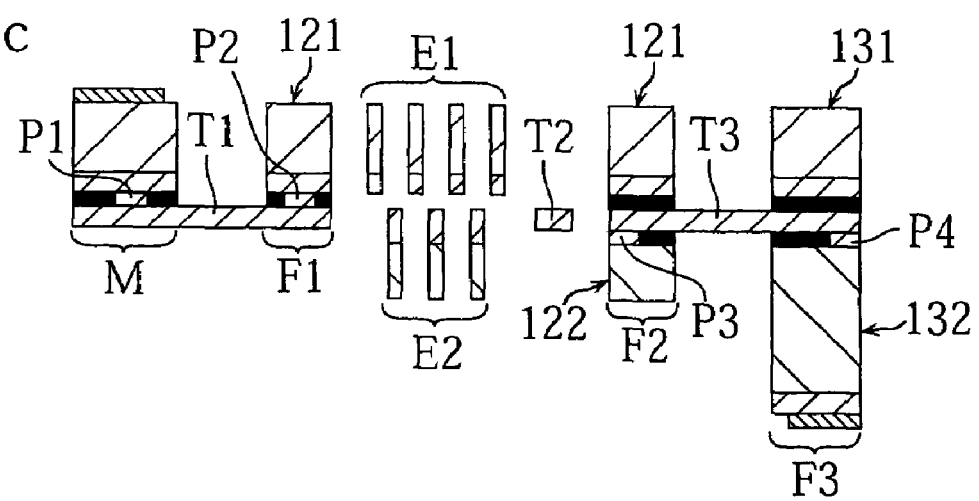

In FIGS. 3a to 6c, the steps of forming the mirror component M, the torsion bar T1, the inner frame F1, the set of comb electrodes E1 and E2, the torsion bar T2, the inner frame F2, the torsion bar T3, and the outer frame F3 shown in FIG. 6c are depicted by a single cross section. These cross sections are continuous cross sections produced by modeling cross sections of a plurality of specific sites included in a single micromirror element formation region in a material substrate (wafer having a multilayer structure) to undergo micromachining.

In FIG. 6c, the mirror component M corresponds to a part of the mirror component 110. The torsion bar T1 corresponds to a torsion bar 141, and is shown by a cross section along its direction of extension. The inner frame F1 corresponds to the part in the inner frame 120 that includes the upper layer component 121. The comb electrode E1 corresponds to part of the comb electrodes 110a, 10b, 121a, and 121b. The comb electrode E2 corresponds to part of the comb electrodes 122a, 122b, 132a, and 132b. The torsion bar T2 corresponds to the torsion bars 141 and 151, and is shown by a cross section perpendicular to its direction of extension. The inner frame F2 corresponds to the part of the inner frame 120 that includes the upper layer component 121 and the lower layer components 122. The torsion bar T3 corresponds to a torsion bar 151, and is shown by a cross section along its direction of extension. The outer frame F3 corresponds to part of the outer frame 130.

The torsion bar T3 shown in FIG. 6c electrically connects the lower layer components 122 of the inner frame 120 with the lower layer component 132 of the outer frame 130, but as will be discussed below, the torsion bar T3 can also be formed so as to electrically connect the upper layer component 121 with the upper layer component 131, the upper layer component 121 with the lower layer components 122, or the lower layer components 122 with the upper layer component 131.

FIGS. 3a to 5c show the above-mentioned modeled cross sections along with two types of cross section of the alignment mark formation site near the end of a wafer. These two types of cross section correspond to two different methods for forming alignment marks. The cross sections to the immediate right of the modeled cross sections illustrate the process of forming alignment marks by a first alignment mark formation method. The cross sections to the far right in the drawings illustrate the process of forming alignment marks by a second alignment mark formation method. In this embodiment, either of these alignment mark formation methods may be employed. The alignment marks are formed at two suitable locations on the wafer.

Figure 3A:
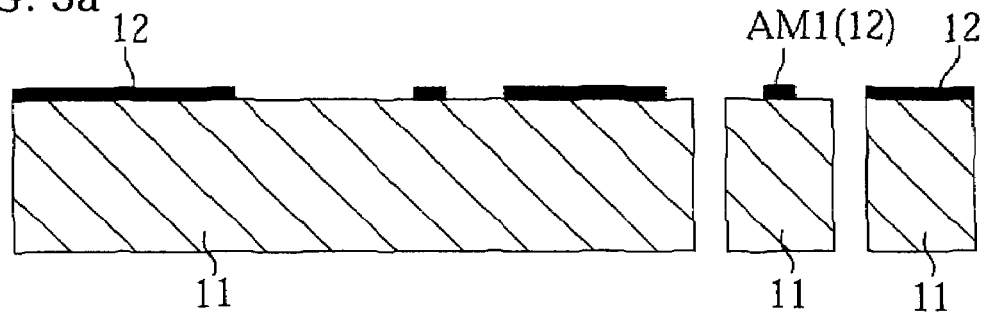
FIGS. 3a–3d show some of the steps involved in a micromirror element manufacturing method according to a first embodiment of the present invention.

In the microstructure manufacturing method according to the first embodiment, first, an oxide film pattern 12 is formed on a silicon substrate 11 as shown in FIG. 3a. In this embodiment, the silicon substrate 11 is a wafer composed of silicon that has been rendered conductive by being doped with phosphorus or antimony, and has a thickness of 300 µm, for example. In the formation of the oxide film pattern 12, specifically, the first step is to grow an oxide film composed of silicon oxide in a thickness of 0.25 µm, for example, on the surface of the silicon substrate 11 by thermal oxidation (heating temperature of 900° C.). The oxide film on the top of the silicon substrate 11 is patterned by etching, using a specific resist pattern as a mask. The etchant used in this patterning can be buffered hydrofluoric acid (BHF) composed of ammonium fluoride and hydrofluoric acid, for example. The various oxide film patterns discussed below, consisting of a thermal oxide film or CVD oxide film, are formed by this same procedure involving resist pattern formation followed by etching. The oxide film grown on the bottom of the silicon substrate 11 is removed with BHF.

The oxide film pattern 12 serves to mask the places to be worked into the mirror component M, the torsion bar T1, the inner frame F1, the torsion bar T2, and the torsion bar T3 in the step illustrated in FIG. 6a. When the first alignment mark formation method is employed, an alignment mark AM1 is formed in this step.

Figure 3B:
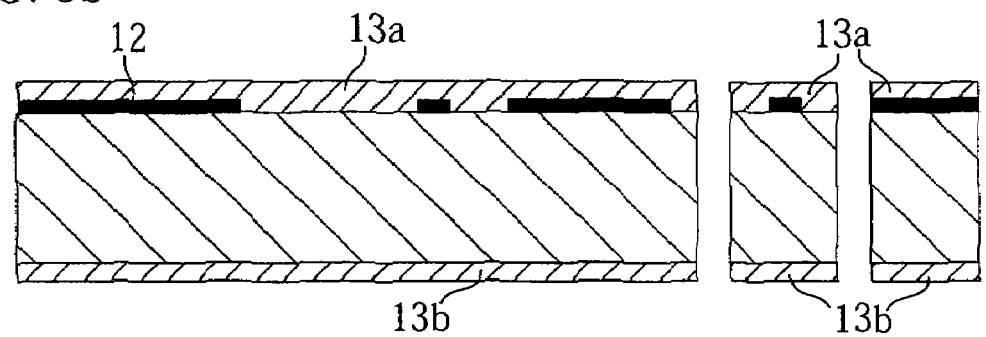

Next, as shown in FIG. 3b, polysilicon layers 13a and 13b are formed by using CVD, for example, to produce a film of polysilicon on the silicon substrate 11 from above the oxide film pattern 12. The polysilicon layers 13a and 13b are rendered conductive by doping the polysilicon with phosphorus during CVD, and have a thickness of 3 µm, for example, from the surface of the oxide film pattern 12. In a material substrate that has undergone this procedure, the polysilicon layer 13a is electrically connected with the silicon substrate 11 and the polysilicon layer 13b. The thickness of the oxide film pattern 12 results in a step approximately 0.25 µm high on the surface of the polysilicon layer 13a, but this step is not shown in the drawings for the sake of simplicity.

Figure 3C:
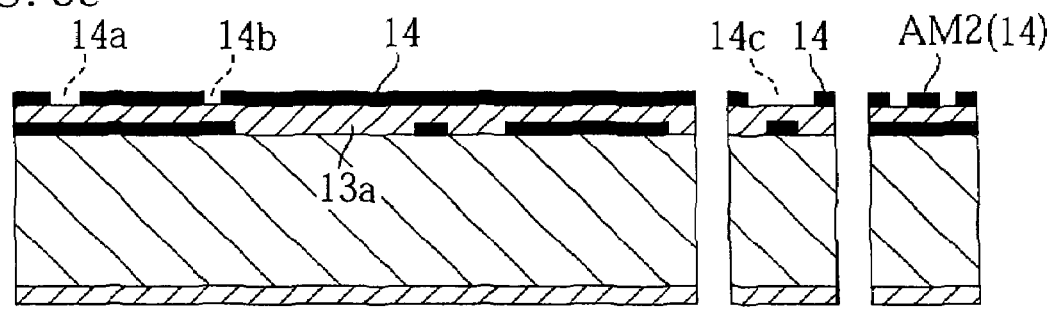

Next, as shown in FIG. 3c, an oxide film pattern 14 is formed over the polysilicon layer 13a. More specifically, first, an oxide film having a thickness of 1 µm, for example, and composed of silicon oxide is grown on the surface of the polysilicon layer 13a by CVD. This oxide film is then patterned. The oxide film pattern 14 has openings 14a and 14b used as communicating conductors. When the first alignment mark formation method is employed, the oxide film pattern 14 has an opening 14c at a location corresponding to the alignment mark AM1. When the second alignment mark formation method is employed, an alignment mark AM2 is formed in this step.

Figure 3D:
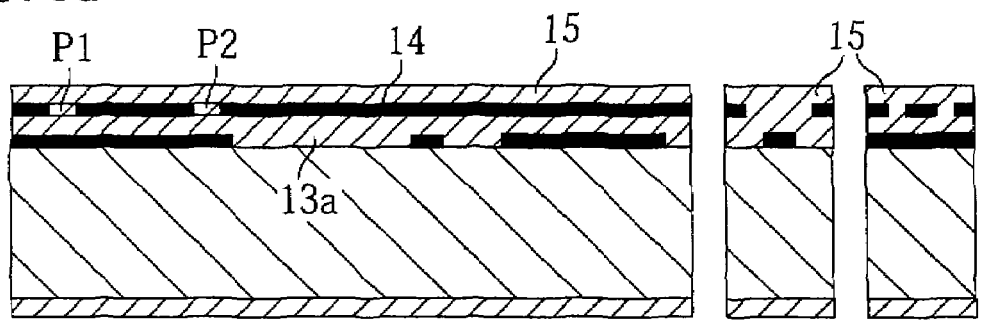

Next, as shown in FIG. 3d, plugs P1 and P2 serving as communicating conductors are formed in the openings 14a and 14b of the oxide film pattern 14 by producing a film of polysilicon from above the oxide film pattern 14 by CVD, and a polysilicon layer 15 is formed over the oxide film pattern 14. The polysilicon layer 15 is rendered conductive by doping the polysilicon with phosphorus during CVD, and has a thickness of 3 µm, for example, from the surface of the oxide film pattern 14. The polysilicon layer 15 and the polysilicon layer 13a are electrically connected in the material substrate that has undergone this procedure.

Figure 4A:
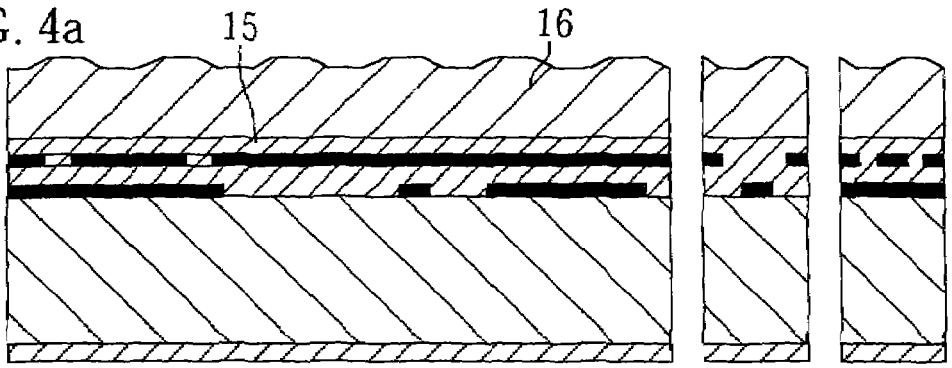
FIGS. 4a–4d show the steps following the steps shown in FIGS. 3a–3d.

Next, as shown in FIG. 4a, a polysilicon layer 16 is formed over the polysilicon layer 15 by epitaxial growth. In this embodiment, the polysilicon layer 16 is rendered conductive by doping the polysilicon with phosphorus during epitaxial growth, and has a thickness of approximately 130 µm from the surface of the polysilicon layer 15. In this step, relatively large bumps are formed on the surface of the polysilicon layer 16.

Figure 4B:
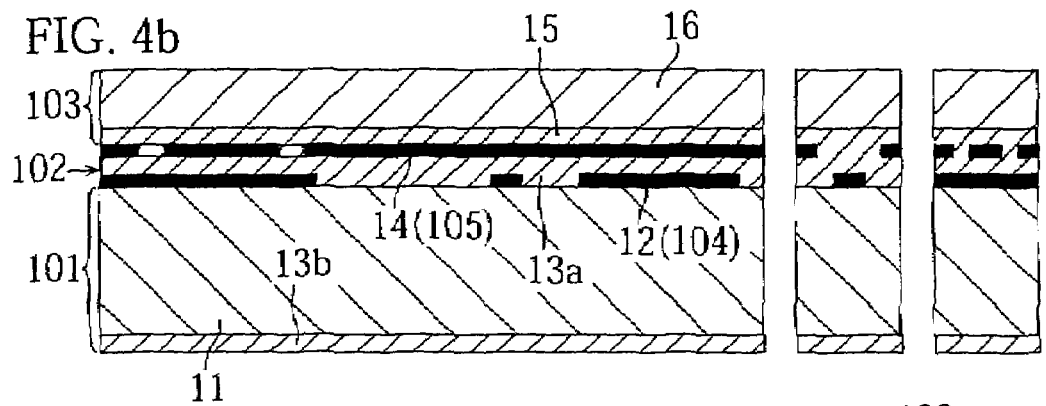

Next, as shown in FIG. 4b, the surface of the polysilicon layer 16 is ground down, which is followed by mirror polishing. As a result, the combined thickness of the polysilicon layer 15 and the polysilicon layer 16 on the oxide film pattern 14 is adjusted to 50 µm.

This procedure forms a material substrate having a laminated structure comprising a first conductor layer 101 composed of the silicon substrate 11 and the polysilicon layer 13b, a second conductor layer 102 composed of the polysilicon layer 13a, a third conductor layer 103 composed of the polysilicon layer 15 and the polysilicon layer 16, an oxide film pattern 12 (first insulating layer 104) interposed between the first conductor layer and the second conductor layer, and an oxide film pattern 14 (second insulating layer 105) interposed between the second conductor layer and the third conductor layer.

Figure 4C:
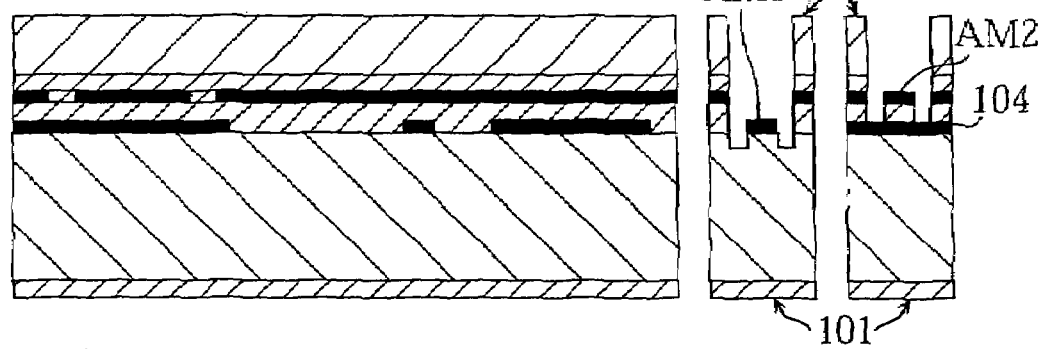

Next, as shown in FIG. 4c, the alignment marks are exposed. When the first alignment mark formation method is employed, etching is performed by DRIE (Deep Reactive Ion Etching) from the side of the third conductor layer 103, using a specific resist pattern as a mask, until several microns of the first conductor layer 101 have been removed. When the second alignment mark formation method is employed, etching is performed by DRIE from the side of the third conductor layer 103, using a specific resist pattern as a mask, until the first insulating layer 104 is reached.

With DRIE, in the Bosch process that involves alternating etching with side-wall protection, good etching can be performed by etching with $SF_6$ gas for 8 seconds, for example, performing side-wall protection with $C_4F_8$ gas for 6.5 seconds, for example, and adjusting the bias applied to the wafer to 23 W, for example. These same conditions can be employed for subsequent instances of DRIE herein.

Figure 4D:
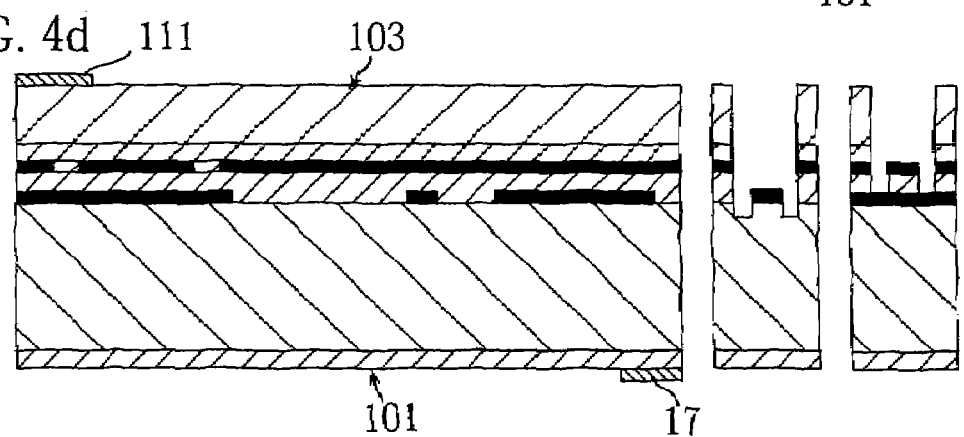

Next, as shown in FIG. 4d, wiring 17 (not shown in FIGS. 1 and 2) is formed over the first conductor layer 101, and the mirror surface 111 is formed over the third conductor layer 103. More specifically, films of first chromium (50 nm) and then gold (200 nm) are formed by sputtering on the first conductor layer 101 and the third conductor layer 103, after which a specific mask is applied and these metal films are etched, which patterns the wiring 17 and the mirror surface 111. Ceric ammonium nitrate can be used, for example, as the etchant for the chromium. A potassium iodide-iodine aqueous solution can be used, for example, as the etchant for the gold. In the patterning of the mirror surface 111 on the third conductor layer 103, the alignment marks (AM1 or AM2) are used for positioning. In the patterning of the wiring 17 on the first conductor layer 101, the pattern shape of the mirror surface 111 on the third conductor layer 103 is used for positioning.

Next, as shown in FIG. 5a, an oxide film pattern 18 is formed on the first conductor layer 101 and the third conductor layer 103, and a resist pattern 19 is formed on the first conductor layer 101. In the formation of the resist pattern 19, specifically, a liquid photoresist is formed by spin coating over the first conductor layer 101, and patterning is performed through exposure and developing. This photoresist can be, for example, AZP4210 (made by Clariant Japan) or AZ1500 (made by Clariant Japan). Subsequent instances of resist pattern herein are also formed by going through this photoresist formation followed by exposure and developing.

The oxide film pattern 18 on the third conductor layer 103 serves to mask the places on the third conductor layer 103 to be worked into the mirror component M, the inner frame F1, the comb electrode E1, the inner frame F2, and the outer frame F3 in the step shown in FIG. 5c. The oxide film pattern 18 on the first conductor layer 101 serves to mask the places on the first conductor layer 101 to be worked into the outer frame F3 in the steps shown in FIGS. 5d and 6a. The resist pattern 19 serves to mask the places on the first conductor layer 101 to be worked into the comb electrode E2 and the inner frame F2 in the step shown in FIG. 5d.

Next, as shown in FIG. 5b, alignment marks (AM1 or AM2) may be embedded in a hole. This can be accomplished using a resist, SOG (Spin-On-Glass), or the like.

Next, as shown in FIG. 5c, the third conductor layer 103 is etched by DRIE, using the oxide film pattern 18 as a mask, until the second insulating layer 105 is reached. This forms part of the mirror component M, part of the inner frame F1, the comb electrode E1, part of the inner frame F2, and part of the outer frame F3.

Next, as shown in FIG. 5d, the first conductor layer 101 is etched by DRIE, using the oxide film pattern 18 and the resist pattern 19 as masks, to a depth corresponding to the thickness of the comb electrode E2. A sacrificial layer 20 may be formed above the second insulating layer 105 as shown in FIG. 5d prior to the above etching treatment. This sacrificial layer 20 is provided in order to prevent the structure above the second insulating layer 105 from being damaged after this step. The sacrificial layer 20 can be formed, for example, by coating with liquid glass and then annealing this coating. A resist coating may instead be applied as the sacrificial layer 20. Alternatively, the sacrificial layer 20 may be formed by applying a film whose adhesive strength can be controlled, such as a UV-curing adhesive film, to the material substrate.

Next, after the resist pattern 19 is removed, etching is performed from the side of the first conductor layer 101 until the second insulating layer 105 is reached, as shown in FIG. 6a. This forms part of the mirror component M, the torsion bar T1, part of the inner frame F1, the comb electrode E2, the torsion bar T2, part of the inner frame F2, the torsion bar T3, and part of the outer frame F3. A plug P3 is formed as a communicating conductor on the inner frame F2. Similarly, a plug P4 is formed on the outer frame F3. AZ Remover 700 (made by Clariant Japan) can be used as a stripper for removing the resist pattern 19. This [product] can also be used for the removal of all subsequent resist patterns herein.

Next, the sacrificial layer 20 is removed as shown in FIG. 6b. In the removal of the sacrificial layer 20, BHF, for example, can be used on liquid glass. AZ Remover 700 (made by Clariant Japan) can be used on a resist.

Next, as shown in FIG. 6c, the exposed first insulating layer 104, second insulating layer 105, and oxide film pattern 18 are etched away by immersing the element in an etchant.

The above series of steps forms the mirror component M, the torsion bar T1, the inner frame F1, the comb electrodes E1 and E2, the torsion bar T2, the inner frame F2, the torsion bar T3, and the outer frame F3. Specifically, the micromirror element X1 shown in FIGS. 1 and 2 is manufactured.

In this embodiment, in the step shown in FIG. 3b, the polysilicon layer 13a, that is, the second conductor layer 102, can be formed to a high degree of precision in thickness. Therefore, this embodiment allows the torsion bars 141 and 151 to be formed to a high degree of thickness precision from the second conductor layer 102, whose thickness is pre-defined to a high degree of precision, between the insulating layers 104 and 105.

The mirror component M formed in this embodiment has a portion originating in the third conductor layer 103 and a portion that originates in the second conductor layer 102 and leads to the torsion bar T1, and these two portions are electrically connected via the plug P1. The inner frame F1 has a portion originating in the third conductor layer 103, namely, the upper layer component 121, and a portion that originates in the second conductor layer 102 and leads to the torsion bar T1, and these two portions are electrically connected via the plug P2. Therefore, the mirror component M (mirror component 110) is electrically connected to the upper layer component 121 of the inner frame F1 (inner frame 120) via the torsion bar T1 (torsion bar 141).

The inner frame F2 has a portion that originates in the second conductor layer 102 and leads to the torsion bar T3, and a portion that originates in the first conductor layer 101, namely, the lower layer components 122, and these two portions are electrically connected via the plug P3. The outer frame F3 has a portion that originates in the second conductor layer 102 and leads to the torsion bar T3, and a portion that originates in the first conductor layer 101, namely, the lower layer component 132. These two portions are electrically connected via the plug P4. Therefore, the lower layer components 122 of the inner frame F2 (inner frame 120) are electrically connected to the outer frame F3 (outer frame 130) by the torsion bar T3 (torsion bar 151).

In this embodiment, other modes are possible for the electrical connection between the inner frame F2 and outer frame F3. In the inner frame F2, if the plug P3 is not provided between the lower layer components 122 and the portion originating in the second conductor layer, and the lower layer components 122 are electrically isolated from the portion originating in the second conductor layer by the first insulating layer 104, and if a conductive plug is provided between the upper layer component 121 and the portion originating in the second conductor layer by carrying out the same step as that in which the plug P2 of the inner frame F1 was formed, for instance, then the upper layer component 121 of the inner frame F2 will be electrically connected with the torsion bar T3. If the structure of the inner frame F2 in FIG. 6c is changed in this way, then the upper layer component 121 of the inner frame F2 (inner frame 120) can be electrically connected to the lower layer component 132 of the outer frame F3 (outer frame 130) by the torsion bar T3 (torsion bar 151).

Similarly, in the outer frame F3, if the plug P4 is not provided between the lower layer component 132 and the portion originating in the second conductor layer, and the lower layer component 132 is electrically isolated from the portion originating in the second conductor layer by the first insulating layer 104, and if a plug the same as the plug P2 of the inner frame F1 is provided between the upper layer component 131 and the portion originating in the second conductor layer, for instance, then the upper layer component 131 of the outer frame F3 will be electrically connected with the torsion bar T3. If the structure of the outer frame F3 in FIG. 6c is changed in this way, then the lower layer components 122 of the inner frame F2 (inner frame 120) can be electrically connected to the upper layer component 131 of the outer frame F3 (outer frame 130) by the torsion bar T3 (torsion bar 151).

Also, if the structure of the inner frame F2 and the outer frame F3 in FIG. 6c is changed as above, the upper layer component 121 of the inner frame F2 (inner frame 120) can be electrically connected to the upper layer component 131 of the outer frame F3 (outer frame 130) by the torsion bar T3 (torsion bar 151).

In the micromirror element X1, one of the above electrical connection modes is suitably selected for each of the torsion bars 151 included in the linking components 150, and a conduction path is formed in the interior of the inner frame 120 and the outer frame 130 so that there will be no undesirable short-circuiting of the torsion bars 151, which makes possible a plurality of potential transmissions from the outer frame 130 to the inner frame 120. Specifically, the size of the potential applied to each comb electrode can be individually controlled. As a result, the micromirror element X1 can properly carry out a plurality of operations.

FIGS. 7a to 10c illustrate a series of steps in a microstructure manufacturing method according to a second embodiment of the present invention. This method is another way to manufacture the above-mentioned micromirror element X1 by micromachining. In FIGS. 7a to 10c, just as in FIGS. 3a to 6c, the steps of forming the mirror component M, the torsion bar T1, the inner frame F1, the set of comb electrodes E1 and E2, the torsion bar T2, the inner frame F2, the torsion bar T3, and the outer frame F3 shown in FIG. 6c are depicted by a single modeled cross section. In this embodiment, the step of forming the alignment mark AM3 is also illustrated with a modeled cross section.

Figure 7A:
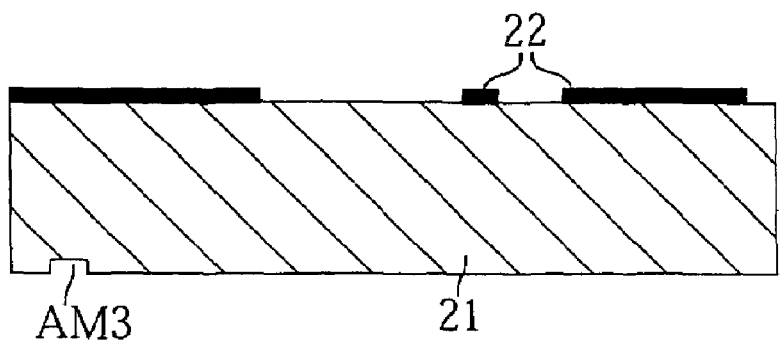
FIGS. 7a–7d show some of the steps involved in a micromirror element manufacturing method according to a second embodiment of the present invention.

In this embodiment, first, as shown in FIG. 7a, a recess is formed as the alignment mark AM3 on the lower surface of a silicon substrate 21, after which an oxide film pattern 22 is formed on the upper surface of the silicon substrate 21. The alignment mark AM3 is formed by etching (DRIE) through a specific mask down to a depth of about 5 μm. The oxide film pattern 22 is formed by patterning an oxide film (thickness of 0.25 μm, for example) formed on the upper surface of the silicon substrate 21 by thermal oxidation. In this patterning, positioning is performed through reference to the alignment mark AM3. The oxide film pattern 22 serves to mask the places to be worked into the mirror component M, the torsion bar T1, the inner frame F1, the torsion bar T2, and the torsion bar T3 in the step shown in FIG. 10a.

Figure 7B:
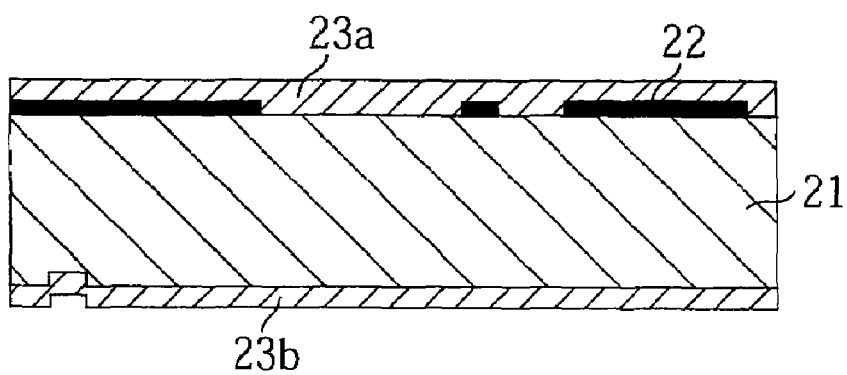

Next, as shown in FIG. 7b, polysilicon layers 23a and 23b are formed by using CVD to produce a film of polysilicon on the silicon substrate 21 from above the oxide film pattern 22. The polysilicon layers 23a and 23b are rendered conductive by doping the polysilicon with phosphorus during CVD, and have a thickness of 3 μm, for example, from the surface of the oxide film pattern 22. In a material substrate that has undergone this procedure, the polysilicon layer 23a is electrically connected with the silicon substrate 21 and the polysilicon layer 23b. A recess corresponding to the alignment mark AM3 is formed in the polysilicon layer 23b.

Figure 7C:
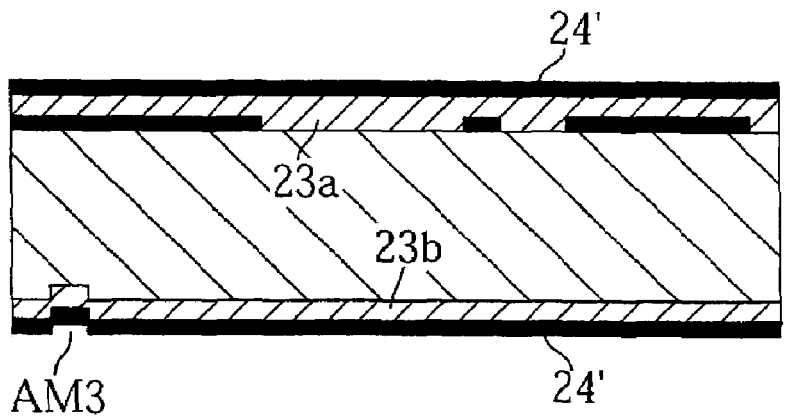
Figure 7D:
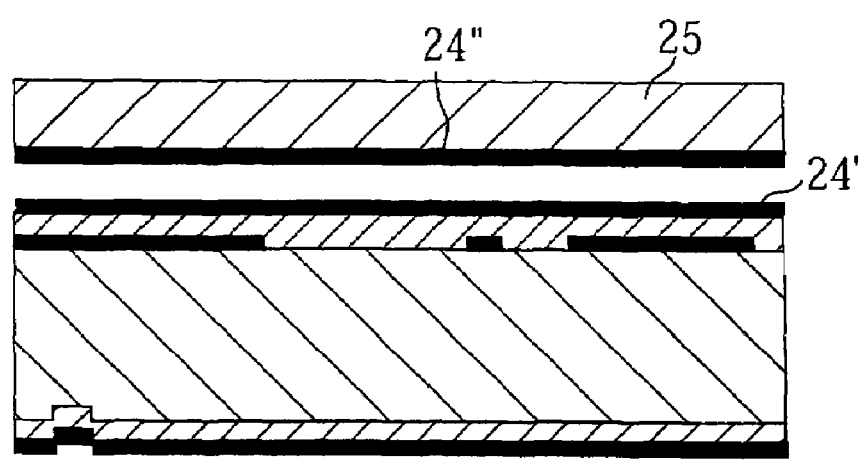

Next, as shown in FIG. 7c, an oxide film 24' having a thickness of 1 μm, for example, is formed over the polysilicon layers 23a and 23b by CVD. Then, as shown in FIG. 7d, a silicon substrate 25 having an oxide film 24" formed on one side is readied. The oxide film 24" is formed over the silicon substrate 25 by thermal oxidation.

Figure 8A:
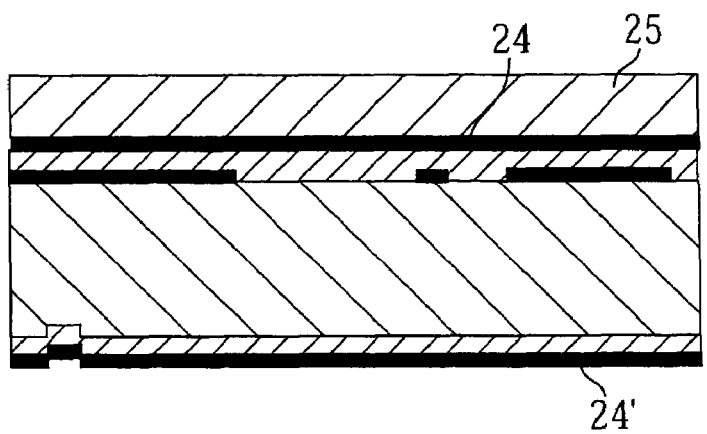
FIGS. 8a–8d show the steps following the steps shown in FIGS. 7a–7d.

Next, as shown in FIG. 8a, the silicon substrate 25 is heated and joined over the oxide film 24' via the oxide film 24". The oxide film 24' and the oxide film 24" are integrated to become an oxide film 24.

Figure 8B:
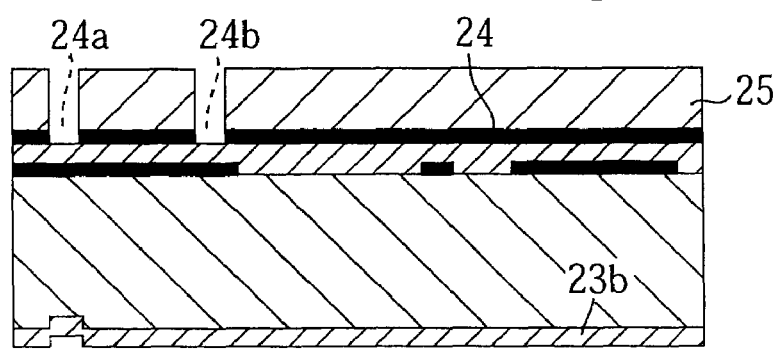

Next, as shown in FIG. 8b, through-holes that go through to the oxide film 24 are made in the silicon substrate 25, after which openings 24a and 24b used as communicating conductors are formed in the oxide film 24. The through-holes in the silicon substrate 25 are formed by DRIE, using a specific resist pattern as a mask. The openings 24a and 24b are formed by immersing the element in BHF. The oxide film 24' on the polysilicon layer 23b is also removed at this time.

Figure 8C:
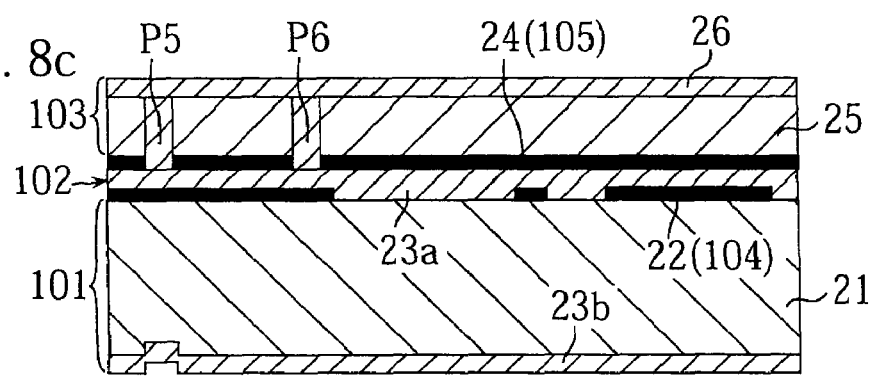

Next, as shown in FIG. 8c, a polysilicon layer 26 and plugs P5 and P6 are formed. In the formation of these components, first, a polysilicon film (1 μm, for example) is formed on the silicon substrate 25 and inside the openings 24a and 24b by CVD, for instance. Then, a phosphosilicate glass (PSG) film (1 μm, for example) is formed over this polysilicon film by CVD, for instance, and a heat treatment is then performed. This allows the plugs P5 and P6 having a conduction function to be formed. Next, the through-holes in the silicon substrate 25 communicating with the openings 24a and 24b are filled in by the epitaxial growth of polysilicon. The epitaxially grown polysilicon everywhere but in the through-holes is polished away. The polysilicon layer 26 and the plugs P5 and P6 can be formed in this way. In a material substrate that has undergone this procedure, the silicon substrate 25 is electrically connected with the polysilicon layer 23a.

This procedure forms a material substrate having a laminated structure comprising a first conductor layer 101 composed of the silicon substrate 21 and the polysilicon layer 23b, a second conductor layer 102 composed of the polysilicon layer 23a, a third conductor layer 103 composed of the silicon substrate 25 and the polysilicon layer 26, an oxide film pattern 22 (first insulating layer 104) interposed between the first conductor layer and the second conductor layer, and an oxide film 24 (second insulating layer 105) interposed between the second conductor layer and the third conductor layer.

Figure 8D:
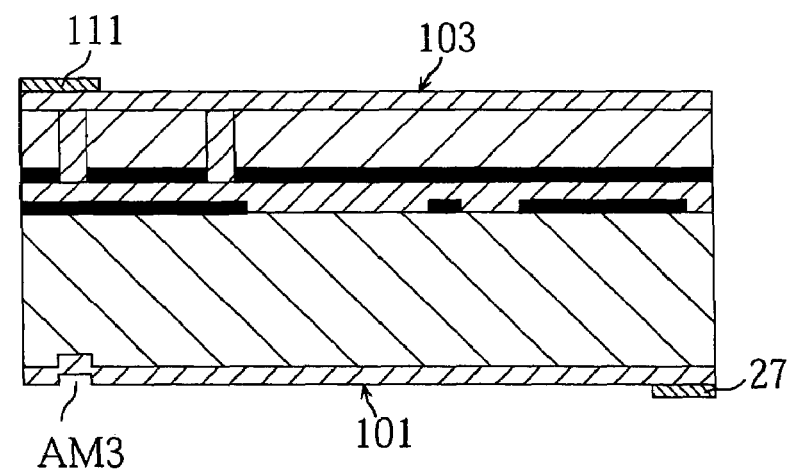

Next, as shown in FIG. 8d, wiring 27 (not shown in FIGS. 1 and 2) is formed over the first conductor layer 101, and the mirror surface 111 is formed over the third conductor layer 103. More specifically, this is substantially the same as what was described through reference to FIG. 4d in the first embodiment. However, in the patterning of the wiring 27 on the first conductor layer 101, positioning is performed through reference to the alignment mark AM3. In the patterning of the mirror surface 111 on the third conductor layer 103, the pattern shape of the wiring 27 on the first conductor layer 101 is used for positioning.

Figure 9A:
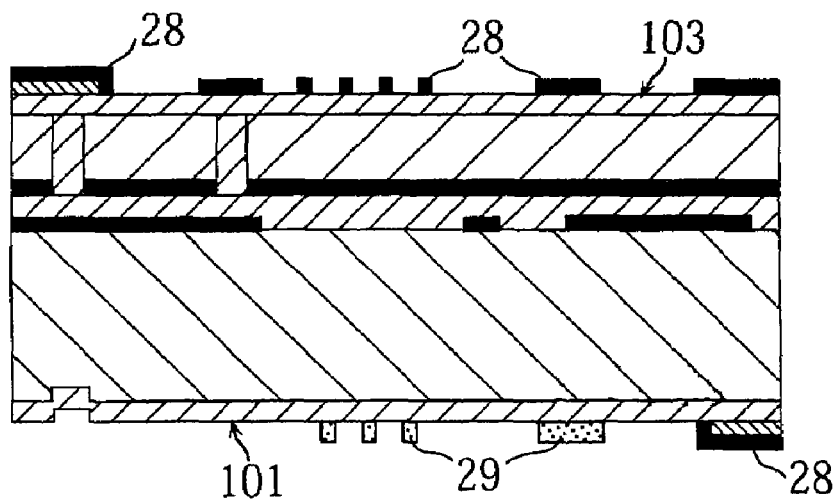
FIGS. 9a–9c show the steps following the steps shown in FIGS. 8a–8d.

Next, as shown in FIG. 9a, an oxide film pattern 28 is formed on the first conductor layer 101 and the third conductor layer 103, and a resist pattern 29 is formed on the first conductor layer 101.

Figure 9B:
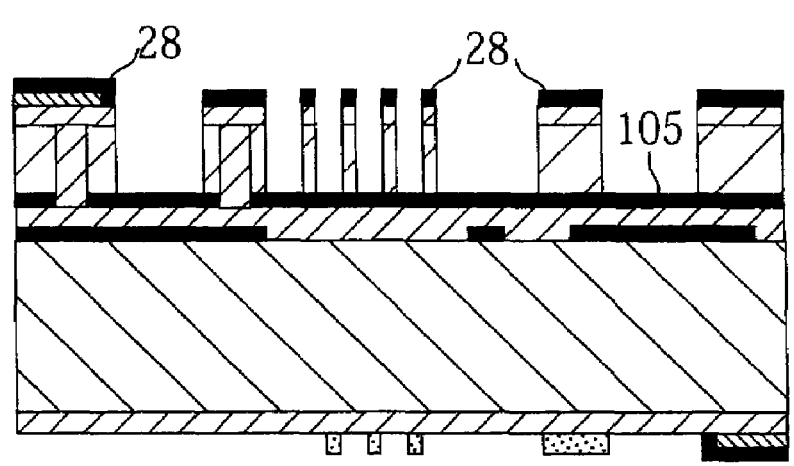

The oxide film pattern 28 on the third conductor layer 103 serves to mask the places on the third conductor layer 103 to be worked into the mirror component M, the inner frame F1, the comb electrode E1, the inner frame F2, and the outer frame F3 in the step shown in FIG. 9b. The oxide film pattern 28 on the first conductor layer 101 serves to mask the places on the first conductor layer 101 to be worked into the outer frame F3 in the steps shown in FIGS. 9c and 10a. The resist pattern 29 serves to mask the places on the first conductor layer 101 to be worked into the comb electrode E2 and the inner frame F2 in the step shown in FIG. 9c.

Next, as shown in FIG. 9b, the third conductor layer 103 is etched by DRIE, using the oxide film pattern 28 as a mask, until the second insulating layer 105 is reached. This forms part of the mirror component M, part of the inner frame F1, the comb electrode E1, part of the inner frame F2, and part of the outer frame F3.

Figure 9C:
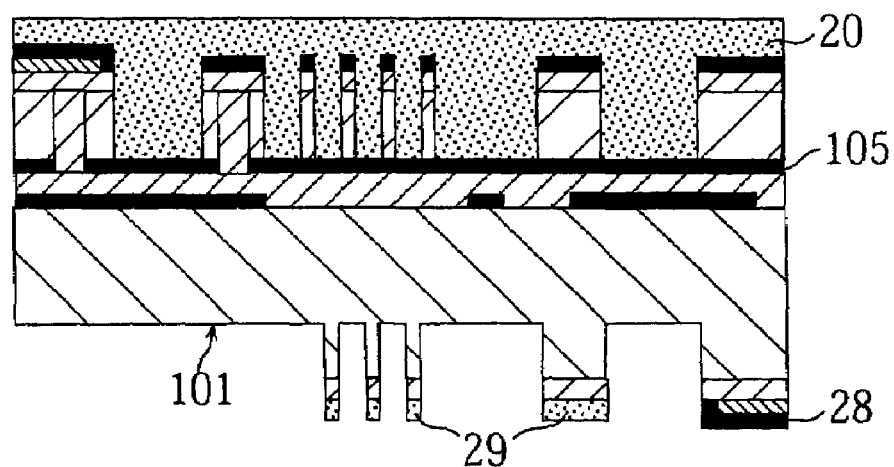

Next, as shown in FIG. 9c, a sacrificial layer 20 is formed above the second insulating layer 105, after which the first conductor layer 101 is etched by DRIE, using the resist pattern 29 as a mask, to a depth corresponding to the thickness of the comb electrode E2.

Figure 10A:
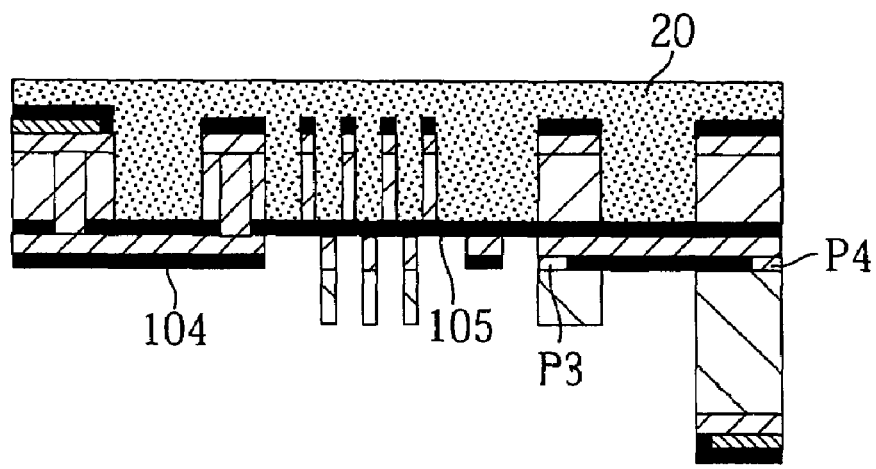
FIGS. 10a–c show the steps following the steps shown in FIGS. 9a–9c.

Next, after the resist pattern 29 is removed, etching is performed from the side of the first conductor layer 101 until the second insulating layer 105 is reached, as shown in FIG. 10a. This forms part of the mirror component M, the torsion bar T1, part of the inner frame F1, the comb electrode E2, the torsion bar T2, part of the inner frame F2, the torsion bar T3, and part of the outer frame F3. A plug P3 is formed on the inner frame F2 just as in the first embodiment. Similarly, a plug P4 is formed on the outer frame F3.

Figure 10B:
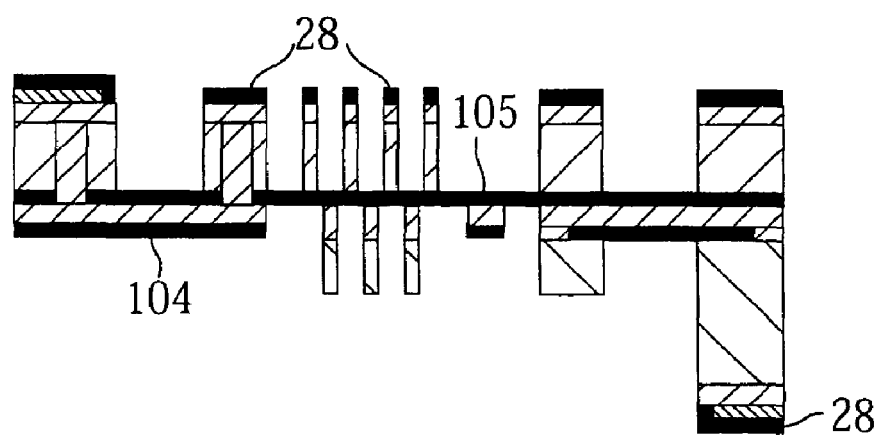
Figure 10C:
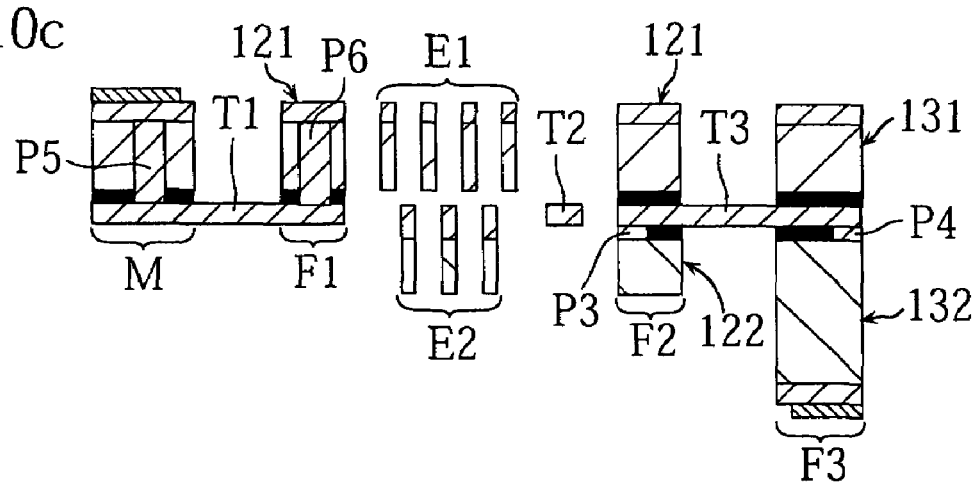

Next, as shown in FIG. 10b, the sacrificial layer 20 is removed in the same manner as described above through reference to FIG. 6b in the first embodiment. Then, as shown in FIG. 10c, the exposed first insulating layer 104, second insulating layer 105, and oxide film pattern 28 are etched away by immersing the element in an etchant.

The above series of steps forms the mirror component M, the torsion bar T1, the inner frame F1, the comb electrodes E1 and E2, the torsion bar T2, the inner frame F2, the torsion bar T3, and the outer frame F3. Specifically, the micromirror element X1 shown in FIGS. 1 and 2 is manufactured.

In this embodiment, in the step shown in FIG. 7b, the polysilicon layer 23a, that is, the second conductor layer 102, can be formed to a high degree of precision in thickness. Therefore, this embodiment allows the torsion bars 141 and 151 to be formed to a high degree of thickness precision from the second conductor layer 102, whose thickness is pre-defined to a high degree of precision, between the insulating layers 104 and 105.

The mirror component M formed in this embodiment has a portion originating in the third conductor layer 103 and a portion that originates in the second conductor layer 102 and leads to the torsion bar T1, and these two portions are electrically connected via the plug P5. The inner frame F1 has a portion originating in the third conductor layer 103, namely, the upper layer component 121, and a portion that originates in the second conductor layer 102 and leads to the torsion bar T1, and these two portions are electrically connected via the plug P6. Therefore, the mirror component M (mirror component 110) is electrically connected to the upper layer component 121 of the inner frame F1 (inner frame 120) via the torsion bar T1 (torsion bar 141).

The electrical connection mode between the inner frame F2 and the outer frame F3, and variations thereof, in this embodiment are the same as those discussed above for the first embodiment. Therefore, in the micromirror element X1 manufactured in this embodiment, a plurality of potential transmissions from the outer frame 130 to the inner frame 120 are possible, and the size of the potential applied to each comb electrode can be individually controlled. As a result, the micromirror element X1 manufactured in this embodiment can properly carry out a plurality of operations.

FIGS. 11a to 14d illustrate a series of steps in a microstructure manufacturing method according to a third embodiment of the present invention. This method is another way to manufacture the above-mentioned micromirror element X1 by micromachining. In FIGS. 11a to 14d, just as in FIGS. 3a to 6c, the steps of forming the mirror component M, the torsion bar T1, the inner frame F1, the set of comb electrodes E1 and E2, the torsion bar T2, the inner frame F2, the torsion bar T3, and the outer frame F3 are depicted by a single modeled cross section. In this embodiment, just as in the second embodiment, the step of forming the alignment mark AM3 is also illustrated with a modeled cross section.

Figure 11A:
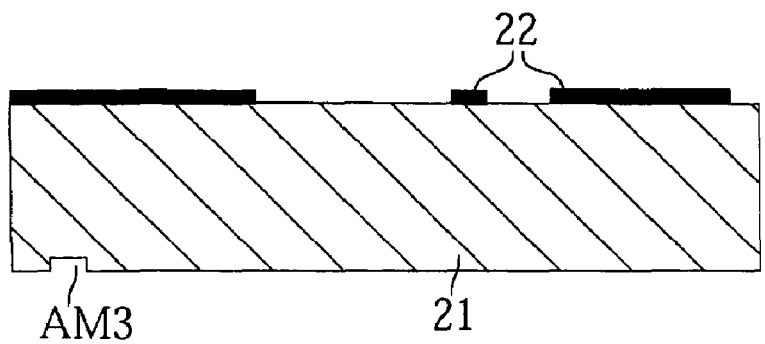
FIGS. 11a–11d show some of the steps involved in a micromirror element manufacturing method according to a third embodiment of the present invention.
Figure 11B:
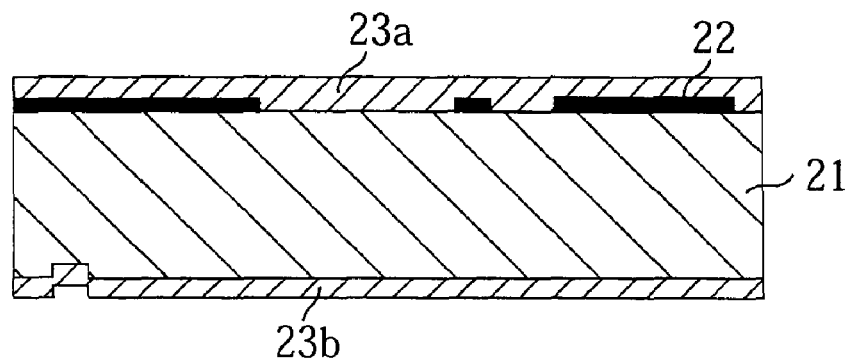

In this embodiment, first, as shown in FIGS. 11a and 11b, the same steps are carried out as those discussed above through reference to FIGS. 7a and 7b in the second embodiment.

Figure 11C:
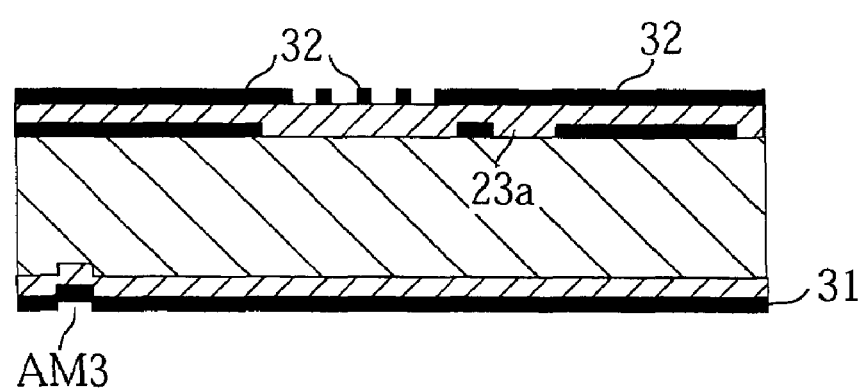

Next, an oxide film 31 having a thickness of 1 µm, for example, is formed over the polysilicon layers 23a and 23b, after which the oxide film 31 on the polysilicon layer 23a is patterned to form an oxide film pattern 32, as shown in FIG. 11c. The oxide film pattern 32 serves to mask the places to be worked into the comb electrode E2 in the step shown in FIG. 11d.

Figure 11D:
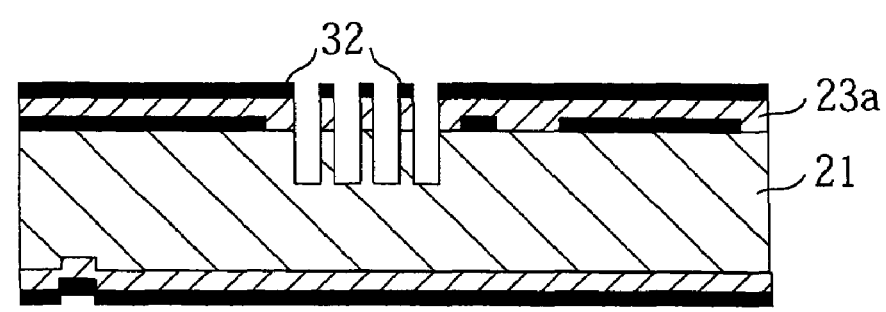

Next, as shown in FIG. 11d, the polysilicon layer 23a and the silicon substrate 21 are etched by DRIE, using the oxide film pattern 32 as a mask, to a depth corresponding to the thickness of the comb electrode E2.

Figure 12A:
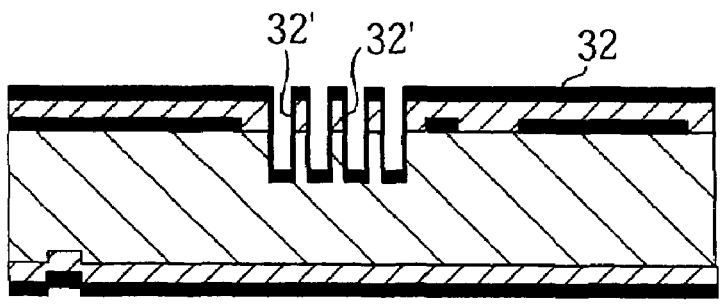
FIGS. 12a–12d show the steps following the steps shown in FIGS. 11a–11d.

Next, as shown in FIG. 12a, another oxide film composed of silicon oxide is formed by CVD from above the oxide film pattern 32. This results in the surface of the comb electrode E2 formed in the previous step being covered by an oxide film 32'.

Figure 12B:
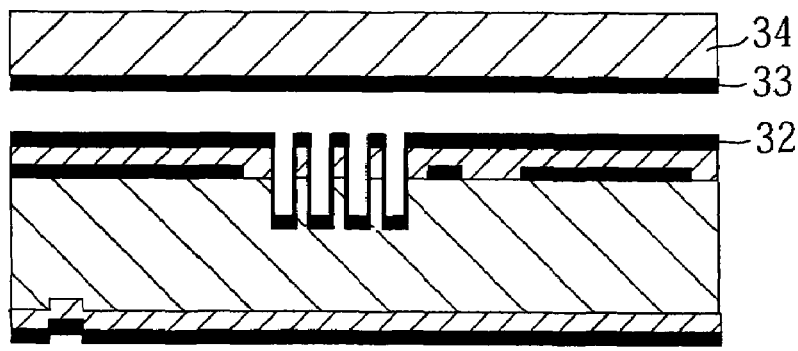

Next, as shown in FIG. 12b, a silicon substrate 34 having an oxide film 33 formed on one side is readied. The oxide film 33 is formed over the silicon substrate 34 by thermal oxidation.

Figure 12C:
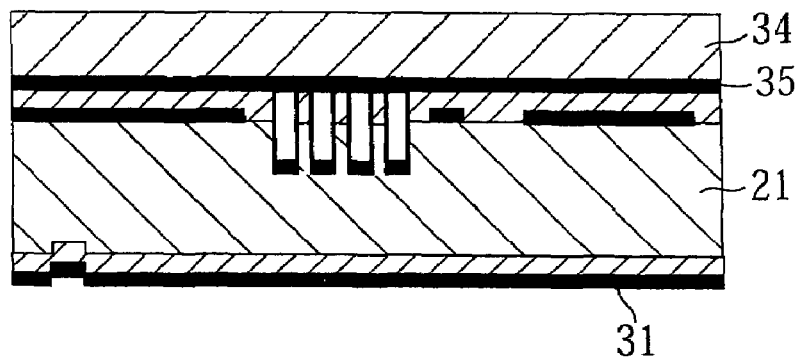

Next, as shown in FIG. 12c, the silicon substrate 34 is heated and joined over the oxide film 32 via the oxide film 33. The oxide film 32 and the oxide film 33 are integrated to become an oxide film 35.

Figure 12D:
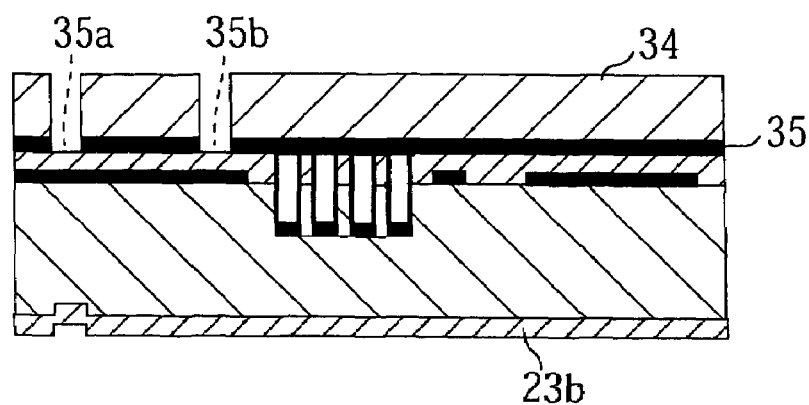

Next, as shown in FIG. 12d, through-holes that go through to the oxide film 35 are made in the silicon substrate 34, after which openings 35a and 35b used as communicating conductors are formed in the oxide film 35. The through-holes in the silicon substrate 34 are formed by DRIE, using a specific resist pattern as a mask. The openings 35a and 35b are formed by immersing the element in BHF to etch away the exposed portion of the oxide film 35. The oxide film 31 on the polysilicon layer 23b is also removed at this time.

Figure 13A:
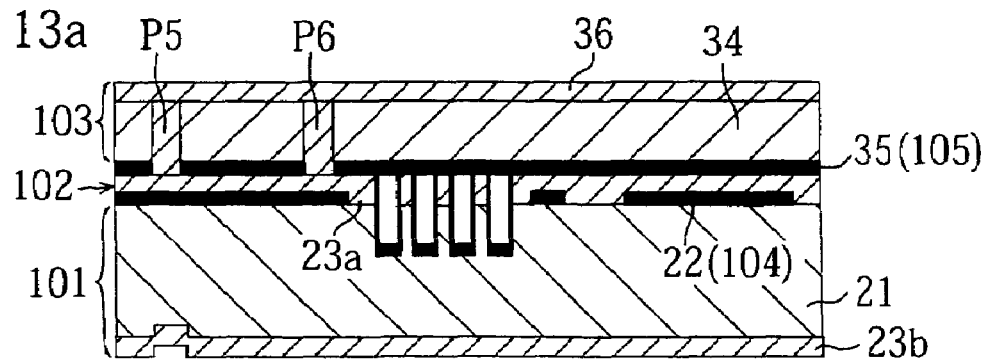
FIGS. 13a–13d show the steps following the steps shown in FIGS. 12a–12d.

Next, as shown in FIG. 13a, a polysilicon layer 36 and plugs P5 and P6 are formed. In the formation of these components, first, a polysilicon film (1 μm, for example) is formed on the silicon substrate 34 and inside the openings 35a and 35b by CVD, for instance. Then, a phosphosilicate glass (PSG) film (1 μm, for example) is formed over this polysilicon film by CVD, for instance, and a heat treatment is then performed. This allows the plugs P5 and P6 having a conduction function to be formed. Next, the through-holes in the silicon substrate 34 communicating with the openings 35a and 35b are filled in by the epitaxial growth of polysilicon. The epitaxially grown polysilicon everywhere but in the through-holes is polished away. In a material substrate that has undergone this procedure, the silicon substrate 34 is electrically connected with the polysilicon layer 23a.

This procedure forms a material substrate having a laminated structure comprising a first conductor layer 101 composed of the silicon substrate 21 and the polysilicon layer 23b, a second conductor layer 102 composed of the polysilicon layer 23a, a third conductor layer 103 composed of the silicon substrate 34 and the polysilicon layer 36, an oxide film pattern 22 (first insulating layer 104) interposed between the first conductor layer and the second conductor layer, and an oxide film 35 (second insulating layer 105) interposed between the second conductor layer and the third conductor layer.

Figure 13B:
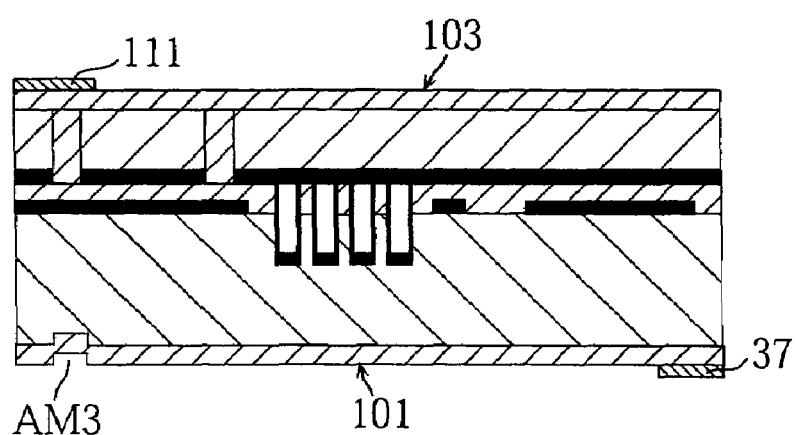

Next, as shown in FIG. 13b, wiring 37 (not shown in FIGS. 1 and 2) is formed over the first conductor layer 101, and the mirror surface 111 is formed over the third conductor layer 103. More specifically, this is the same as what was described through reference to FIG. 8d in the second embodiment.

Figure 13C:
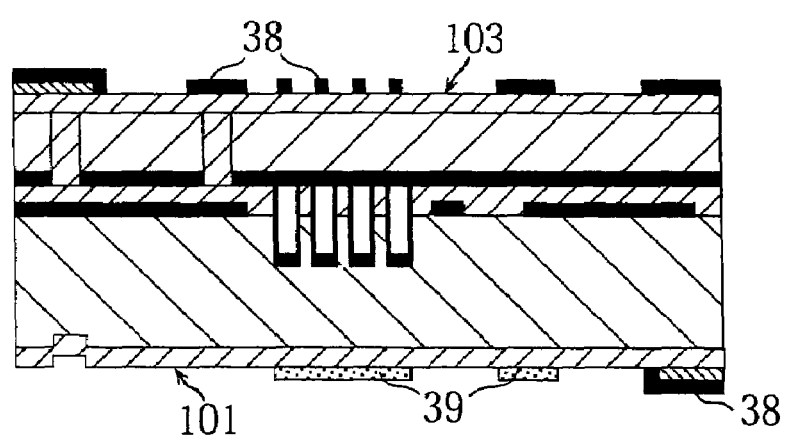

Next, as shown in FIG. 13c, an oxide film pattern 38 is formed on the first conductor layer 101 and the third conductor layer 103, and a resist pattern 39 is formed on the first conductor layer 101. The oxide film pattern 38 on the third conductor layer 103 serves to mask the places on the third conductor layer 103 to be worked into the mirror component M, the inner frame F1, the comb electrode E1, the inner frame F2, and the outer frame F3 in the step shown in FIG. 13d. The oxide film pattern 38 on the first conductor layer 101 serves to mask the places on the first conductor layer 101 to be worked into the outer frame F3 in the steps shown in FIGS. 14a and 14b. The resist pattern 39 serves to mask the places corresponding to the places on the first conductor layer 101 to be worked into the comb electrode E2 and the inner frame F2 in the step shown in FIG. 14a.

Figure 13D:
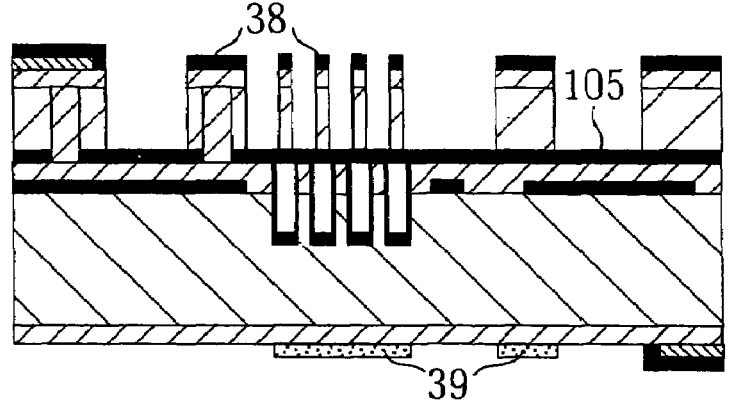

Next, as shown in FIG. 13d, the third conductor layer 103 is etched by DRIE, using the oxide film pattern 38 as a mask, until the second insulating layer 105 is reached. This forms part of the mirror component M, part of the inner frame F1, the comb electrode E1, part of the inner frame F2, and part of the outer frame F3.

Figure 14A:
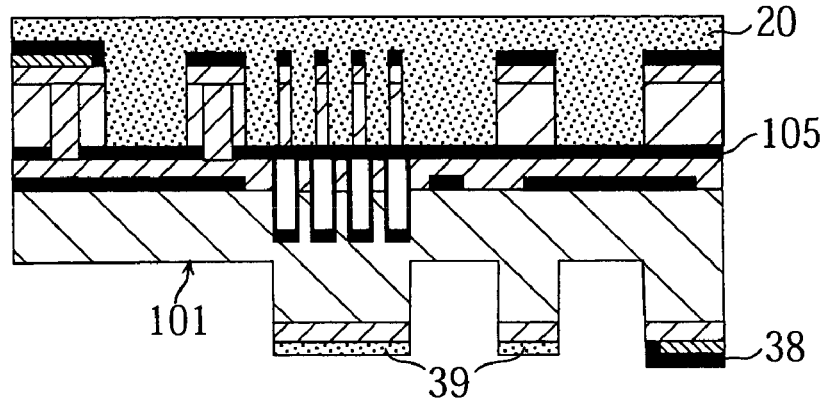
FIGS. 14a–14d show the steps following the steps shown in FIGS. 13a–13d.

Next, as shown in FIG. 14a, a sacrificial layer 20 is formed above the second insulating layer 105, after which the first conductor layer 101 is etched to a specific depth by DRIE, using the resist pattern 39 as a mask.

Figure 14B:
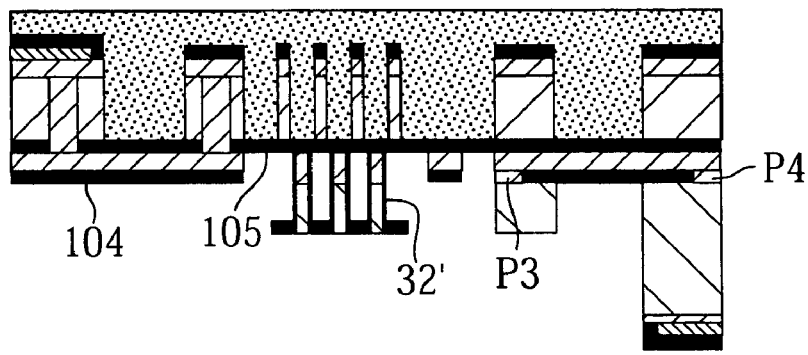

Next, after the resist pattern 39 is removed, etching is performed from the side of the first conductor layer 101 until the second insulating layer 105 is reached, as shown in FIG. 14b. This forms part of the mirror component M, the torsion bar T1, part of the inner frame F1, the comb electrode E2, the torsion bar T2, part of the inner frame F2, the torsion bar T3, and part of the outer frame F3. The comb electrode E2 is covered and protected by an oxide film 32' during the etching treatment in this step. A plug P3 is formed on the inner frame F2 just as in the first embodiment. Similarly, a plug P4 is formed on the outer frame F3.

Figure 14C:
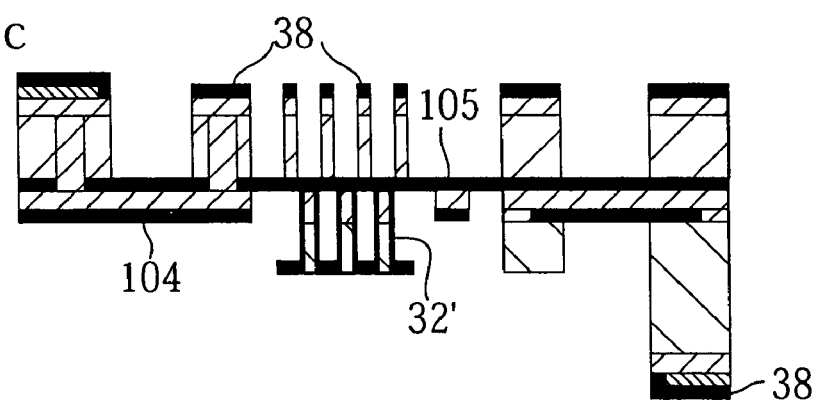

Next, the sacrificial layer 20 is removed as shown in FIG. 14c, in the same manner as described above through reference to FIG. 6b in the first embodiment.

Figure 14D:
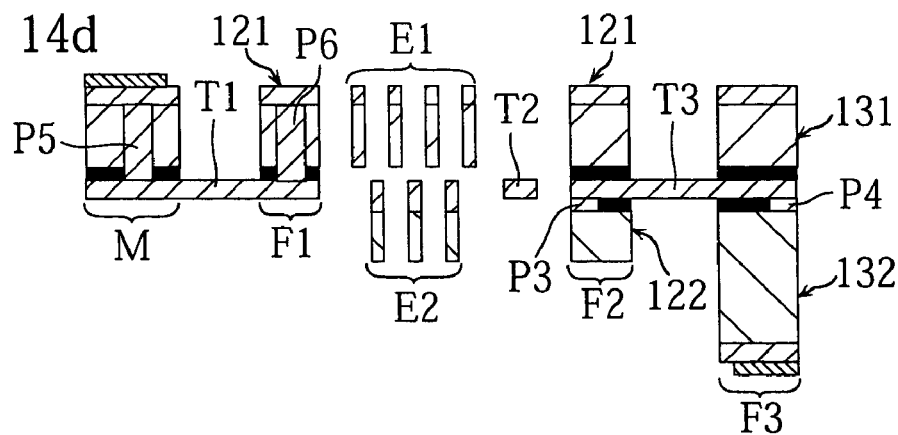

Next, as shown in FIG. 14d, the exposed first insulating layer 104, second insulating layer 105, oxide film pattern 38, and the oxide film 32' protecting the comb electrode E2 are etched away by immersing the element in an etchant.

The above series of steps forms the mirror component M, the torsion bar T1, the inner frame F1, the comb electrodes E1 and E2, the torsion bar T2, the inner frame F2, the torsion bar T3, and the outer frame F3. Specifically, the micromirror element X1 shown in FIGS. 1 and 2 is manufactured.

In this embodiment, in the step shown in FIG. 11b, the polysilicon layer 23a, that is, the second conductor layer 102, can be formed to a high degree of precision in thickness. Therefore, this embodiment allows the torsion bars 141 and 151 to be formed to a high degree of thickness precision from the second conductor layer 102, whose thickness is pre-defined to a high degree of precision, between the insulating layers 104 and 105.

The electrical connection modes between the mirror component M and the inner frame F2 formed in this embodiment are the same as those discussed above for the second embodiment. Therefore, the mirror component M (mirror component 110) is electrically connected to the upper layer component 121 of the inner frame F1 (inner frame 120) by the torsion bar T1 (torsion bar 141).

The electrical connection mode between the inner frame F2 and the outer frame F3, and variations thereof, in this embodiment are the same as those discussed above for the first embodiment. Therefore, in the micromirror element X1 manufactured in this embodiment, a plurality of potential transmissions from the outer frame 130 to the inner frame 120 are possible, and the size of the potential applied to each comb electrode can be individually controlled. As a result, the micromirror element X1 manufactured in this embodiment can properly carry out a plurality of operations.

Also, the comb electrode E2 is pre-embedded in the silicon substrate 21 in this embodiment. Accordingly, the comb electrode E2 that is thicker than the lower layer component 132 of the outer frame F3 can be formed with good precision.

FIGS. 15a to 17d illustrate a series of steps in a microstructure manufacturing method according to a fourth embodiment of the present invention. This method is another way to manufacture the above-mentioned micromirror element X1 by micromachining. In FIGS. 15a to 17d, just as in FIGS. 3a to 6c, the steps of forming the mirror component M, the torsion bar T1, the inner frame F1, the set of comb electrodes E1 and E2, the torsion bar T2, the inner frame F2, the torsion bar T3, and the outer frame F3 are depicted by a single modeled cross section. In FIGS. 15a to 17d, a cross section of the alignment mark formation site near the end of the wafer is shown along with this modeled cross section.

Figure 15A:
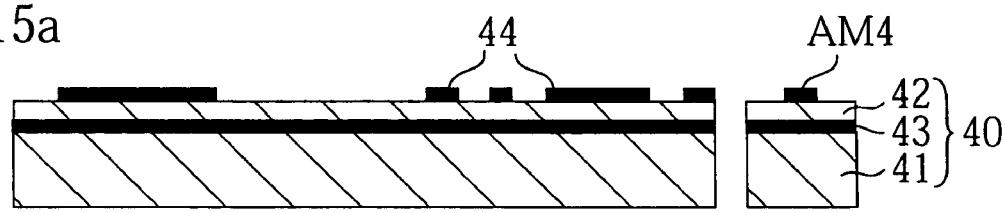
FIGS. 15a–15d show some of the steps involved in a micromirror element manufacturing method according to a fourth embodiment of the present invention.

In this embodiment, first, as shown in FIG. 15a, an oxide film pattern 44 is formed on an SOI (Silicon On Insulator) substrate 40. The SOI substrate 40 has a laminated structure composed of a relatively thick silicon layer 41, a relatively thin silicon layer 42, and an oxide film 43 sandwiched therebetween.

The silicon layers 41 and 42 are composed of silicon that has been rendered conductive by being doped with phosphorus or antimony. The oxide film 43 is composed of silicon oxide grown on the surface of the silicon layer 41 or the silicon layer 42 by thermal oxidation. CVD may be employed instead of thermal oxidation as the means for forming the oxide film 43. After the growth of the oxide film 43, the silicon layer 41 and the silicon layer 42 are joined to produce the SOI substrate 40. In this embodiment, the thickness of the silicon layer 41 is 150 µm, the thickness of the silicon layer 42 is 5 µm, and the thickness of the oxide film 43 is 1 µm, for example.

The oxide film pattern 44 is formed by growing an oxide film composed of silicon oxide on the silicon layer 42 by thermal oxidation, and then patterning this film. The oxide film pattern 44 primarily serves to mask the torsion bars T1 to T3 in the step shown in FIGS. 15b and 17b. Also, an alignment mark AM4 is formed on the silicon layer 42 in this step.

Figure 15B:
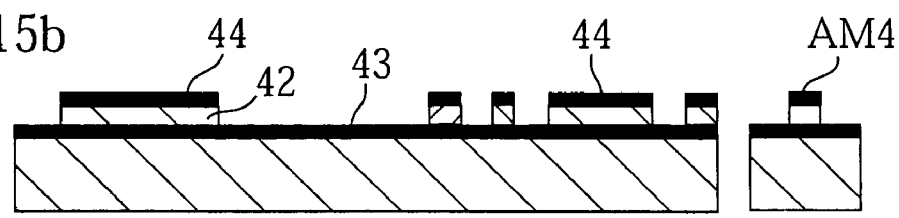
Figure 15C:
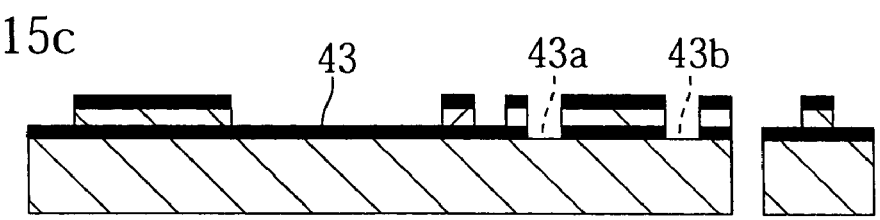
Figure 15D:
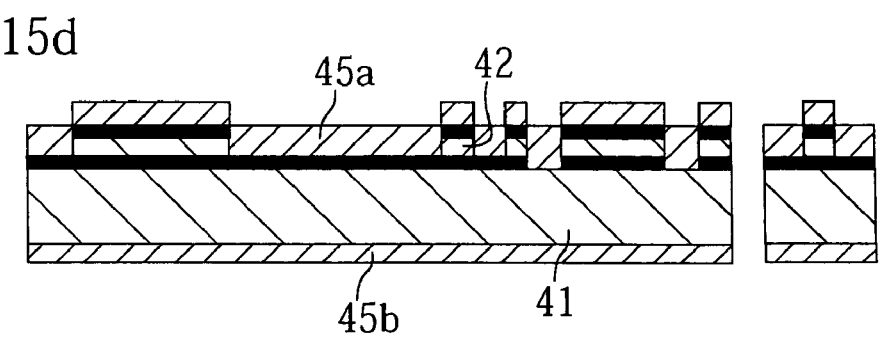

Next, as shown in FIG. 15b, the silicon layer 42 is etched by DRIE, using the oxide film pattern 44 as a mask, until the oxide film 43 is reached. Then, as shown in FIG. 15c, openings 43a and 43b used for communicating conductors are formed at specific places in the oxide film 43, using a specific resist pattern as a mask. Then, a film of polysilicon is formed on the SOI substrate 40 by CVD, which forms the polysilicon layers 45a and 45b as shown in FIG. 15d. The openings 43a and 43b in the oxide film 43 are filled in by the polysilicon at this time. The polysilicon layers 45a and 45b are rendered conductive by doping the polysilicon with phosphorus during CVD, and have a thickness of approximately 1 µm. In a material substrate that has undergone this procedure, the polysilicon layer 45a and the silicon layer 42 are electrically connected, as are the silicon layer 41 and the polysilicon layer 45b.

Figure 16A:
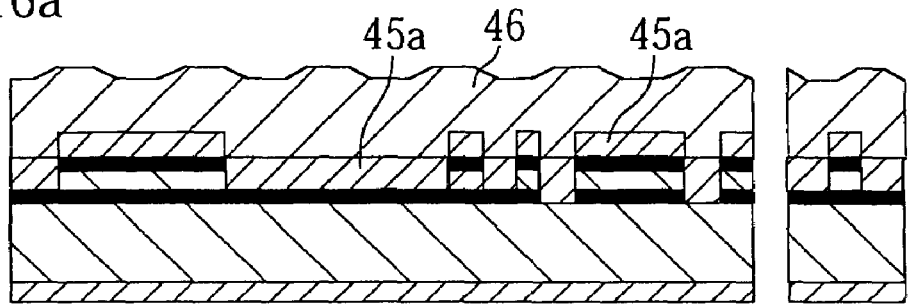
FIGS. 16a–16d show the steps following the steps shown in FIGS. 15a–15d.

Next, as shown in FIG. 16a, a polysilicon layer 46 is formed over the polysilicon layer 45a by epitaxial growth. In this embodiment, the polysilicon layer 46 is rendered conductive by doping the polysilicon with phosphorus during epitaxial growth, and has a thickness of approximately 130 µm from the surface of the polysilicon layer 45a. In this step, relatively large bumps are formed on the surface of the polysilicon layer 46.

Figure 16B:
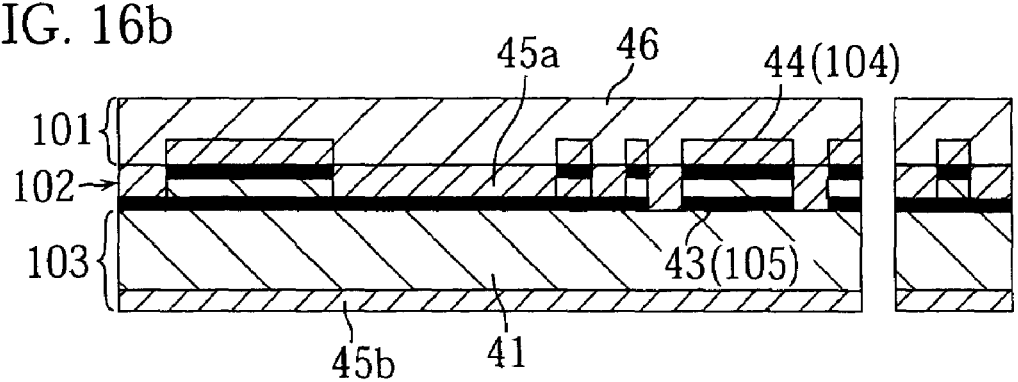

Next, as shown in FIG. 16b, the surface of the polysilicon layer 46 is ground down, which is followed by mirror polishing. As a result, the combined thickness of the polysilicon layer 45a and the polysilicon layer 46 on the oxide film pattern 44 is adjusted to 50 µm.

This procedure forms a material substrate having a laminated structure comprising a first conductor layer 101 composed of the polysilicon layer 45a and the polysilicon layer 46, a second conductor layer 102 composed of the silicon layer 42 and the polysilicon layer 45a, a third conductor layer 103 composed of the silicon layer 41 and the polysilicon layer 45b, an oxide film pattern 44 (first insulating layer 104) interposed between the first conductor layer and the second conductor layer, and an oxide film 43 (second insulating layer 105) interposed between the second conductor layer and the third conductor layer.

Figure 16C:
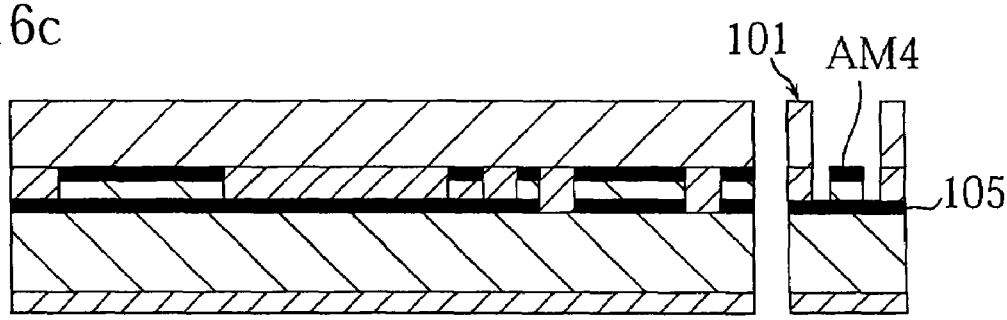

Next, as shown in FIG. 16c, the alignment mark AM4 is exposed. Specifically, etching is performed by DRIE from the side of the first conductor layer 101, using a specific resist pattern as a mask, until the second insulating layer 105 is reached. For the sake of simplicity in the drawings, the polysilicon layer 45a incorporated into the polysilicon layer 46 is not shown in FIG. 16c and subsequent drawings.

Figure 16D:
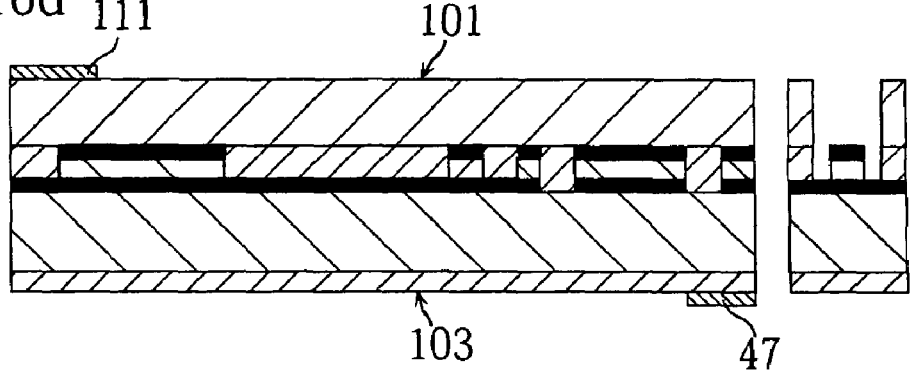

Next, as shown in FIG. 16d, the mirror surface 111 is formed over the first conductor layer 101, and wiring 47 (not shown in FIGS. 1 and 2) is formed over the third conductor layer 103. More specifically, this is substantially the same as what was described through reference to FIG. 4d in the first embodiment.

Figure 17A:
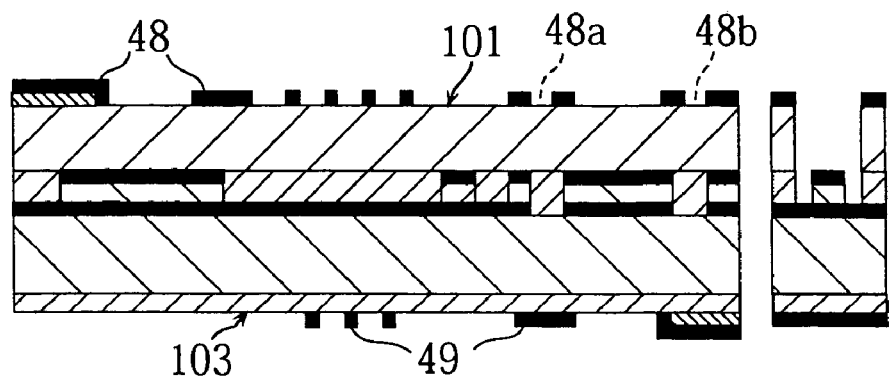
FIGS. 17a–17d show the steps following the steps shown in FIGS. 16a–16d.

Next, as shown in FIG. 17a, an oxide film pattern 48 is formed on the first conductor layer 101, and an oxide film pattern 49 is formed on the third conductor layer 103. The oxide film pattern 48 serves to mask the places on the first conductor layer 101 to be worked into the mirror component M, the inner frame F1, the comb electrode E1, the inner frame F2, and the outer frame F3 in the step shown in FIG. 17b. The oxide film pattern 48 has openings 48a and 48b at locations corresponding to the places to be worked into the inner frame F2 and the outer frame F3, respectively. The oxide film pattern 49 serves to mask the places on the third conductor layer 103 to be worked into the comb electrode E2, the inner frame F2, and the outer frame F3 in the step shown in FIG. 17c.

Figure 17B:
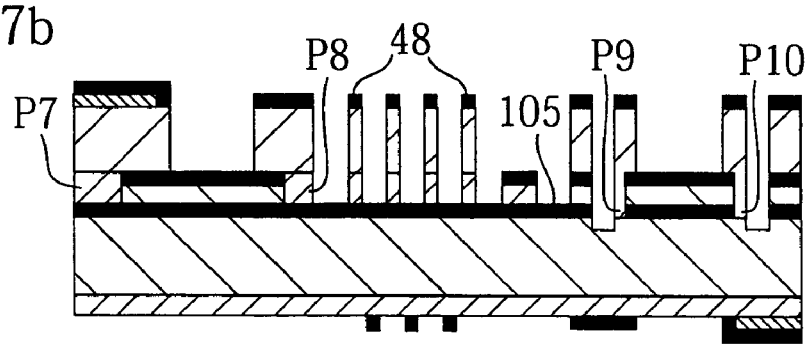

Next, as shown in FIG. 17b, etching is performed by DRIE from the side of the first conductor layer 101, using the oxide film pattern 48 as a mask, until several microns of the third conductor layer 103 have been removed. This forms part of the mirror component M, the torsion bar T1, part of the inner frame F1, the comb electrode E1, the torsion bar T2, part of the inner frame F2, and part of the outer frame F3. Plugs P7 and P8 are formed as communicating conductors in the mirror component M and the inner frame F1, respectively, at this time. Along with this, plugs P9 and P10 are formed as communicating conductors in the inner frame F2 and the outer frame F3, respectively.

Figure 17C:
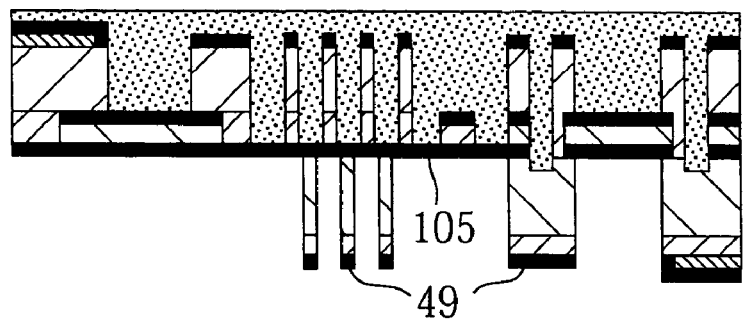

Next, as shown in FIG. 17c, a sacrificial layer 20 is formed above the second insulating layer 105, after which the third conductor layer 103 is etched by DRIE, using the resist pattern 49 as a mask, until the second insulating layer 105 is reached. This forms part of the mirror component M, part of the inner frame F1, the comb electrode E2, part of the inner frame F2, and part of the outer frame F3.

Figure 17D:
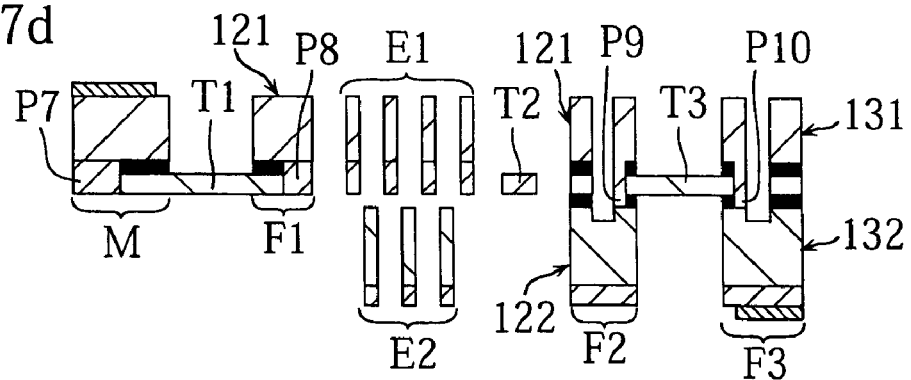

Next, the sacrificial layer 20 is removed in the same manner as described above through reference to FIG. 6b in the first embodiment, after which, as shown in FIG. 17d, the exposed first insulating layer 104, second insulating layer 105, and oxide film patterns 48 and 49 are etched away by immersing the element in an etchant.

The above series of steps forms the mirror component M, the torsion bar T1, the inner frame F1, the comb electrodes E1 and E2, the torsion bar T2, the inner frame F2, the torsion bar T3, and the outer frame F3. Specifically, the micromirror element X1 shown in FIGS. 1 and 2 is manufactured.

In this embodiment, in the SOI substrate 40 used in the step shown in FIG. 15a, the silicon layer 42, that is, the second conductor layer 102, can be formed to a high degree of precision in thickness by employing thin-film formation technology. Therefore, this embodiment allows the torsion bars 141 and 151 to be formed to a high degree of thickness precision from the second conductor layer 102, whose thickness is pre-defined to a high degree of precision, between the insulating layers 104 and 105.

The mirror component M formed in this embodiment has a portion originating in the first conductor layer 101 and a portion that originates in the second conductor layer 102 and leads to the torsion bar T1, and these two portions are electrically connected via the plug P7. The inner frame F1 has a portion originating in the first conductor layer 101, namely, the upper layer component 121, and a portion that originates in the second conductor layer 102 and leads to the torsion bar T1, and these two portions are electrically connected via the plug P8. Therefore, the mirror component M (mirror component 110) is electrically connected to the upper layer component 121 of the inner frame F1 (inner frame 120) via the torsion bar T1 (torsion bar 141).

The inner frame F2 has a portion that originates in the second conductor layer 102 and leads to the torsion bar T3, and a portion that originates in the 103, namely, the lower layer components 122, and these two portions are electrically connected via the plug P9. The outer frame F3 has a portion that originates in the second conductor layer 102 and leads to the torsion bar T3, and a portion that originates in the third conductor layer 103, namely, the lower layer component 132, and these two portions are electrically connected via the plug P10. Therefore, the lower layer components 122 of the inner frame F2 (inner frame 120) are electrically connected to the lower layer component 132 of the outer frame F3 (outer frame 130) by the torsion bar T3 (torsion bar 151). Variations on the electrical connection mode between the inner frame F2 and the outer frame F3 formed in this embodiment are substantially the same as those discussed above for the first embodiment. Therefore, in the micromirror element X1 manufactured in this embodiment, a plurality of potential transmissions from the outer frame 130 to the inner frame 120 are possible, and the size of the potential applied to each comb electrode can be individually controlled. As a result, the micromirror element X1 manufactured in this embodiment can properly carry out a plurality of operations.

In this embodiment, the comb electrode E2 has the same thickness as the lower layer component 132 of the outer frame F3. Therefore, the etching for forming the comb electrode E2 need not be that deep, and the comb electrode E2 can be formed to greater precision in thickness.

FIGS. 18a to 21d illustrate a series of steps in a microstructure manufacturing method according to a fifth embodiment of the present invention. This method is another way to manufacture the above-mentioned micromirror element X1 by micromachining. In FIGS. 18a to 21d, just as in FIGS. 3a to 6c, the steps of forming the mirror component M, the torsion bar T1, the inner frame F1, the set of comb electrodes E1 and E2, the torsion bar T2, the inner frame F2, the torsion bar T3, and the outer frame F3 are depicted by a single modeled cross section. In FIGS. 18a to 21a, a cross section of the alignment mark formation site near the end of the wafer is shown along with this modeled cross section.

Figure 18A:
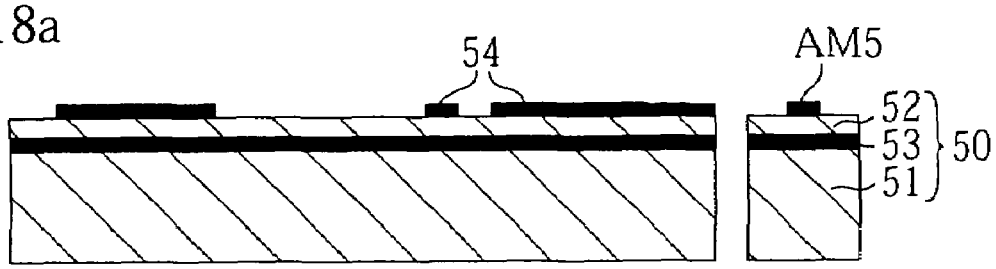
FIGS. 18a–18d show some of the steps involved in a micromirror element manufacturing method according to a fifth embodiment of the present invention.

In this embodiment, first, as shown in FIG. 18a, an oxide film pattern 54 is formed on an SOI substrate 50. The SOI substrate 50 has a laminated structure composed of a relatively thick silicon layer 51, a relatively thin silicon layer 52, and an oxide film 53 sandwiched therebetween. The silicon layers 51 and 52 are composed of silicon that has been rendered conductive by being doped with phosphorus or antimony. The oxide film 53 is composed of silicon oxide.

The SOI substrate 50 is produced in the same manner as the SOI substrate 40 in the fourth embodiment. In this embodiment, the thickness of the silicon layer 52 is 5 µm and the thickness of the oxide film 53 is 1 µm, for example.

The oxide film pattern 54 is formed by growing an oxide film composed of silicon oxide on the silicon layer 52 by thermal oxidation, and then patterning this film. The oxide film pattern 54 primarily serves to mask the torsion bars T1 to T3 in the step shown in FIGS. 18b and 21b. Also, an alignment mark AM5 is formed on the silicon layer 52 in this step.

Figure 18B:
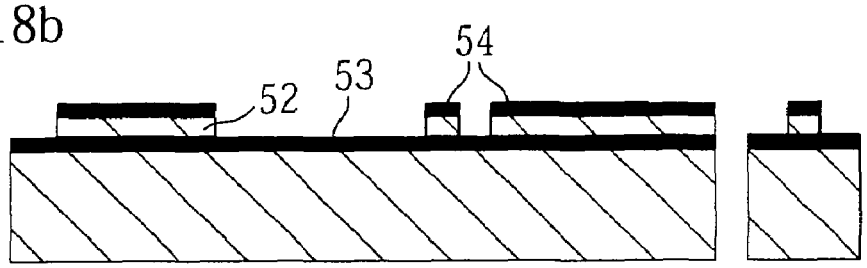
Figure 18C:
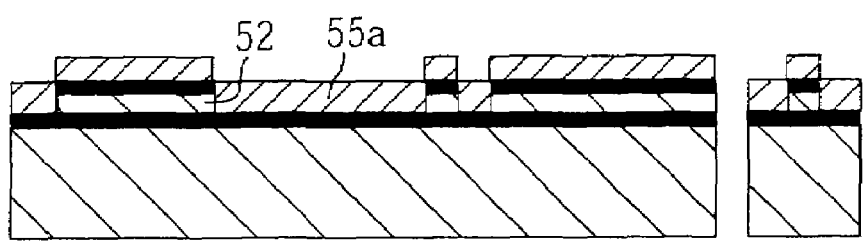

Next, as shown in FIG. 18b, the silicon layer 52 is etched by DRIE, using the oxide film pattern 54 as a mask, until the oxide film 53 is reached. Then, as shown in FIG. 18c, a polysilicon layer 55a is formed by forming a film of polysilicon on the SOI substrate 50 by CVD from above the oxide film pattern 54. The polysilicon layer 55a is rendered conductive by doping the polysilicon with phosphorus during CVD, and has a thickness of approximately 1 µm. In a material substrate that has undergone this procedure, the polysilicon layer 55a and the silicon layer 52 are electrically connected.

Figure 18D:
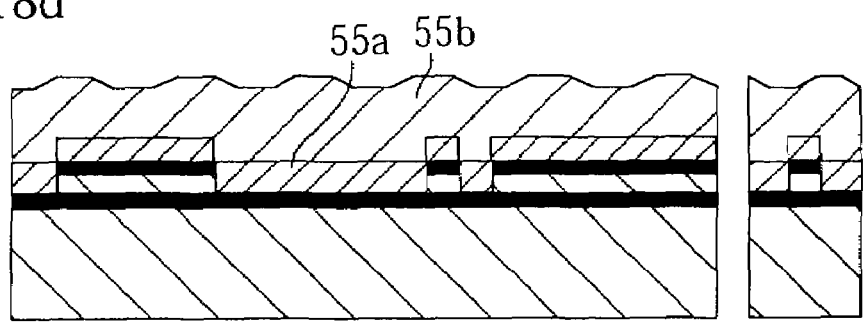

Next, as shown in FIG. 18d, a polysilicon layer 55b is formed over the polysilicon layer 55a by epitaxial growth. In this embodiment, the polysilicon layer 55b is rendered conductive by doping the polysilicon with phosphorus during epitaxial growth, and has a thickness of approximately 130 µm from the surface of the polysilicon layer 55a. In this step, relatively large bumps are formed on the surface of the polysilicon layer 55b.

Figure 19A:
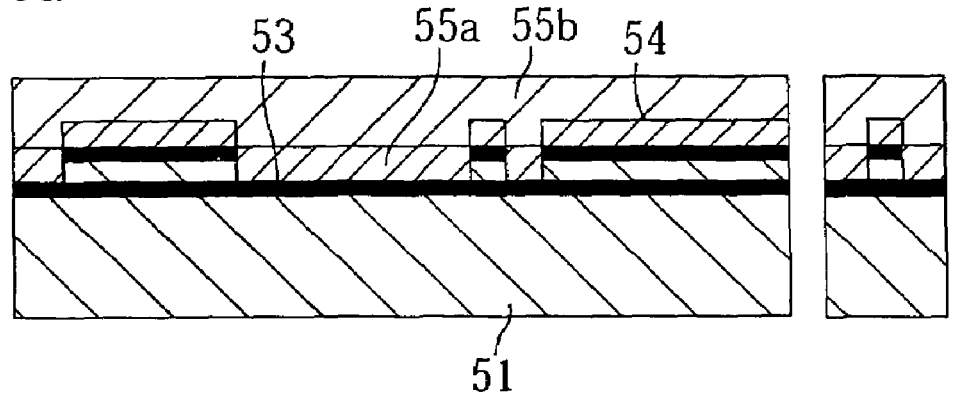
FIGS. 19a–19d show the steps following the steps shown in FIGS. 18a–18d.

Next, as shown in FIG. 19a, the surface of the polysilicon layer 55b is ground down, which is followed by mirror polishing. As a result, the combined thickness of the polysilicon layer 55a and the polysilicon layer 55b on the oxide film pattern 54 is adjusted to 50 µm.

Figure 19B:
Figure 19C:
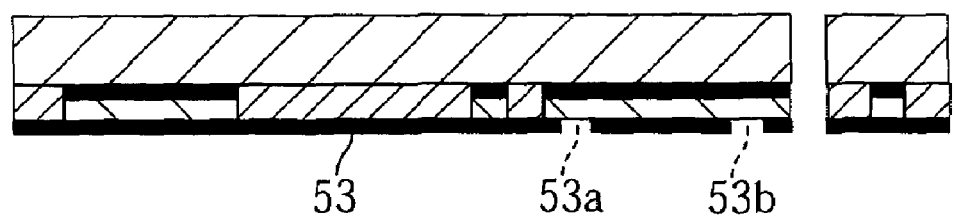
Figure 19D:
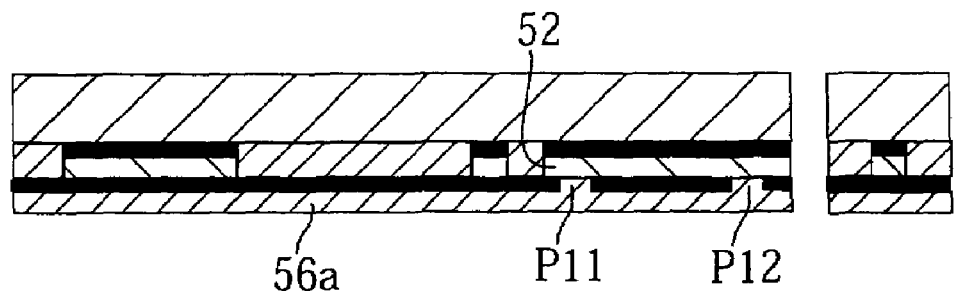

Next, as shown in FIG. 19b, the silicon layer 51 of the SOI substrate 50 is removed by polishing. For the sake of simplicity in the drawings, the polysilicon layer 55a incorporated into the polysilicon layer 55b is not shown in FIG. 19b and subsequent drawings. Then, as shown in FIG. 19c, openings 53a and 53b used for communicating conductors are made by etching in the oxide film 53, using a specific mask. Then, a film of polysilicon is formed on the oxide film 53 by CVD, which forms a polysilicon layer 56a as shown in FIG. 19d. The openings 53a and 53b in the oxide film 53 are filled in by the polysilicon at this time, which forms plugs P11 and P12 as communicating conductors. The polysilicon layer 56a and the plugs P11 and P12 are rendered conductive by doping the polysilicon with phosphorus during CVD, and the polysilicon layer 56a has a thickness of approximately 1 µm. In a material substrate that has undergone this procedure, the polysilicon layer 56a and the silicon layer 52 are electrically connected.

Figure 20A:
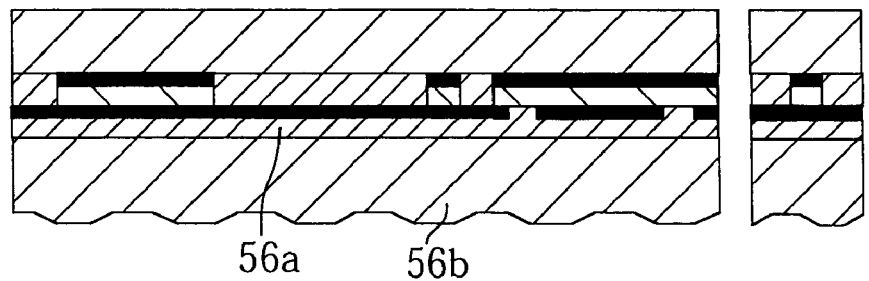
FIGS. 20a–20d show the steps following the steps shown in FIGS. 19a–19d.

Next, as shown in FIG. 20a, a polysilicon layer 56b is formed over the polysilicon layer 56a by epitaxial growth. In this embodiment, the polysilicon layer 56b is rendered conductive by doping the polysilicon with phosphorus during epitaxial growth, and has a thickness of approximately 130 µm from the surface of the polysilicon layer 56a. In this step, relatively large bumps are formed on the surface of the polysilicon layer 56b.

Figure 20B:
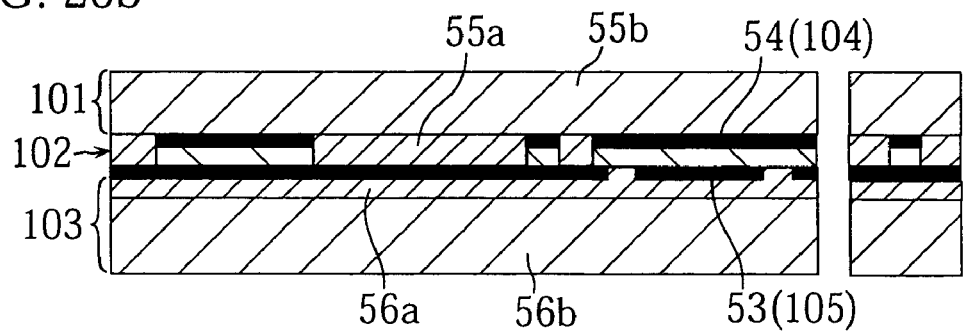

Next, as shown in FIG. 20b, the surface of the polysilicon layer 56b is ground down, which is followed by mirror polishing. As a result, the combined thickness of the polysilicon layer 56a and the polysilicon layer 56b on the oxide film 53 is adjusted to 50 µm.

This procedure forms a material substrate having a laminated structure comprising a first conductor layer 101 composed of the polysilicon layer 55a and the polysilicon layer 55b, a second conductor layer 102 composed of the silicon layer 52 and the polysilicon layer 55a, a third conductor layer 103 composed of the polysilicon layer 56a and the polysilicon layer 56b, an oxide film pattern 54 (first insulating layer 104) interposed between the first conductor layer and the second conductor layer, and an oxide film 53 (second insulating layer 105) interposed between the second conductor layer and the third conductor layer.

Figure 20C:
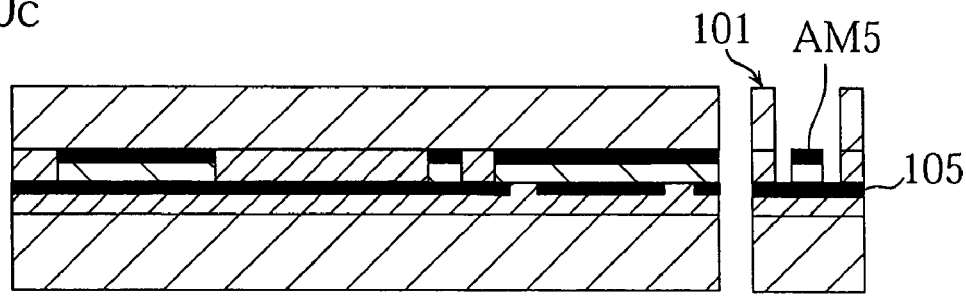
Figure 20D:
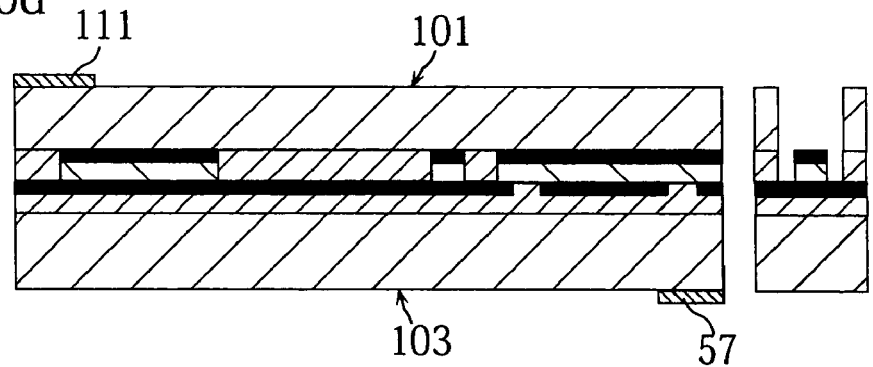

Next, as shown in FIG. 20c, the alignment mark AM5 is exposed. Specifically, etching is performed by DRIE from the side of the first conductor layer 101, using a specific resist pattern as a mask, until the second insulating layer 105 is reached. Next, as shown in FIG. 20d, the mirror surface 111 is formed over the first conductor layer 101, and wiring 57 (not shown in FIGS. 1 and 2) is formed over the third conductor layer 103. More specifically, this is substantially the same as what was described through reference to FIG. 4d in the first embodiment.

Figure 21A:
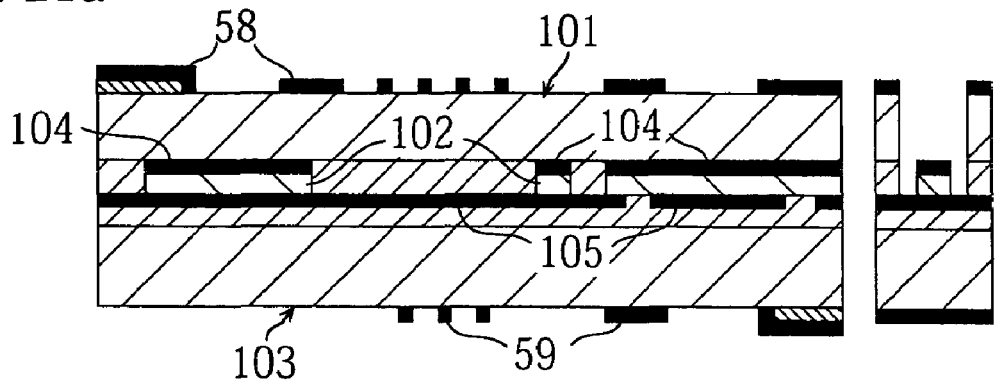
FIGS. 21a–21d show the steps following the steps shown in FIGS. 20a–20d.

Next, as shown in FIG. 21a, an oxide film pattern 58 is formed on the first conductor layer 101, and an oxide film pattern 59 is formed on the third conductor layer 103. The oxide film pattern 58 serves to mask the places on the first conductor layer 101 and the second conductor layer 102 to be worked into the mirror component M, the inner frame F1, the comb electrode E1, the inner frame F2, and the outer frame F3 in the step shown in FIG. 21b. The oxide film pattern 59 serves to mask the places on the third conductor layer 103 to be worked into the comb electrode E2, the inner frame F2, and the outer frame F3 in the step shown in FIG. 21c.

Figure 21B:
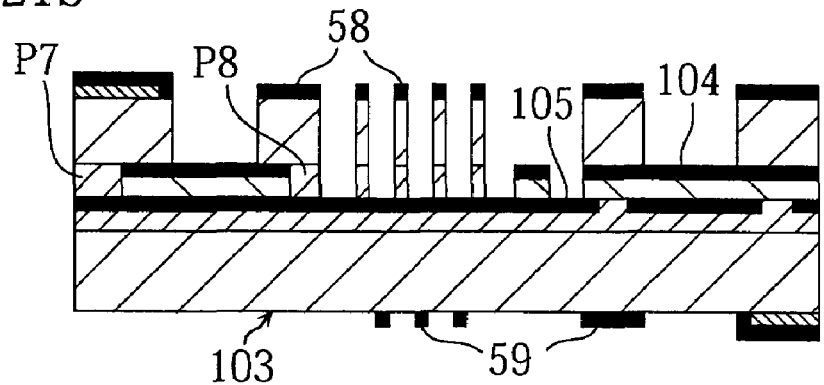

Next, as shown in FIG. 21b, etching is performed by DRIE from the side of the first conductor layer 101, using the oxide film pattern 58 as a mask, until the second insulating layer 105 is reached. This forms part of the mirror component M, the torsion bar T1, part of the inner frame F1, the comb electrode E1, the torsion bar T2, part of the inner frame F2, and part of the outer frame F3. Plugs P7 and P8 are formed as communicating conductors in the mirror component M and the inner frame F1, respectively, at this time.

Figure 21C:
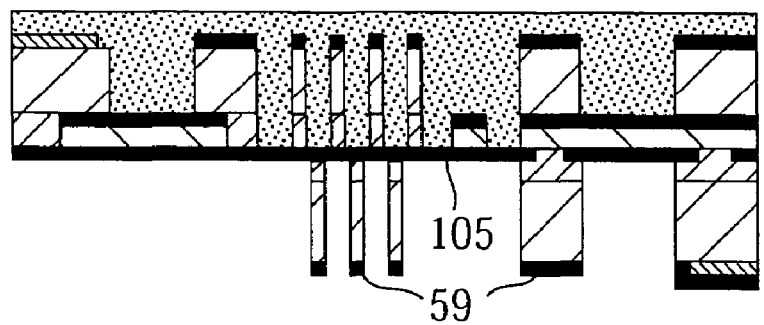

Next, as shown in FIG. 21c, a sacrificial layer 20 is formed above the second insulating layer 105, after which the third conductor layer 103 is etched by DRIE, using the resist pattern 59 as a mask, until the second insulating layer 105 is reached. This forms part of the mirror component M, part of the inner frame F1, the comb electrode E2, part of the inner frame F2, and part of the outer frame F3.

Figure 21D:
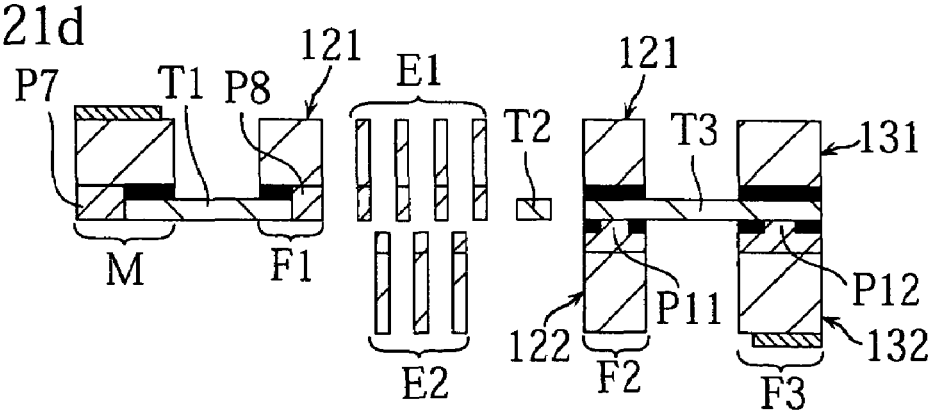

Next, the sacrificial layer 20 is removed in the same manner as described above through reference to FIG. 6b in the first embodiment, after which, as shown in FIG. 21d, the exposed first insulating layer 104, second insulating layer 105, and oxide film patterns 58 and 59 are etched away by immersing the element in an etchant.

The above series of steps forms the mirror component M, the torsion bar T1, the inner frame F1, the comb electrodes E1 and E2, the torsion bar T2, the inner frame F2, the torsion bar T3, and the outer frame F3. Specifically, the micromirror element X1 shown in FIGS. 1 and 2 is manufactured.

In this embodiment, in the SOI substrate 50 used in the step shown in FIG. 18a, the silicon layer 52, that is, the second conductor layer 102, can be formed to a high degree of precision in thickness by employing thin-film formation technology. Therefore, this embodiment allows the torsion bars 141 and 151 to be formed to a high degree of thickness precision from the second conductor layer 102, whose thickness is pre-defined to a high degree of precision, between the insulating layers 104 and 105.

The electrical connection modes between the mirror component M and the inner frame F2 formed in this embodiment are the same as those discussed above for the third embodiment. Also, the inner frame F2 has a portion that originates in the second conductor layer 102 and leads to the torsion bar T3, and a portion that originates in the third conductor layer 103, namely, the lower layer components 122, and these two portions are electrically connected via the plug P11. The outer frame F3 has a portion that originates in the second conductor layer 102 and leads to the torsion bar T3, and a portion that originates in the third conductor layer 103, namely, the lower layer component 132, and these two portions are electrically connected via the plug P12. Therefore, the lower layer components 122 of the inner frame F2 (inner frame 120) are electrically connected to the lower layer component 132 of the outer frame F3 (outer frame 130) by the torsion bar T3 (torsion bar 151). Variations on the electrical connection mode between the inner frame F2 and the outer frame F3 formed in this embodiment are substantially the same as those discussed above for the first embodiment. Therefore, in the micromirror element X1 manufactured in this embodiment, a plurality of potential transmissions from the outer frame 130 to the inner frame 120 are possible, and the size of the potential applied to each comb electrode can be individually controlled. As a result, the micromirror element X1 manufactured in this embodiment can properly carry out a plurality of operations.

In this embodiment, the comb electrode E2 has the same thickness as the lower layer component 132 of the outer frame F3. Therefore, the etching for forming the comb electrode E2 need not be that deep, and the comb electrode E2 can be formed to greater precision in thickness.

FIGS. 22a to 23c illustrate some of the steps in a microstructure manufacturing method according to a sixth embodiment of the present invention. This method is another way to manufacture the above-mentioned micromirror element X1 by micromachining. In FIGS. 22a to 23c, just as in FIGS. 3a to 6c, the steps of forming the mirror component M, the torsion bar T1, the inner frame F1, the set of comb electrodes E1 and E2, the torsion bar T2, the inner frame F2, the torsion bar T3, and the outer frame F3 are depicted by a single modeled cross section. In FIGS. 22a to 23c, a cross section of the alignment mark formation site near the end of the wafer is shown along with this modeled cross section.

Figure 22A:
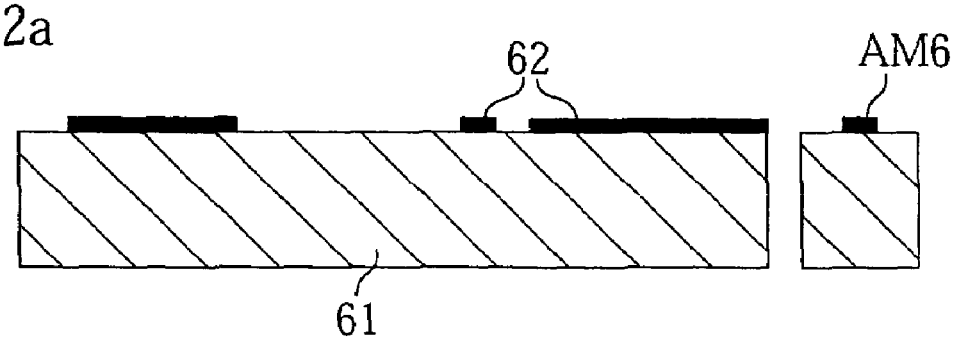
FIGS. 22a–22d show some of the steps involved in a micromirror element manufacturing method according to a sixth embodiment of the present invention.

In this embodiment, first, as shown in FIG. 22a, an oxide film pattern 62 is formed on silicon substrate 61. The silicon substrate 61 is a wafer composed of silicon that has been rendered conductive by being doped with phosphorus or antimony. The oxide film pattern 62 is formed by patterning a silicon oxide film formed on the silicon substrate 61 by thermal oxidation. In this embodiment, the thickness of the silicon substrate 61 is 150 µm and the thickness of the oxide film pattern 62 is 1 µm, for example. The oxide film pattern 62 primarily serves to mask the torsion bars T1 to T3 in the same manner as the oxide film pattern 54 in the fifth embodiment. An alignment mark AM6 is formed on the silicon substrate 61 in this step.

Figure 22B:
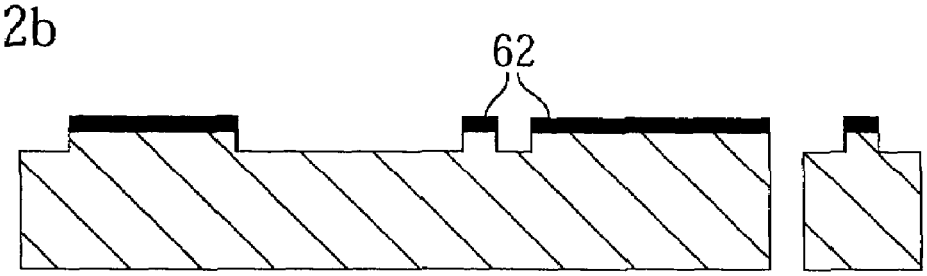

Next, as shown in FIG. 22b, the silicon substrate 61 is etched by DRIE, using the oxide film pattern 62 as a mask, to a depth corresponding to the thickness of the torsion bars T.

Figure 22C:
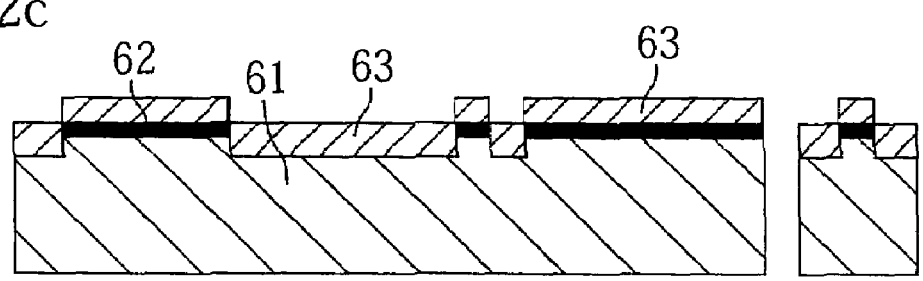

Next, as shown in FIG. 22c, a polysilicon layer 63 is formed by forming a film of polysilicon on the silicon substrate 61 from above the oxide film pattern 62. The polysilicon layer 63 is rendered conductive by doping the polysilicon with phosphorus during CVD, and has a thickness of 1 μm, for example. In a material substrate that has undergone this procedure, the polysilicon layer 63 is electrically connected with the silicon substrate 61.

Figure 22D:
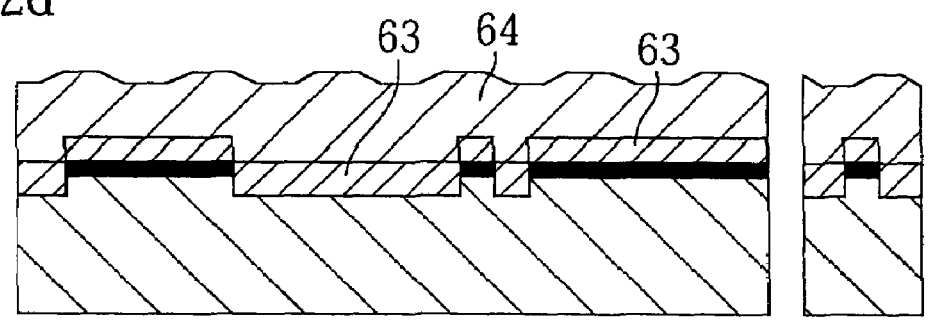

Next, as shown in FIG. 22*d*, a polysilicon layer 64 is formed over the polysilicon layer 63 by epitaxial growth. In this embodiment, the polysilicon layer 64 is rendered conductive by doping the polysilicon with phosphorus during epitaxial growth, and has a thickness of approximately 130 μm from the surface of the polysilicon layer 63. In this step, relatively large bumps are formed on the surface of the polysilicon layer 64.

Figure 23A:
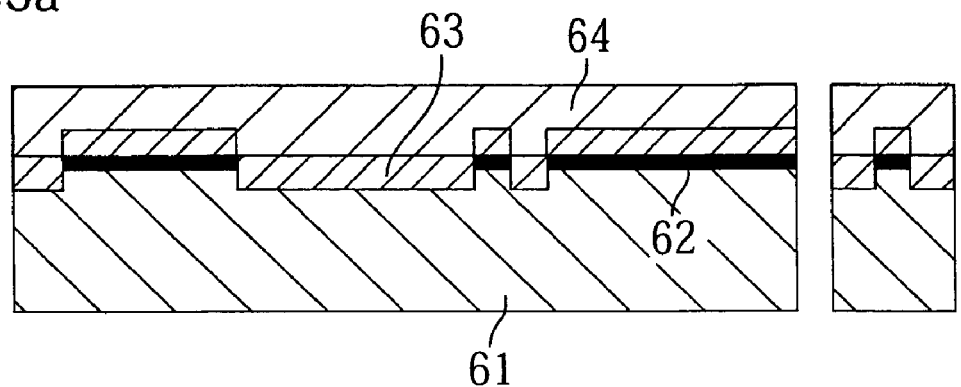
FIGS. 23a–23c show the steps following the steps shown in FIGS. 22a–22d.

Next, as shown in FIG. 23*a*, the surface of the polysilicon layer 64 is ground down, which is followed by mirror polishing. As a result, the combined thickness of the polysilicon layer 63 and the polysilicon layer 64 on the oxide film pattern 62 is adjusted to 50 μm.

Figure 23B:
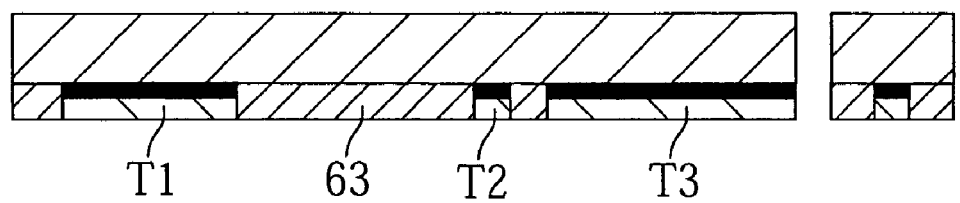

Next, as shown in FIG. 23*b*, the silicon substrate 61 is polished. Specifically, the silicon substrate 61 is polished until the polysilicon layer 63 appears, and until the torsion bars T1 to T3 appear. For the sake of simplicity in the drawings, the polysilicon layer 63 incorporated into the polysilicon layer 64 is not shown in FIG. 23*b* and subsequent drawings.

Figure 23C:
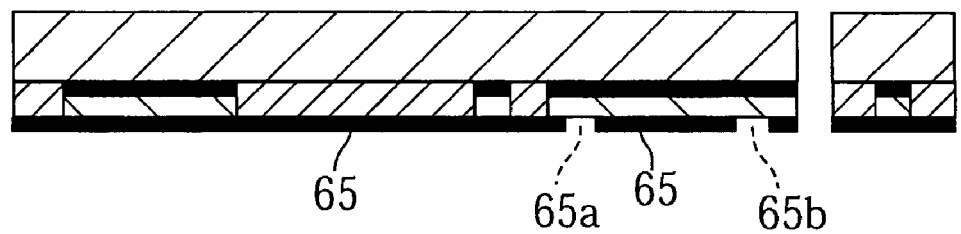

Next, as shown in FIG. 23*c*, an oxide film pattern 65 is formed on the polished surface. Specifically, an oxide film composed of silicon oxide is formed on this polished surface, after which this film is patterned to form the oxide film pattern 65. The oxide film pattern 65 has openings 65*a* and 65*b* used as communicating conductors.

The subsequent steps are the same as the steps described above through reference to FIGS. 19*d* to 21*d* in the fifth embodiment. Therefore, a micromirror element X1 having the same internal layer structure as that manufactured in the fifth embodiment can be manufactured with this embodiment.

FIGS. 24*a* to 28*d* illustrate some of the steps in a microstructure manufacturing method according to a seventh embodiment of the present invention. This method is another way to manufacture the above-mentioned micromirror element X1 by micromachining. In FIGS. 24*a* to 28*d*, the steps of forming the mirror component M, the torsion bar T1, the inner frame F1, the set of comb electrodes E1 and E2, the torsion bar T2, the torsion bar T3, the inner frame F2, the torsion bar T4 and the outer frame F3 are depicted by a single modeled cross section. Unlike in the first to sixth embodiments given above, the torsion bar T2 corresponds to the torsion bar 141 of the micromirror element X1, and is depicted by across section perpendicular to its direction of extension. The torsion bar T3 corresponds to the torsion bar 151, and is depicted by a cross section perpendicular to its direction of extension. The torsion bar T4 also corresponds to the torsion bar 151, and is depicted by a cross section along its direction of extension. In FIGS. 25*a* to 27*a*, a cross section of the alignment mark formation site near the end of the wafer is shown along with this modeled cross section.

Figure 24A:
FIGS. 24a–24d show some of the steps involved in a micromirror element manufacturing method according to a seventh embodiment of the present invention.

In this embodiment, first, an SOI substrate 70 is prepared as shown in FIG. 24*a*. The SOI substrate 70 has a laminated structure composed of relatively thick silicon layer 71, a relatively thin silicon layer 72, and an oxide film 73 sandwiched therebetween. The silicon layers 71 and 72 are composed of silicon that has been rendered conductive by being doped with phosphorus or antimony. The oxide film 73 is composed of silicon oxide. The SOI substrate 70 is produced in the same manner as the SOI substrate 40 in the fourth embodiment. In this embodiment, the thickness of the silicon layer 71 is 300 μm, the thickness of the silicon layer 72 is 5 μm, and the thickness of the oxide film 73 is 1 μm, for example.

Figure 24B:
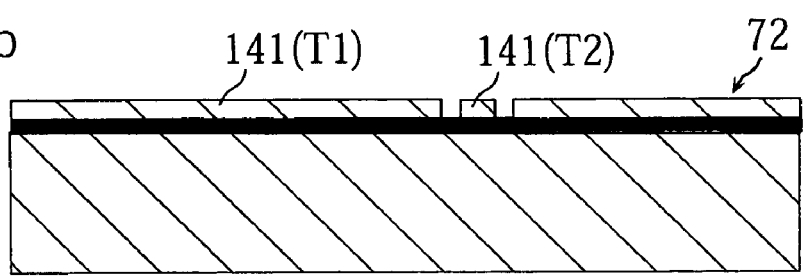

Next, as shown in FIG. 24*b*, the torsion bars 141 (T1, T2) are formed in the silicon layer 72. Specifically, the torsion bars 141 are formed by etching by DRIE, using a specific resist pattern as a mask, until the oxide film 73 is reached.

Figure 24C:
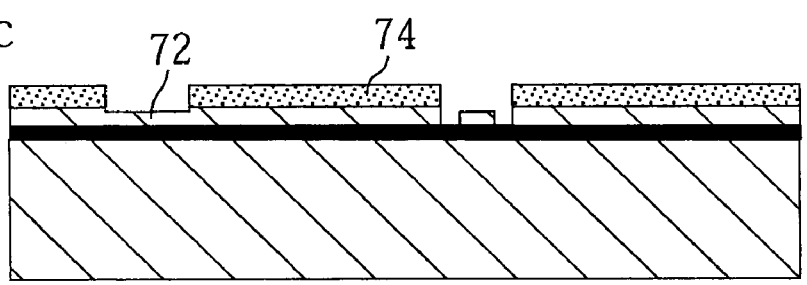

Next, as shown in FIG. 24*c*, a resist pattern 74 is formed, after which a small amount (such as 1 μm) of the torsion bars T1 and T2 is removed by anisotropic etching using a KOH aqueous solution or by DRIE. Specifically, the torsion bars T1 and T2 are made slightly thinner. The resist pattern 74 covers all of the silicon layer 72 except for the torsion bars T1 and T2.

Figure 24D:
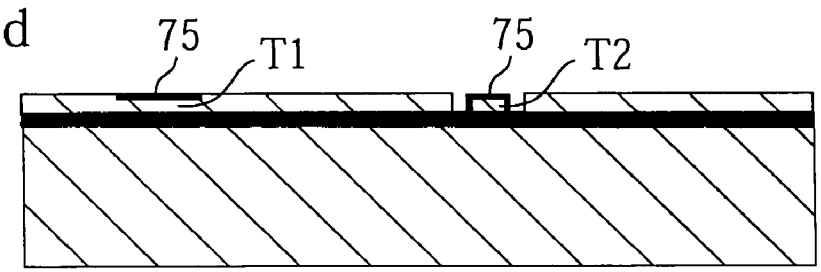

Next, as shown in FIG. 24*d*, the torsion bars T1 and T2 are covered with an oxide film 75 composed of silicon oxide formed by thermal oxidation.

Figure 25A:
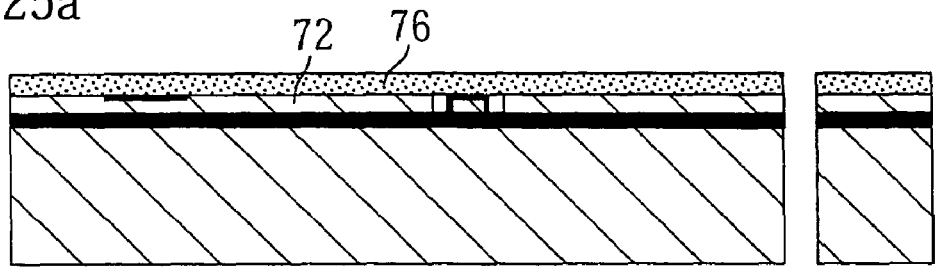
FIGS. 25a–25d show the steps following the steps shown in FIGS. 24a–24d.

Next, as shown in FIG. 25*a*, a resist film 76 is formed over the silicon layer 72. Because the silicon layer 72 is bumpy, it is preferable to use a resist spray (non-contact jet dispenser) in the formation of the resist film 76.

Figure 25B:
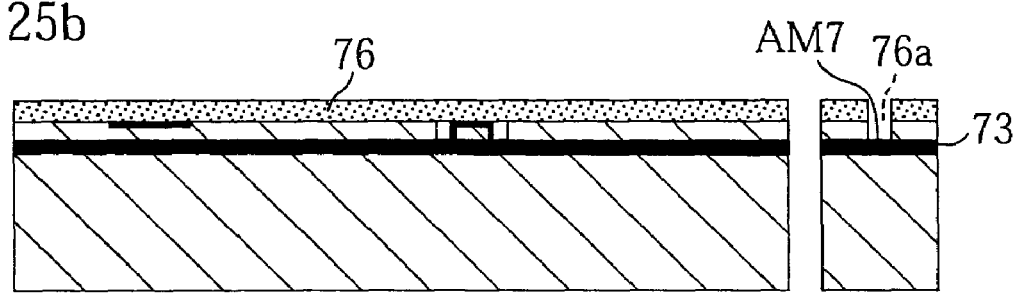

Next, an opening 76*a* used for forming an alignment mark is formed on the resist film 76 while the torsion bars T1 and T2 are accurately positioned, after which an alignment mark AM7 is formed by etching by DRIE, using this resist film 76 as a mask, until the oxide film 73 is reached, as shown in FIG. 25*b*.

Figure 25C:
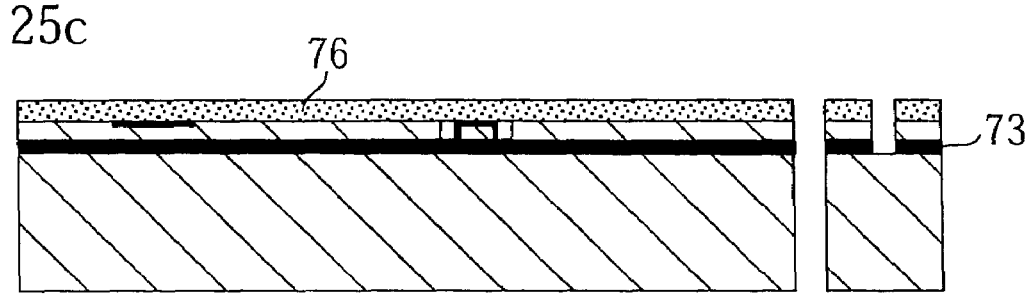
Figure 25D:
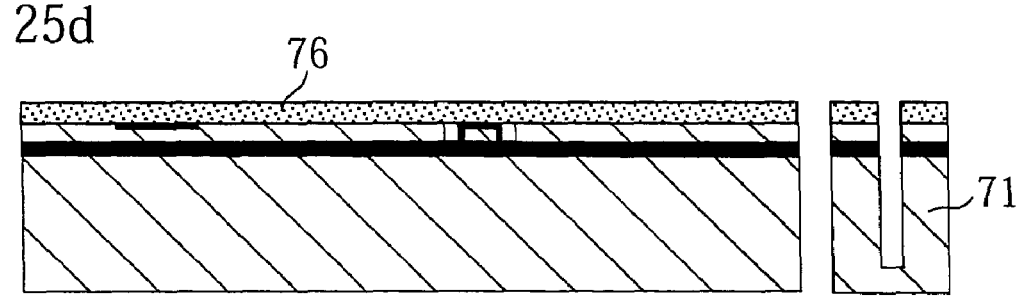

Next, as shown in FIG. 25*c*, BHF is used to remove part of the oxide film 73 exposed in the previous step where the alignment mark is to be formed. Then, as shown in FIG. 25*d*, the silicon layer 71 is further etched by DRIE to a specific depth at the alignment mark formation site.

Figure 26A:
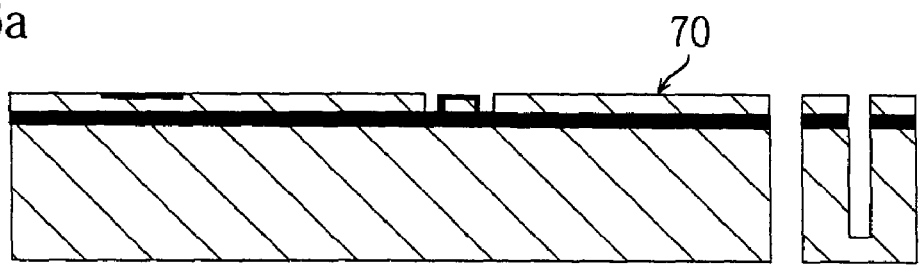
FIGS. 26a–26d show the steps following the steps shown in FIGS. 25a–25d.
Figure 26B:
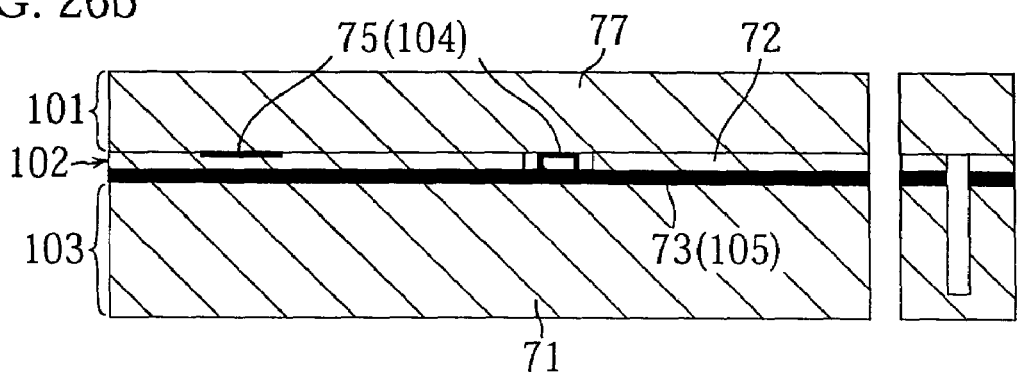

Next, as shown in FIG. 26*a*, the resist film 76 is removed from the SOI substrate 70. Then, as shown in FIG. 26*b*, the silicon substrate 77 is heated and joined to silicon layer 72 side of the SOI substrate 70. The silicon substrate 77 is composed of silicon that has been rendered conductive by being doped with phosphorus or antimony, and has a thickness of 150 μm, for example.

This procedure forms a material substrate having a laminated structure comprising a first conductor layer 101 composed of the silicon substrate 77, a second conductor layer 102 composed of the silicon layer 72, a third conductor layer 103 composed of the silicon layer 71, an oxide film 75 (first insulating layer 104) interposed between the first conductor layer and the second conductor layer, and an oxide film 73 (second insulating layer 105) interposed between the second conductor layer and the third conductor layer.

Figure 26C:
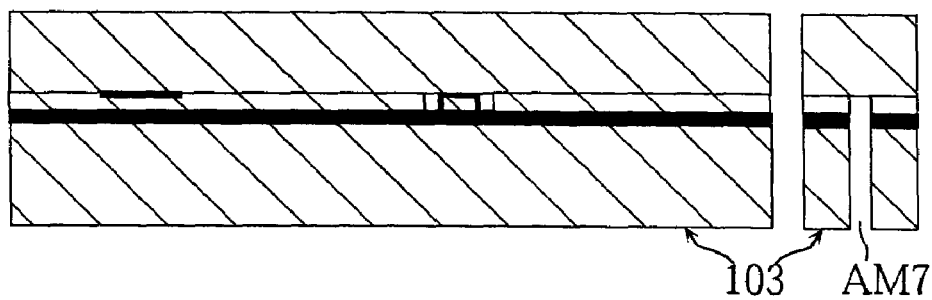

Next, as shown in FIG. 26*c*, the silicon layer 71 is polished down to a specific thickness. The alignment mark AM7 is exposed on the side of the third conductor layer 103 at this time.

Figure 26D:
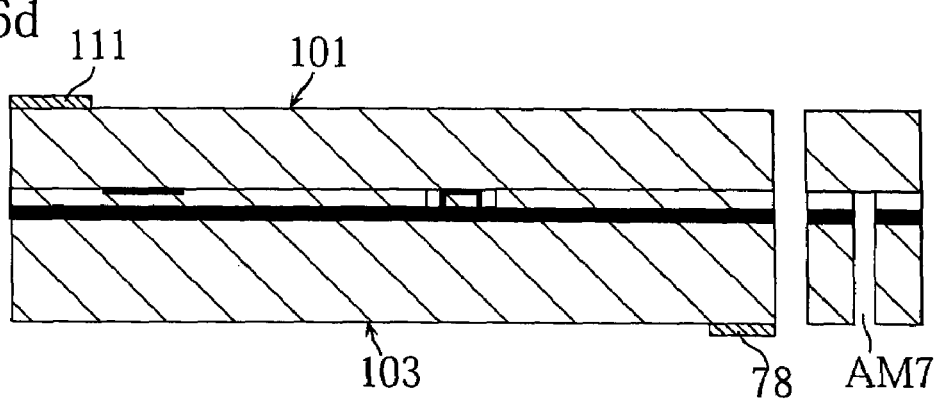

Next, as shown in FIG. 26*d*, the mirror surface 111 is formed over the first conductor layer 101, and wiring 78 is formed over the third conductor layer 103. Specifically, this is the same as described above through reference to FIG. 8*d* in the second embodiment.

Figure 27A:
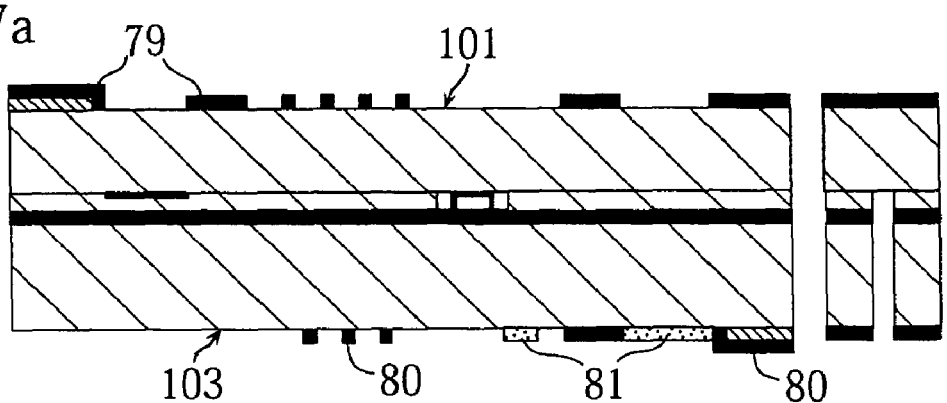
FIGS. 27a–27d show the steps following the steps shown in FIGS. 26a–26d.

Next, as shown in FIG. 27*a*, an oxide film pattern 79 is formed on the first conductor layer 101, and an oxide film pattern 80 and a resist pattern 81 are formed on the third conductor layer 103. The oxide film pattern 79 serves to mask the places on the first conductor layer 101 and the second conductor layer 102 to be worked into the mirror component M, the inner frame F1, the comb electrode E1, the inner frame F2, and the outer frame F3 in the step shown in FIG. 27*b*. The oxide film pattern 80 serves to mask the places on the third conductor layer 103 to be worked into the comb electrode E2, the inner frame F2, and the outer frame F3 in the step shown in FIGS. 27c and 28a. The resist pattern 81 serves to mask the places corresponding to the places to be worked into the torsion bars T3 and T4 in the step shown in FIG. 27c.

Figure 27B:
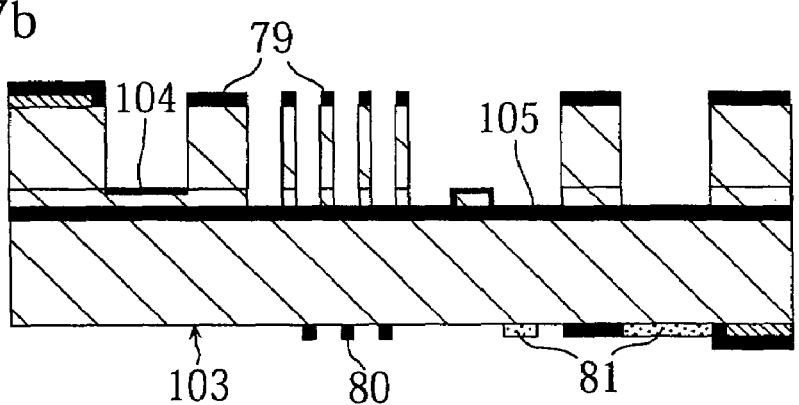

Next, as shown in FIG. 27b, the first conductor layer 101 and the second conductor layer 102 are etched by DRIE, using the oxide film pattern 79 as a mask, until the second insulating layer 105 is reached. This forms part of the mirror component M, the torsion bar T1, part of the inner frame F1, the comb electrode E1, the torsion bar T2, part of the inner frame F2, and part of the outer frame F3.

Figure 27C:
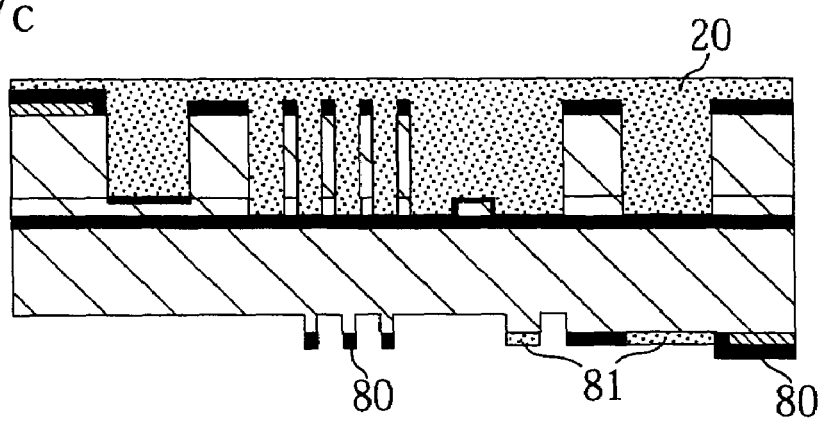
Figure 27D:
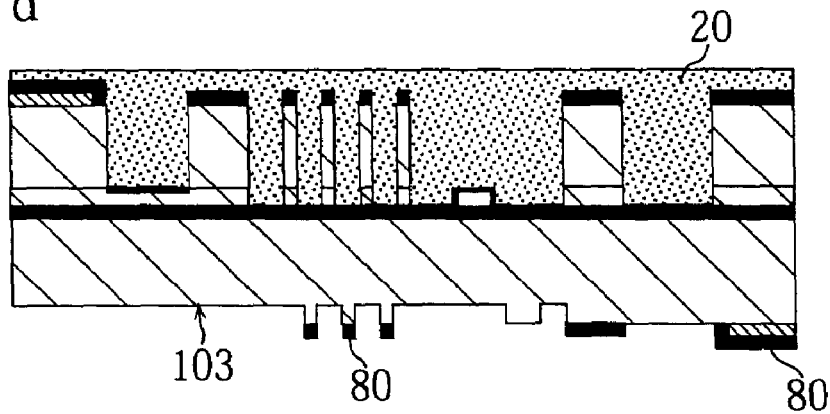

Next, as shown in FIG. 27c, a sacrificial layer 20 is formed above the second insulating layer 105, after which the third conductor layer 103 is etched by DRIE, using the oxide film pattern 80 and the resist pattern 81 as masks, to a depth corresponding to the thickness of the torsion bars T3 and T4. The resist pattern 81 is then removed as shown in FIG. 27d.

Figure 28A:
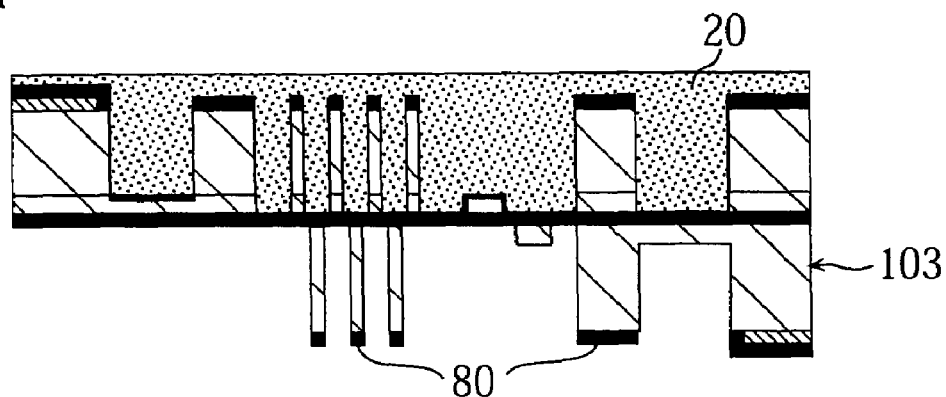
FIGS. 28a–28c show the steps following the steps shown in FIGS. 27a–27d.

Next, as shown in FIG. 28a, the third conductor layer 103 is etched, using the oxide film pattern 80 as a mask, until the second insulating layer 105 is reached. This forms the comb electrode E2, the torsion bar T3, part of the inner frame F2, the torsion bar T4, and part of the outer frame F3.

Figure 28B:
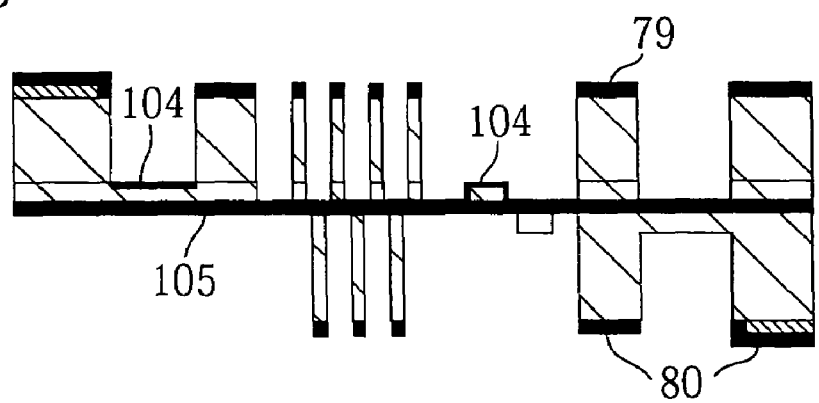
Figure 28C:
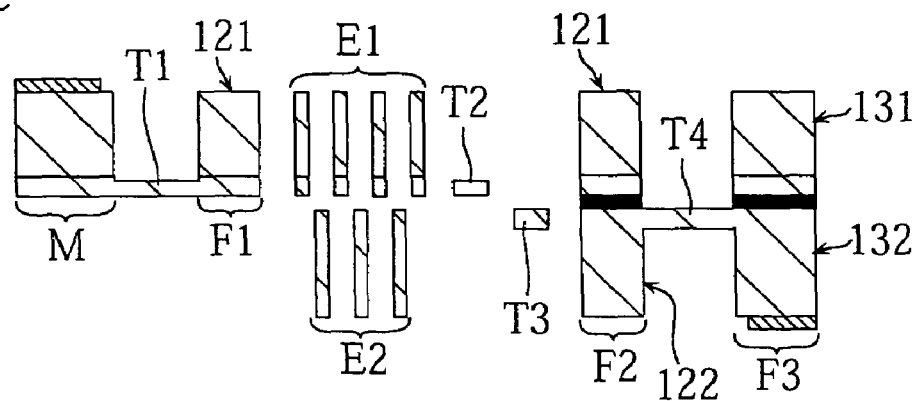
Figure 29:
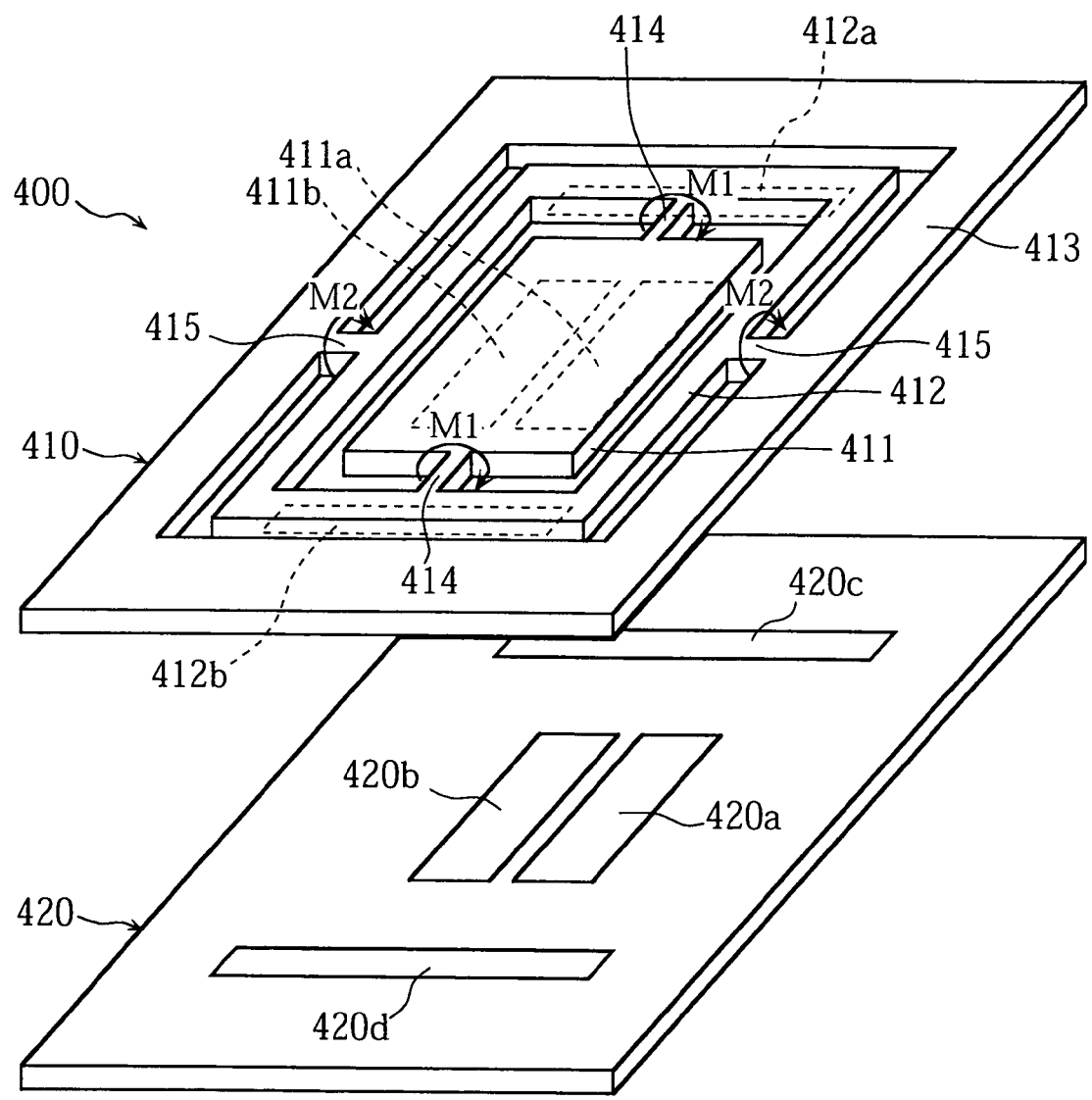
FIG. 29 is an exploded perspective view of a conventional plate-electrode-type micromirror element.
Figure 30:
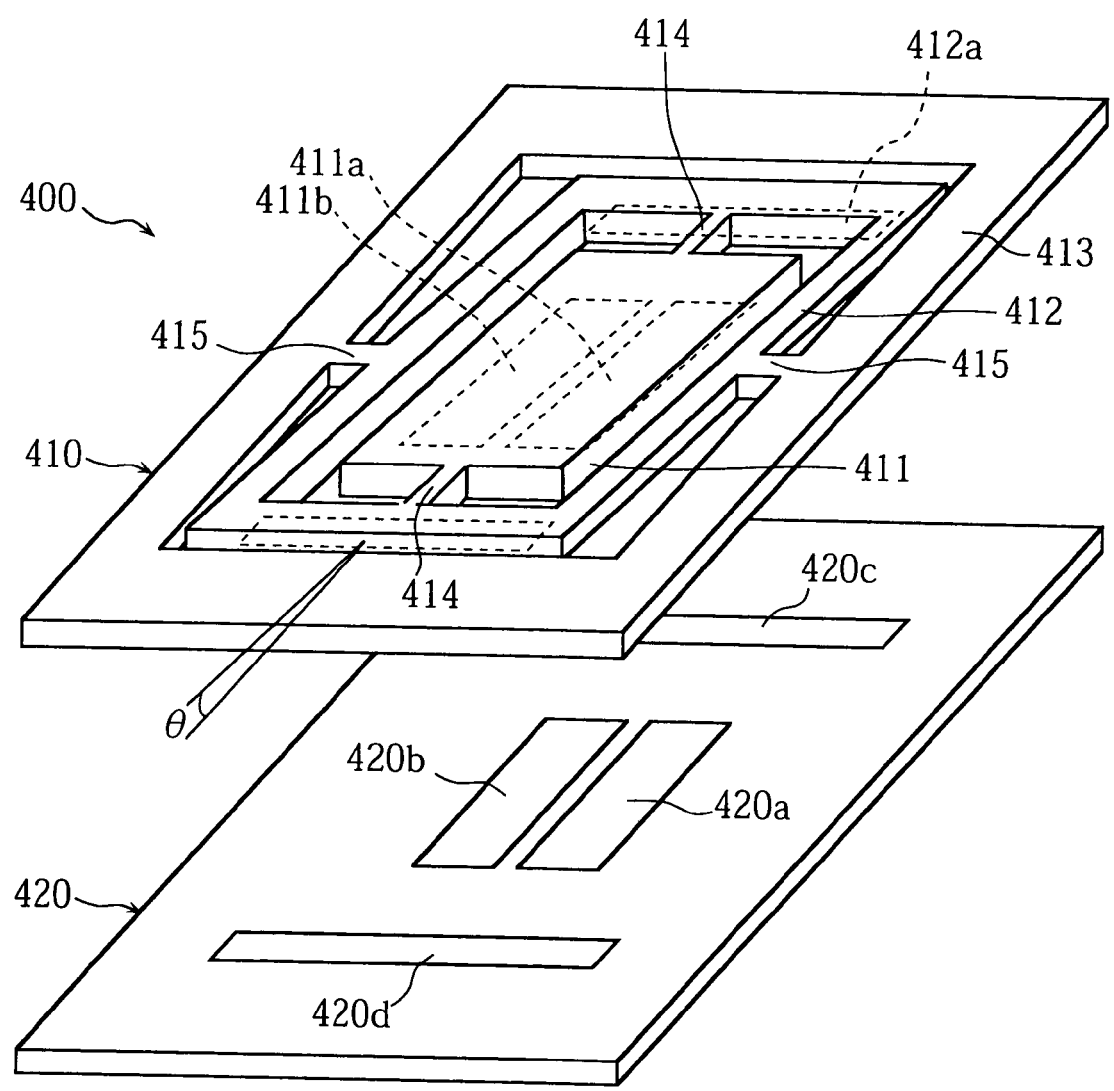
FIG. 30 illustrates an inclination state of the micromirror element shown in FIG. 29.
Figure 31:
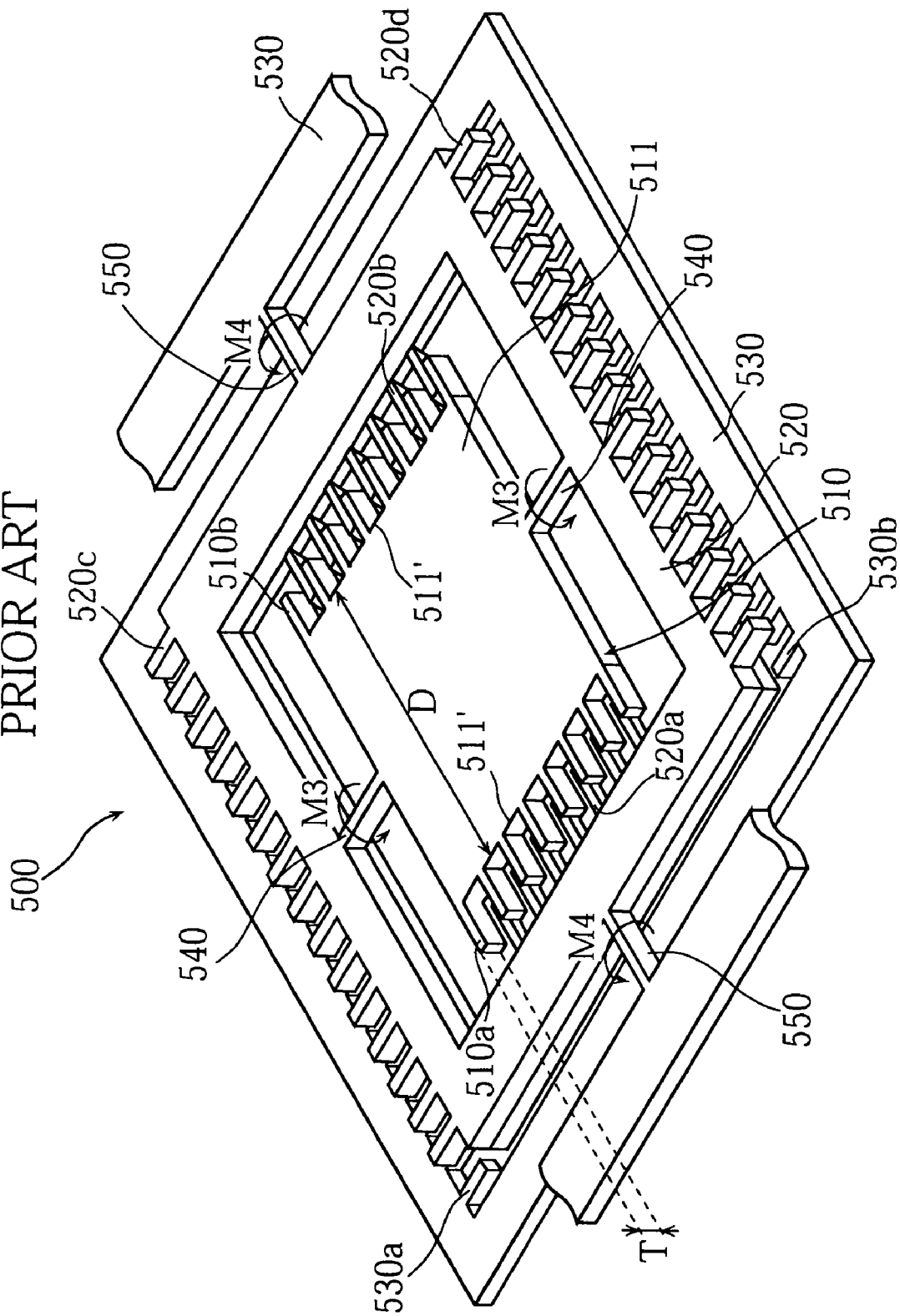
FIG. 31 is a partially cut-away perspective view of a conventional comb-electrode-type micromirror element.
Figure 32A:
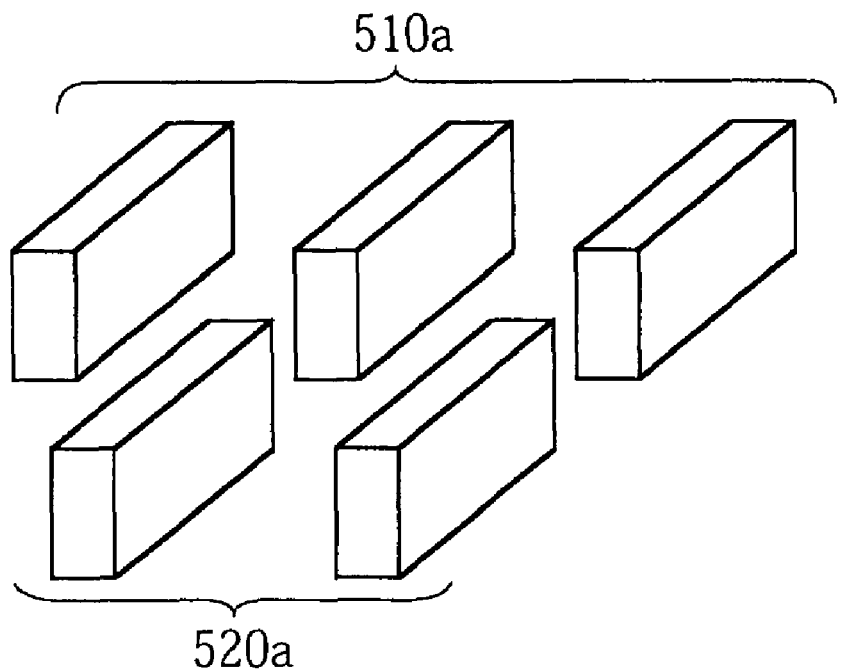
FIG. 32 shows the orientation of a set of comb electrodes.
Figure 32B:
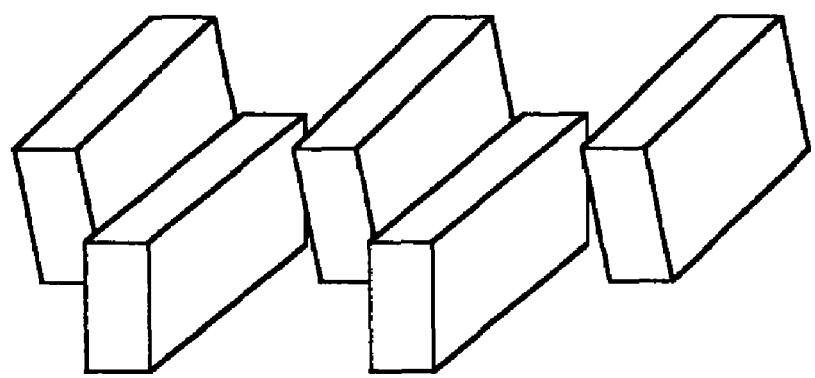

Next, as shown in FIG. 28b, the sacrificial layer 20 is removed in the same manner as described above through reference to FIG. 6b in the first embodiment. Then, as shown in FIG. 28c, the exposed first insulating layer 104, second insulating layer 105, and oxide film patterns 79 and 80 are etched away by immersing the element in an etchant.

The above series of steps forms the mirror component M, the torsion bar T1, the inner frame F1, the comb electrodes E1 and E2, the torsion bar T2, the torsion bar T3, the inner frame F2, the torsion bar T4, and the outer frame F3. Specifically, the micromirror element X1 shown in FIGS. 1 and 2 is manufactured.

In this embodiment, in the SOI substrate 70 used in the step shown in FIG. 24a, the silicon layer 72, that is, the second conductor layer 102, can be formed to a high degree of precision in thickness by employing thin-film formation technology. Therefore, this embodiment allows the torsion bar 141 to be formed to a high degree of thickness precision from the second conductor layer 102, whose thickness is pre-defined to a high degree of precision, between the insulating layers 104 and 105.

The mirror component M (mirror component 110) and the upper layer component 121 of the inner frame F1 (inner frame 120) formed in this embodiment are mechanically and electrically connected by the torsion bar T1 as shown in FIG. 28a. Also, the lower layer components 122 of the inner frame F2 (inner frame 120) and the lower layer component 132 of the outer frame F3 (outer frame 130) are mechanically and electrically connected by the torsion bar T4 as shown in FIG. 28a. In this embodiment, the upper layer component 121 of the inner frame F2 and the upper layer component 131 of the outer frame F3 can be electrically connected by providing another torsion bar, either instead of or together with the torsion bar T4, in between the inner frame F2 and the outer frame F3 by going through the same steps as for the torsion bar T1. When a torsion bar that connects the inner frame F2 and the outer frame F3 is provided, a conduction path in which this torsion bar and the torsion bar T4 will not be short-circuited is formed in the interior of the inner frame F2 and the outer frame F3. Thus, in the micromirror element X1 manufactured with this embodiment, a plurality of potential transmissions from the outer frame 130 to the inner frame 120 are possible, and the size of the potential applied to each comb electrode can be individually controlled. As a result, the micromirror element X1 manufactured in this embodiment can properly carry out a plurality of operations.

Also, in this embodiment the comb electrode E2 has the same thickness as the lower layer component 132 of the outer frame F3. Therefore, the etching for forming the comb electrode E2 need not be that deep, and the comb electrode E2 can be formed to greater precision in thickness.

The invention claimed is:

1. A method for manufacturing a microstructure having a thin-walled portion with use of a material substrate having a laminated structure which comprises: a first conductor layer; a second conductor layer; a third conductor layer; a first insulating layer which is patterned to have a first masking part for covering a thin-wall forming region of the second conductor layer, the first insulating layer being interposed between the first conductor layer and the second conductor layer; and a second insulating layer which is patterned to have a second masking part for covering the thin-wall forming region of the second conductor layer, the second insulating layer being interposed between the second conductor layer and the third conductor layer;

wherein the method comprises forming the thin-walled portion in the second conductor portion by etching the material substrate from the first conductor layer down to the second insulating layer via a mask pattern including a non-masking region corresponding to the thin-wall forming region of the second conductor layer.

2. The method according to claim 1, wherein the material substrate further has a first communicating conductor that passes through the first insulating layer and electrically connects the first conductor layer and the thin-walled portion, and/or a second communicating conductor that passes through the second insulating layer and electrically connects the third conductor layer and the thin-walled portion.

3. A method for manufacturing a microstructure having a thin-walled portion, comprising:

a material substrate lamination step for preparing a material substrate having a laminated structure which comprises: a first conductor layer; a second conductor layer; a third conductor layer; a first insulating layer which is patterned to have a first masking part for covering a thin-wall forming region of the second conductor layer, the first insulating layer being interposed between the first conductor layer and the second conductor layer; and a second insulating layer which is patterned to have a second masking part for covering the thin-wall forming region of the second conductor layer, the second insulating layer being interposed between the second conductor layer and the third conductor layer; and a wall-thinning step for forming the thin-walled portion in the second conductor portion by etching the material substrate from the first conductor layer down to the second insulating layer via a mask pattern including a non-masking region corresponding to the thin-wall forming region of the second conductor layer.

4. The method according to claim 3, wherein the material substrate lamination step comprises:

a first insulating layer formation sub-step for forming, on the first conductor layer, the first insulating layer which is patterned to have the first masking part;

a first lamination sub-step for laminating the second conductor layer by depositing a conductor material onto the first conductor layer from the side of the first insulating layer;

a second insulating layer formation sub-step for forming, on the second conductor layer, the second insulating layer which is patterned to have the second masking part; and a second lamination sub-step for laminating the third conductor layer by depositing a conductor material onto the second conductor layer from the side of the second insulating layer.

5. The method according to claim 3, wherein the material substrate lamination step comprises:

a first insulating layer formation sub-step for forming, on the first conductor layer, the first insulating layer which is patterned to have the first masking part;

a first lamination sub-step for laminating the second conductor layer by depositing a conductor material onto the first conductor layer from the side of the first insulating layer;

a sub-step for forming a first pre-insulating layer on the second conductor layer; and a second lamination sub-step for joining the first pre-insulating layer on the second conductor layer to a second pre-insulating layer formed on a third conductor layer, the pre-insulating layer and the second pre-insulating layer together providing the second insulating layer which bonds the third conductor layer to the second conductor layer.

6. The method according to claim 3, wherein the material substrate lamination step comprises:

a first insulating layer formation sub-step for forming, on the first conductor layer, the first insulating layer which is patterned to have a non-masking part corresponding to a comb forming region of the first conductor layer while also having the first masking part;

a first lamination sub-step for laminating the second conductor layer by depositing a conductor material onto the first conductor layer from the side of the first insulating layer;

a sub-step of etching the material substrate from the side of the second conductor layer, via a mask pattern for masking the comb forming region of the first conductor layer, to a halfway depth of the first conductor layer;

a sub-step of forming a first pre-insulating layer on the second conductor layer; and a second lamination sub-step for joining the first pre-insulating layer on the second conductor layer to a second pre-insulating layer formed on the third conductor layer, the pre-insulating layer and the second pre-insulating layer together providing the second insulating layer which bonds the third conductor layer to the second conductor layer.

7. The method according to claim 3, wherein the material substrate lamination step comprises:

an intermediate material forming sub-step for preparing a material substrate intermediate comprising the second conductor layer, the third conductor layer, and the second insulating layer in between the second conductor layer and the third conductor layer;

a first insulating layer formation sub-step for forming, on the second conductor layer of the material substrate intermediate, the first insulating layer which is patterned to have the first masking part; and a first lamination sub-step for forming the first conductor layer by depositing a conductor material on the second conductor layer from the side of the first insulating layer.

8. The method according to claim 3, wherein the material substrate lamination step comprises:

an intermediate material forming sub-step for preparing a material substrate intermediate comprising the second conductor layer, a base layer, and the second insulating layer patterned to have the second masking part and arranged between the second conductor layer and the base layer;

a first insulating layer formation sub-step for forming, on the second conductor layer of the material substrate intermediate, the first insulating layer which is patterned to have the first masking part;

a first lamination sub-step for laminating the first conductor layer by depositing a conductor material onto the second conductor layer from the side of the first insulating layer;

an insulating layer exposure sub-step for exposing the second insulating layer by removing the base layer; and a second lamination sub-step for laminating the third conductor layer by depositing a conductor material on the second conductor layer from the side of the second insulating layer.

9. The method according to claim 3, wherein the material substrate lamination step comprises:

a first insulating layer formation sub-step for forming, on a base conductor layer, the first insulating layer which is patterned to have the first masking part;

a sub-step of etching the base conductor layer to a depth corresponding to a thickness of the thin-walled portion, using the first conductor layer as a mask;

a first lamination sub-step for forming the first conductor layer by depositing a conductor material on the base conductor layer from the side of the first insulating layer;

a sub-step for forming the second conductor layer by removing part of the base conductor layer, from the side opposite the first conductor layer, to such a depth that a remaining thickness of the base conductor layer corresponds to the thickness of the thin-walled portion;

a second insulating layer formation sub-step for forming the second insulating layer on the second conductor layer; and a second lamination sub-step for laminating the third conductor layer by depositing a conductor material on the second conductor layer from the side of the second insulating layer.

10. The method according to any of claims 4 to 9, wherein the first insulating layer formed in the first insulating layer formation sub-step is patterned to further include a non-masking part for providing a communicating conductor, the communicating conductor being formed in the first lamination step by deposition of the conductor material in the non-masking part of the first insulating layer for electrically connecting the first conductor layer and the thin-walled portion.

11. The method according to claim 4 or 9, wherein the second insulating layer formed in the second insulating layer formation sub-step is patterned to further include a non-masking part for providing a communicating conductor, the communicating conductor being formed in the second lamination step by deposition of the conductor material in the non-masking part for electrically connecting the third conductor layer and the thin-walled portion.

12. The method according to claim 4, wherein the second lamination sub-step comprises forming a film of the conductor material on the second conductor layer from the side of the second insulating layer, and then subjecting the conductor material to epitaxial growth.

13. The method according to claim 5 or 6, further comprising the steps of: forming a through-hole that passes through the third conductor layer and the second insulating layer to reach the second conductor layer; and forming a communicating conductor for electrically connecting the third conductor layer and the thin-walled portion by supplying a conductor material into the through-hole.

14. The method according to claim 7, wherein the first insulating layer formed in the first insulating layer formation step is patterned to further include a first non-masking part for providing a first communicating conductor, the method further comprising, as steps performed after the first insulating layer formation sub-step but prior to the first lamination sub-step, etching the second conductor layer down to the second insulating layer with use of the first insulating layer as a mask, and forming a second non-masking part for a second communicating conductor in the second insulating layer, and wherein the second communicating conductor is formed by deposition of the conductor material in the second non-masking part in the first lamination step for electrically connecting the third conductor layer and the thin-walled portion.

15. The method according to claim 8, further comprising forming a non-masking part in the second insulating layer after the insulating layer exposure step for providing a communicating conductor, wherein the communicating conductor is formed by deposition of the conductor material in the non-masking part in the second lamination step for electrically connecting the third conductor layer and the thin-walled portion.

16. A method for manufacturing a microstructure having a thin-walled portion with use of a material substrate having a laminated structure which comprises a first conductor layer, a second conductor layer, and a first insulating layer interposed between the first conductor layer and the second conductor layer; wherein the method comprises the steps of:

forming the thin-walled portion touching the first insulating layer by performing a first etching treatment with respect to the second conductor layer of the material substrate with use of a first mask pattern having a masking part covering a thin-wall forming region of the second conductor layer;

coating the thin-walled portion with an etching stop film;

laminating a third conductor layer on the second conductor layer to bury the thin-walled portion; and performing a second etching treatment from the side of the third conductor layer down to the first insulating layer with use of a second mask pattern having a non-masking region corresponding to the thin-wall forming region.

* * * * *